(12) United States Patent
Toda

(10) Patent No.: US 6,807,096 B2
(45) Date of Patent: Oct. 19, 2004

(54) NONVOLATILE SEMICONDUCTOR MEMORY

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/421,628

(22) Filed: Apr. 23, 2003

(65) Prior Publication Data

US 2004/0125651 A1 Jul. 1, 2004

(30) Foreign Application Priority Data

Dec. 26, 2002 (JP) .............................. 2002-377054

(51) Int. Cl.⁷ .............................................. G11C 16/04
(52) U.S. Cl. .......................... 365/185.03; 365/189.05; 365/189.12
(58) Field of Search ................. 365/185.03, 189.05, 365/189.12, 221, 185.22

(56) References Cited

U.S. PATENT DOCUMENTS 6,288,935 B1    9/2001  Shibata et al.
6,331,945 B1   12/2001  Shibata et al.
6,487,122 B2 * 11/2002  Shibata et al. ......... 365/185.22

FOREIGN PATENT DOCUMENTS

JP    2001-093288    4/2001

* cited by examiner

Primary Examiner—David Lam
(74) Attorney, Agent, or Firm—Hogan & Hartson, LLP

(57) ABSTRACT

One sub-data circuit is disposed for one selected bit line in a 4-level memory. The sub-data circuit has first and second latch circuits for serial accessing. In reading, an upper bit is latched through a sense latch in the first latch circuit. A reading operation of a lower bit is controlled to a value of the upper bit latched in the first latch circuit. In programming, an upper bit is latched in the first latch circuit. A program operation of a lower bit is controlled to a value of the upper bit latched in the first latch circuit.

50 Claims, 30 Drawing Sheets

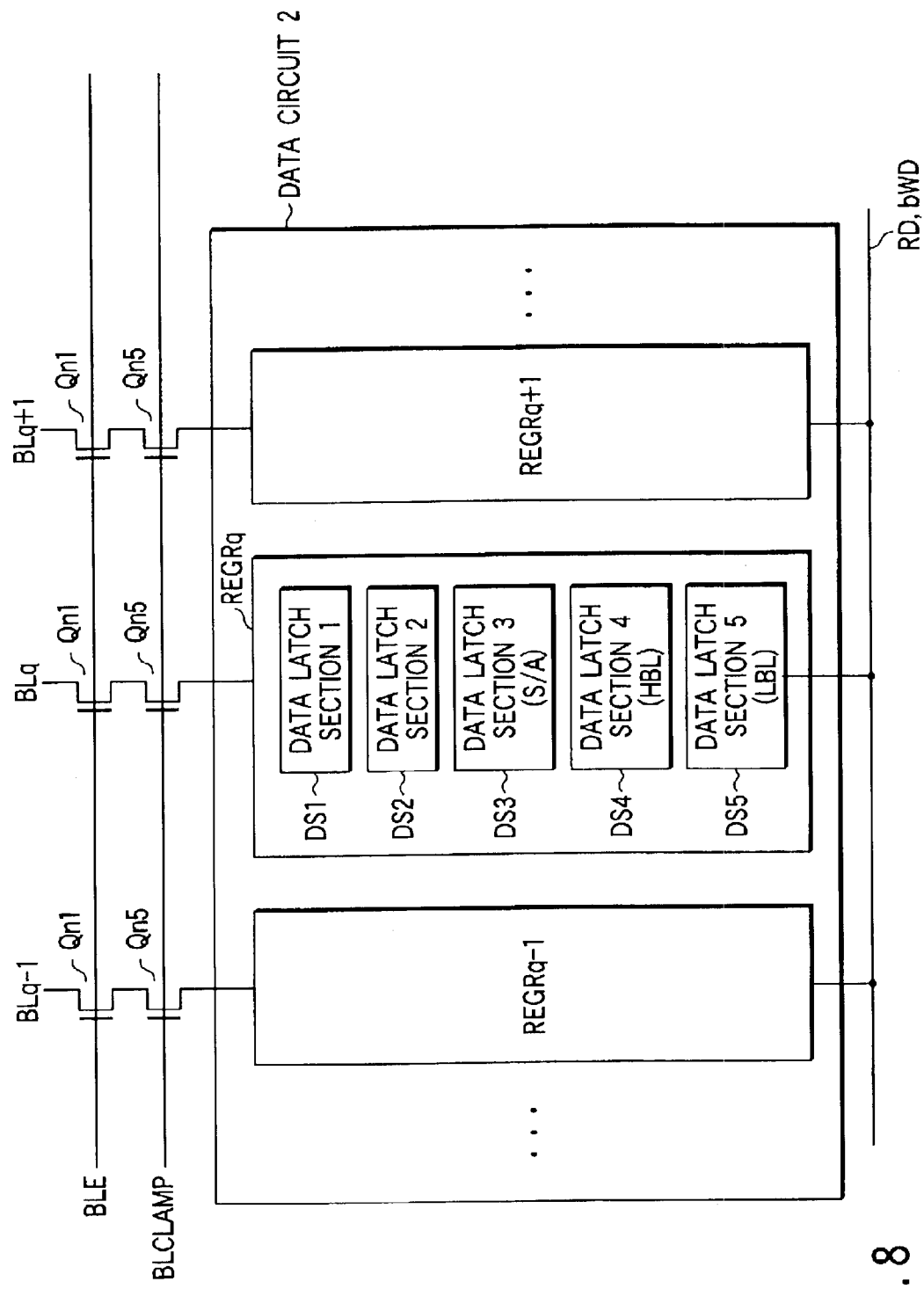
F I G. 8

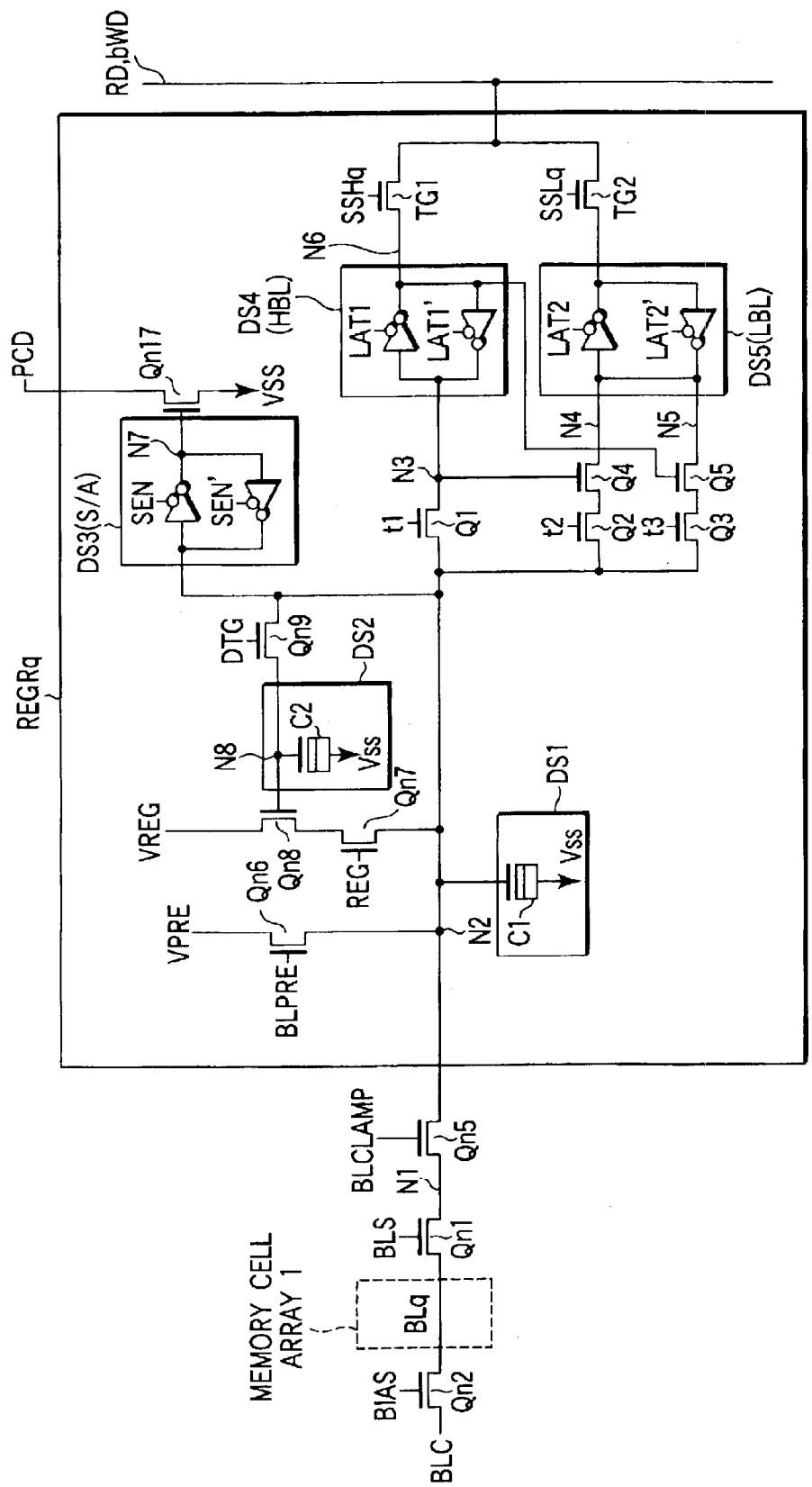
F I G. 11

PROGRAM OF LOGIC UPPER-PAGE DATA

AFTER POINT A, UPPER LOGIC PAGE DATA (HB) CAN BE OUTPUTTED (TRANSFER TO RD)

AFTER PONT B, LOWER LOGIC PAGE DATA (LB) CAN BE OUTPUTTED (TRANSFER TO RD)

READING OF LOGIC UPPER PAGE DATA (HB)

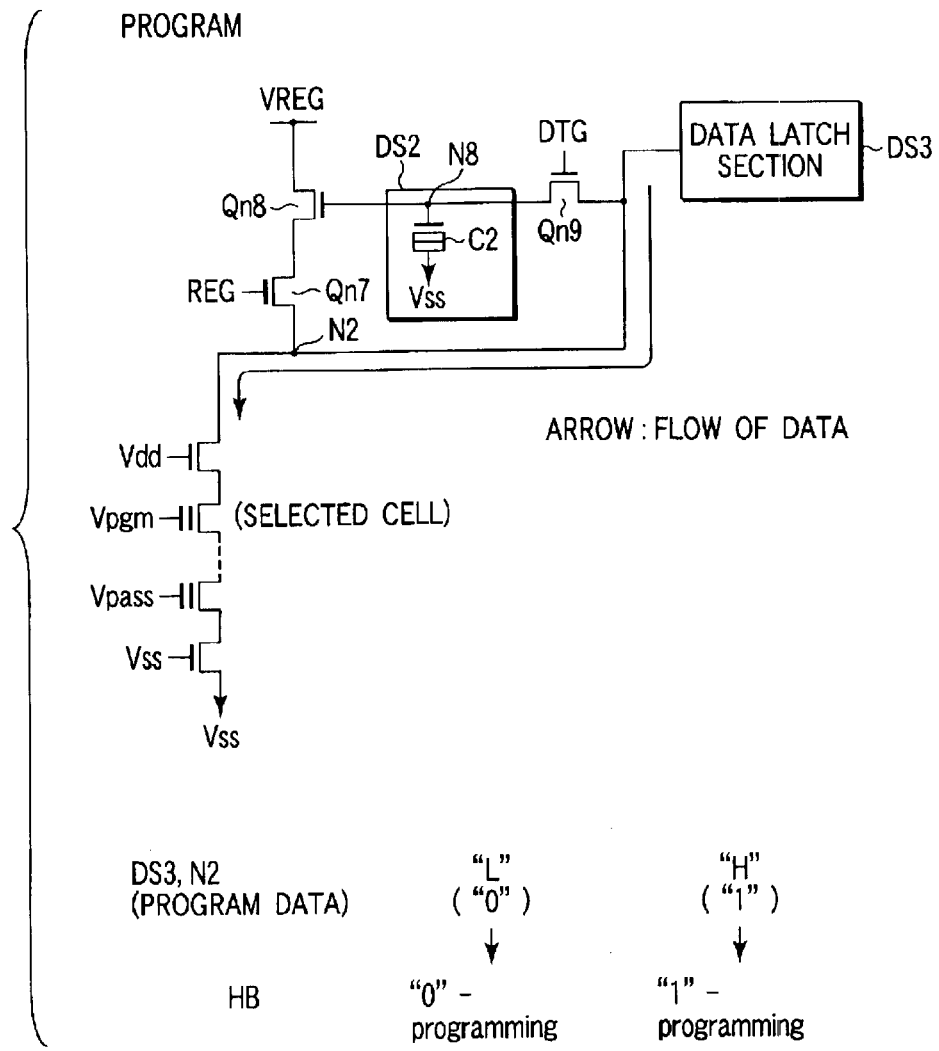
F I G. 31

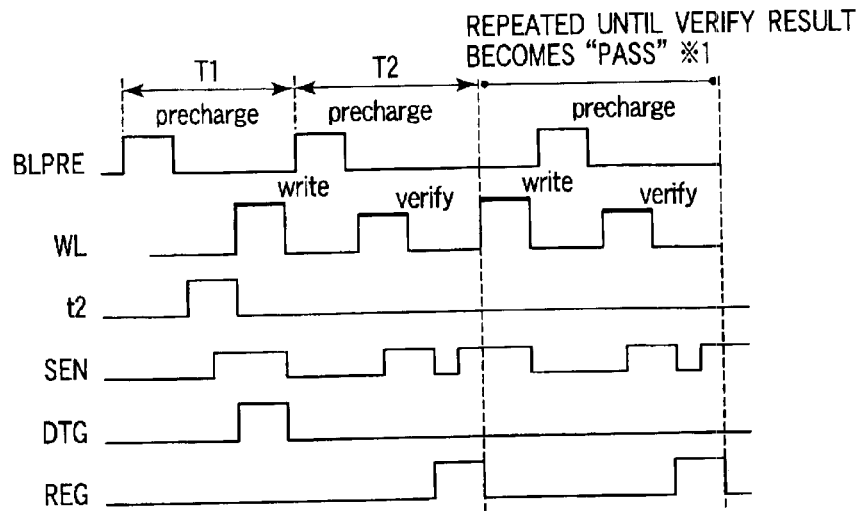
FIG. 34  ※1: "FAIL" WHEN NUMBER OF TIMES OF WRITING OPERATION EXCEEDS PCmaX
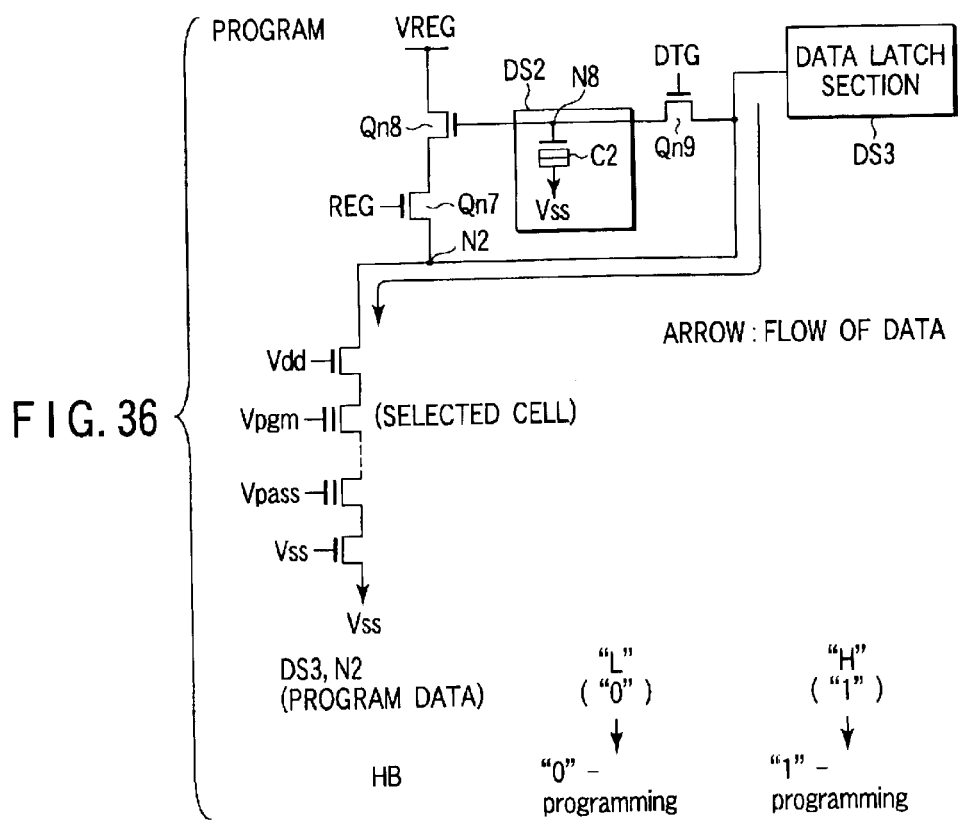
FIG. 36

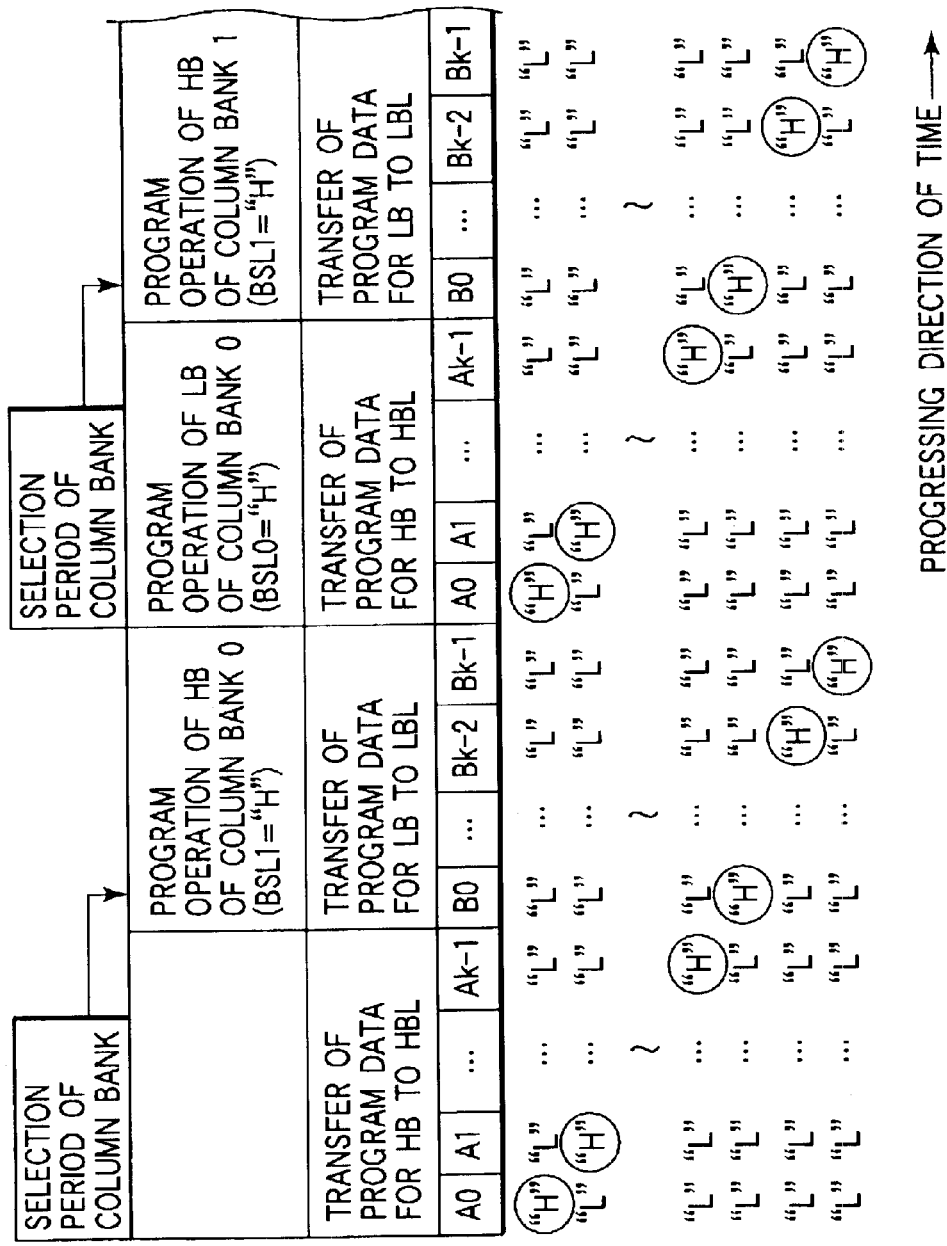
F I G. 40

NONVOLATILE SEMICONDUCTOR MEMORY

CROSS-REFERENCE TO RELATED APPLICATIONS

This application is based upon and claims the benefit of priority from the prior Japanese Patent Application No. 2002-377054, filed Dec. 26, 2002, the entire contents of which are incorporated herein by reference.

BACKGROUND OF THE INVENTION

1. Field of the Invention

The present invention relates to a nonvolatile semiconductor memory particularly used for a multi-level NAND cell type flash memory, for example, 4-level NAND cell type flash memory.

2. Description of the Related Art

In a multi-level NAND cell type flash memory, in a reading operation, for example, data of one page simultaneously read from a memory cell array are latched at a latch circuit, and then serially accessed bit by bit to be serially outputted to the outside of a chip. In a program operation, for example, data of one page serially inputted to the inside of the chip are serially accessed to be latched bit by bit at the latch circuit, and then the data are simultaneously programmed in the memory cell array (see U.S. Pat. No. 6,331,945B1).

Hereinafter, "serial access" means the above serial accessing, and "serial access time" means a time necessary for this serial accessing operation.

Assuming that the number of memory cells constituting the memory cell array is constant, when n (n is a natural number of 2 or higher) bits, i.e., $2^n$ levels, are stored in one memory cell, a memory capacity can be increased by n times compared with a case of storing one bit, i.e., 2 levels, in one memory cell.

However, in a conventional multi-level NAND cell type flash memory, when one bit of n bits stored in one memory cell is randomly read/written, it is necessary to carry out a logical operation for this one bit and the other bits. A time for this operation is increased in proportion to n.

Accordingly, when n bits are stored in one memory cell, compared with the case of storing one bit in one memory cell, time necessary for reading/writing, specifically, time from detection of a reading/writing command to a start of serial accessing (called "1st access time" because it means a time before access to first one bit of one page data) is made longer in proportion to n.

Such long 1st access time is not a big problem when the multi-level NAND cell type flash memory is used as a file memory. It is because for the purpose of simultaneously processing a large amount of data, an increase of a memory capacity is more important than shortening of the 1st access time.

However, when the multi-level NAND cell type flash memory is used as a mixed memory (memory mixed in a logic LSI or the like) which does not need a large memory capacity, high-speed reading/writing is required. Thus, achievement of high speeds for the serial access time and the 1st access time becomes extremely important.

A reason is as follows. For example, even when serial accessing and a reading/writing operation is concurrently carried out to realize high-speed reading/writing, if the 1st access time becomes longer than the serial access time due to multiple levels, for example, the reading/writing operation cannot be finished within the period of the serial accessing. Consequently, a reading/writing speed is limited by the 1st access time.

Thus, in order to realize high-speed reading/writing, achievement of high speeds for both of the serial access time and the 1st access time is important.

Therefore, it is hoped that a data circuit (reading/writing circuit) capable of setting the 1st access time of the multi-level memory substantially equal to that of a binary flash memory will be developed.

BRIEF SUMMARY OF THE INVENTION

According to a first aspect of the present invention, a nonvolatile semiconductor memory comprises: a memory cell to store n (n is a natural number of 2 or higher) bits; a first latch section to temporarily store 1 bit among the n bits in a first reading operation; and a second latch section to temporarily store the other 1 bit among the n bits in a second reading operation when the 1 bit has a first value, and in a third reading operation when the 1 bit has a second value.

According to a second aspect of the present invention, a nonvolatile semiconductor memory comprises: a memory cell to store 2 bits; a first latch section to temporarily store 1 bit of the 2 bits in a first reading operation; and a second latch section to temporarily store the other 1 bit of the 2 bits in a second reading operation when the 1 bit has a first value, and in a third reading operation when the 1 bit has a second value.

According to a third aspect of the present invention, a nonvolatile semiconductor memory comprises: a memory cell to store n (n is a natural number of 2 or higher) bits; a first latch section to temporarily store 1 bit among the n bits in a first writing operation; a second latch section to temporarily store the other 1 bit among the n bits in second and third writing operations; and a third latch section to store the other 1 bit in the second writing operation when the 1 bit has a first value, and in the third writing operation when the 1 bit has a second value.

According to a fourth aspect of the present invention, a nonvolatile semiconductor memory comprises: a memory cell to store 2 bits; a first latch section to temporarily store 1 bit of the 2 bits in a first writing operation; a second latch section to temporarily store the other 1 bit of the 2 bits in second and third writing operations; and a third latch section to store the other 1 bit in the second writing operation when the 1 bit has a first value, and in the third writing operation when the 1 bit has a second value.

According to a fifth aspect of the present invention, a nonvolatile semiconductor memory comprises: memory cells to store n (n is a natural number of 2 or higher) bits; sub-data circuits disposed corresponding to the memory cells to carry out a reading/writing operation for the memory cells; and a first shift register to sequentially select the sub-data circuits one by one, wherein each of the sub-data circuits has a first latch section to temporarily store 1 bit among the n bits, and the 1 bit is serially outputted from the first latch section of the sub-data circuit selected by the shift register.

According to a sixth aspect of the present invention, a read method of a nonvolatile semiconductor memory is applied to a memory cell which stores 2 bits by 0, first, second and third threshold levels (0 threshold level<first threshold level<second threshold level<third threshold level). This method comprises the steps of: carrying out a first reading operation for the memory cell by applying a first reading potential between the first threshold level and the second threshold level to a selected word line; determining that 1 bit of the 2 bits has a first value when a threshold value of the memory cell is the 0 or first threshold level; determining that the 1 bit has a second value when a threshold value of the memory cell is the second or third threshold level; then (1) if the 1 bit has the first value, carrying out a second reading operation for the memory cell by applying a second reading potential between the 0 threshold level and the first threshold level to the selected word line, determining that the other 1 bit of the 2 bits has a first value when a threshold value of the memory cell is the 0 threshold level, and determining that the other 1 bit has a second value when a threshold value of the memory cell is the first threshold level; and (2) if the 1 bit has the second value, carrying out a third reading operation for the memory cell by applying a third reading potential between the second threshold level and the third threshold level to the selected word line, determining that the other 1 bit has a first value when a threshold value of the memory cell is the second threshold level, and determining that the other 1 bit has a second value when a threshold value of the memory cell is the third threshold level (an order of (1) and (2) may be reversed).

According to a seventh aspect of the present invention, a program method of a nonvolatile semiconductor memory is applied to a memory cell which stores 2 bits by 0, first, second and third threshold levels (0 threshold level<first threshold level<second threshold level<third threshold level). This method comprises the steps of: setting a threshold value of the memory cell to the 0 threshold level; then carrying out a first writing operation for the memory cell, maintaining the threshold value of the memory cell at the 0 threshold level when program data for 1 bit of the 2 bits is a first value, and changing the threshold value of the memory cell to the second threshold level when program data for the 1 bit is a second value; then (1) carrying out a second writing operation for the memory cell, if the program data for the 1 bit is the first value, when program data for the other 1 bit of the 2 bits is the first value, maintaining the threshold value of the memory cell at the 0 threshold level, and changing the threshold value of the memory cell to the first threshold level when the program data for the other 1 bit is the second value; and (2) carrying out a third writing operation for the memory cell, if the program data for the 1 bit is the second value, when the program data for the other 1 bit is the first value, maintaining the threshold value of the memory cell at the second threshold level, and changing the threshold value of the memory cell,to the third threshold level when the program data for the other 1 bit is the second value (an order of (1) and (2) may be reversed).

BRIEF DESCRIPTION OF THE SEVERAL VIEWS OF THE DRAWING

FIG. 8 is a view showing an example of a data circuit;

FIG. 11 is a circuit diagram showing a specific example of a sub-data circuit in a data circuit;

FIG. 31 is a view showing a data flow in programming;

FIG. 34 is a view showing an example of an operating waveform of a programming operation of logic lower page data;

FIG. 36 is a view showing a data flow in programming;

FIG. 40 is a view showing an outline of a pipeline operation in programming.

DETAILED DESCRIPTION OF THE INVENTION

Figure 1:
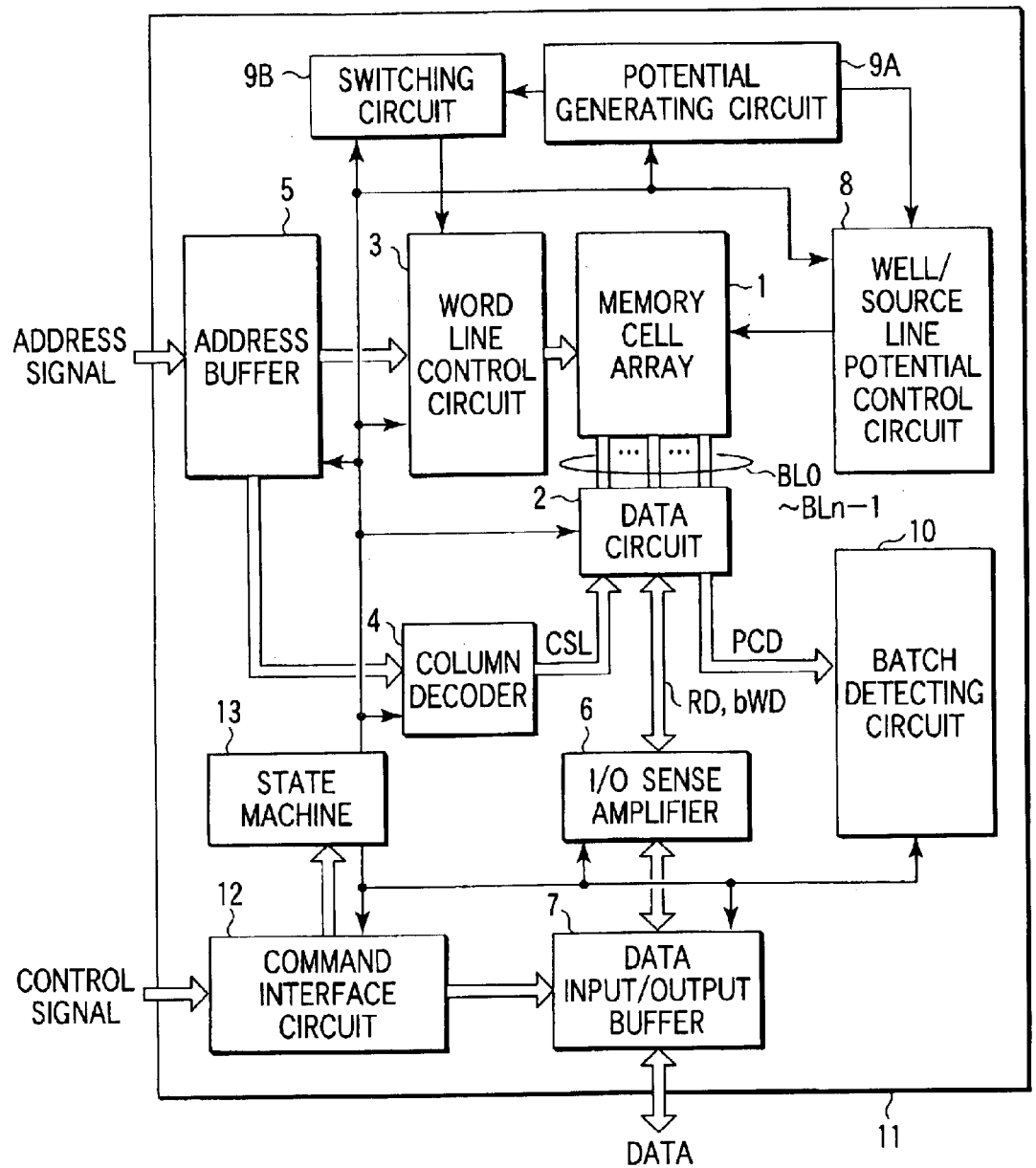
FIG. 1 is a block diagram showing a multi-level flash memory of an example of the present invention.

Detailed description will be made of a nonvolatile semiconductor memory of an aspect of the present invention with reference to the accompanying drawings.

1. Assumption

First, for easier understanding of the explanation, preconditions are laid down as follows. These preconditions are set to facilitate understanding of the present invention, and the invention is not limited to the preconditions.

A nonvolatile semiconductor memory of an aspect of the present invention is directed to a multi-level flash memory where n (n is a natural number of 2 or higher) bits, i.e., $2^n$ levels, are stored in one memory cell. Here, if n bits are stored in one memory cell, the memory cell has $2^n$ states ($2^n$ threshold zones).

Hereinafter, as a representative example of the multi-level flash memory, a 4-level NAND cell type flash memory will be described. In this case, its memory cell has four threshold zones, i.e., a threshold level 0, a threshold level 1, a threshold level 2 and a threshold level 3.

The threshold level 0 is a state where a threshold voltage of the memory cell is lowest, e.g., a negative state of the threshold voltage, and this state is set as an "11" state. The threshold level 1 is a state where a threshold voltage of the memory cell is second lowest, e.g., a positive state of the threshold voltage, and this state is set as a "10" state. The threshold level 2 is a state where a threshold voltage of the memory cell is third lowest, e.g., a positive state of the threshold voltage, and this state is set as a "01" state. The threshold level 3 is a state where a threshold voltage of the memory cell is highest, e.g., a positive state of the threshold voltage, and this state is set as a "00" state.

Marks "" indicate 2-bit data stored in one memory cell. For the marks "", the right side* is lower bit (logic lower page data) LB, and the left side* is upper bit (logic upper page data) HB. For example, a reading/writing operation is carried out for the lower bit LB, the upper bit HB or these 2 bits.

For the memory cell, the "11" state is an erasing state, while the "10" state, the "01" state and the "00" state are writing states.

2. Overview
(1) Summary of the Invention

The nonvolatile semiconductor memory of the example of the present invention has features in data circuitry for executing a reading/writing operation, and in a reading/writing operation when for example one memory cell has four threshold zones (threshold level 0<threshold level 1<threshold level 2<threshold level 3).

In the multi-level NAND cell type flash memory of the example of the present invention, if n (n is a natural number of 2 or higher) bits are stored in one memory cell, n pieces of latch circuits for outputting read data or receiving write data are connected between one read/write data line (or I/O line) and one selection cell. For example, in a 4-level NAND cell type flash memory, two latch circuits HBL, LBL for outputting read data or receiving write data are connected between one read/write data line and one selection cell.

Then, for example, regarding a data program, a state of the memory cell is changed from the "11" state (threshold level 0) to a predetermined state in accordance with the program data by the following procedure.

First, as a fist step, a program of an upper bit HB is executed. When program data for the upper bit HB is "1", the "11" state (threshold level 0) is maintained without changing the state of the memory cell. When the program data for the upper bit HB is "0", the state of the memory cell is changed from the "11" state to the "01" state (threshold level 2).

Then, as a second step, a program of a lower bit LB is executed for the memory cell having the upper bit HB of "1". When program data for the lower bit LB is "1", the "11" state (threshold level 0) is maintained without changing the state of the memory cell. When the program data for the lower bit LB is "0", the state of the memory cell is changed from the "11" state to the "10" state (threshold level 1).

Lastly, as a third step, a program of a lower bit LB is executed for the memory cell having the upper bit HB of "0". When program data for the lower bit LB is "1", the "01" state (threshold level 2) is maintained without changing the state of the memory cell. When the program data for the lower bit LB is "0", the state of the memory cell is changed from the "01" state to the "00" state (threshold level 3).

According to the example of the present invention, the program of the upper bit HB can be completed by one program (including verification) operation as shown in first step. The program of the lower bit LB needs two program (including verification) operations as shown in second and third steps. However, it is not necessary to carry out data reading (called internal data read) for the program operation or a logical operation between the read data and the program data.

Thus, it is possible to shorten time for the program operation and set 1st access time substantially equal to that of a binary flash memory.

Incidentally, during the execution of the first step, capturing (serial access) of the lower bit LB for the second and third steps in a latch circuit LBL can be carried out. During the execution of the second and third steps, capturing (serial access) of the upper bit HB for the first step at a next cycle in a latch circuit HBL can be carried out.

In the program operation, the second step and the third step may be changed in order.

Thus, according to the example of the present invention, the 1st access time can be set substantially equal to that of the binary flash memory. That is, since the 1st access time can be set substantially equal to the serial access time, as described above, high-speed writing can be achieved by carrying out the first step and the serial accessing in parallel, and the second and third steps and the serial accessing in parallel.

Reading of the upper bit HB is carried out as follows.

A reading potential Vcgr 01 is applied to a control gate electrode of a selected memory cell to differentiate the threshold levels 0, 1 from the threshold levels 2, 3. An unselected memory cell in a selected block (NAND string) is set in an ON state. When the upper bit HB is "1", a potential of a bit line is lowered. When the upper bit HB is "0", a potential of the bit line is maintained at a precharging potential. A value of the upper bit HB can be specified by sensing a potential change of the bit line. The upper bit HB is latched by the upper bit latch circuit HBL.

Reading of the lower bit LB is carried out by the following procedure.

A reading potential Vcgr 00 is applied to the control gate electrode of the selected memory cell to differentiate the threshold levels 0, 1, 2 from the threshold level 3. The unselected memory cell in the selected block (NAND string) is set in an ON state. When the lower bit LB is "1", a potential of the bit line is lowered. When the lower bit LB is "0", a potential of the bit line is maintained at a precharging potential. A value of the lower bit LB can be specified by sensing a potential change of the bit line. The lower bit LB is latched by the lower bit latch circuit.

According to the example of the present invention, reading of the upper bit HB can be completed by one reading operation as shown in first step. Reading of the lower bit LB needs two reading operations as shown in second and third steps. However, it is not necessary to carry out a logical operation between read data.

Thus, it is possible to shorten the time of the reading operation and set the 1st access time substantially equal to that of the binary flash memory.

During the execution of the first step, the lower bit LB latched by the latch circuit LBL in second and third steps of the previous cycle may be outputted to the outside of the chip (serial accessing). During the execution of the second and third steps, the upper bit HB latched by the latch circuit HBL in first step may be outputted to the outside of the chip (serial accessing).

In the reading operation, the second step and the third step may be changed in order.

As described above, according to the example of the present invention, the 1st access time can be set substantially equal to that of the binary flash memory. That is, since the 1st access time can be set substantially equal to the serial access time, as described above, high-speed reading can be achieved by carrying out the first step and the serial accessing in parallel, and the second and third steps and the serial accessing in parallel.

According to the reading/writing operation of the example of the present invention, as described later, since the serial accessing operation for the read/write data can be easily carried out by a small number of signals, it is possible to construct a system of low power consumption. The example of the present invention is particularly suited to a flash memory mixed logic LSI where there is a request for simplifying control of access to the memory cell array.

(2) General View

FIG. 1 shows main sections of the 4-level NAND cell type flash memory of the example of the present invention.

A reference numeral 1 denotes a memory cell array. The memory cell array 1 has, for example, a NAND cell unit constituted of a plurality of serially connected memory cells and two select gate transistors respectively connected to both ends thereof. A circuit example and a structural example of the memory cell array 1 will be described later.

A data circuit 2 includes a plurality of data storage sections. A circuit example of the data circuit 2 will be described later. Here, a function of the data circuit 2 is briefly described.

The data circuit 2 has a function of temporarily storing 2-bit (4-level) program data to program the data in a selected memory cell in programming. Additionally, the data circuit 2 has a function of temporarily storing 2-bit (4-level) read data read from the selected memory cell in reading.

In the example, the data circuit 2 has at least an upper bit latch circuit HBL for storing an upper bit (logic upper page data) HB, a lower bit latch circuit LBL for storing a lower bit (logic lower page data) LB, and a latch circuit S/A which functions as a sense amplifier in reading and stores data for determining presence of writing in programming.

A word line control circuit 3 includes a row address decoder and a word line driver. The word line control circuit 3 controls potentials of a plurality of word lines in the memory cell array 1 based on an operation mode (writing, erasing, reading or the like) and an address designated by a row address signal.

A column decoder 4 selects a column of the memory cell array 1 based on a column address signal.

In programming, the program data are serially inputted bit by bit through a data input/output buffer 7 and an I/O sense amplifier 6 into the data circuit 2. Simultaneously, by a serial accessing operation, program data of one page (program data for the upper bit HB) is latched by the latch circuit HBL in the data circuit 2. By the serial accessing operation, program data of one page (program data for the lower bit LB) is latched by the latch circuit LBL in the data circuit 2.

In reading, read data of one page (upper bit HB) is temporarily stored in the latch circuit HBL in the data circuit 2 simultaneously. Subsequently, by a serial accessing operation, the read data of one page is serially outputted bit by bit through the I/O sense amplifier 6 and the data input/output buffer 7 to the outside of the memory chip 11.

Similarly, in reading, read data of one page (lower bit LB) is temporarily stored in the latch circuit LBL in the data circuit 2 simultaneously. Subsequently, by a serial operation, the read data of one page is serially outputted bit by bit through the I/O sense amplifier 6 and the data input/output buffer 7 to the outside of the memory chip 11.

The row address signal is inputted through an address buffer 5 to the word line control circuit 3. The column address signal is inputted through the address buffer 5 to the column decoder 4.

A well/source line potential control circuit 8 controls potentials of a plurality of well regions (e.g., double well region including an n well and a p well) corresponding to a plurality of blocks constituting the memory cell array 1, and a potential of the source line based on an operation mode (writing, erasing, reading or the like).

A potential generating circuit 9A generates, for example, an erasing potential (e.g., about 20 V) Vera in erasing, and applies this potential Vera to one, two or more well regions (both n and p wells) corresponding to one, two or more selected blocks among the plurality of blocks constituting the memory cell array 1.

A batch detecting circuit 10 verifies accurate writing of predetermined data in the selected memory cell based on a detecting signal PCD outputted from the data circuit 2, specifically data latched by the latch circuit S/A for determining presence of writing in programming. Similarly, the batch detecting circuit 10 verifies accurate erasing of data of the memory cell based on a detecting signal PCD outputted from the data circuit 2 in erasing.

A command interface circuit 12 determines whether data inputted to the data input/output buffer 7 is command data or not supplied from a host microcomputer based on a control signal generated from a chip (e.g., host microcomputer) different from the memory chip 11. If the data inputted to the data input/output buffer 7 is command data, the command interface circuit 12 transfers the command data to a state machine (control circuit) 13.

The state machine 13 decides an operation mode (writing, erasing, reading or the like) of the flash memory based on the command data, and controls the entire operation of the flash memory, specifically operations of the data circuit 2, the word line control circuit 3, the column decoder 4, the address buffer 5, the I/O sense amplifier 6, the data input/output buffer 7, the well/source line potential control circuit 8, the potential generating circuit 9A, a switching circuit 9B, and the batch detecting circuit 10 in accordance with the operation mode.

(3) Constitutional Example of Memory Cell Array

Figure 2:
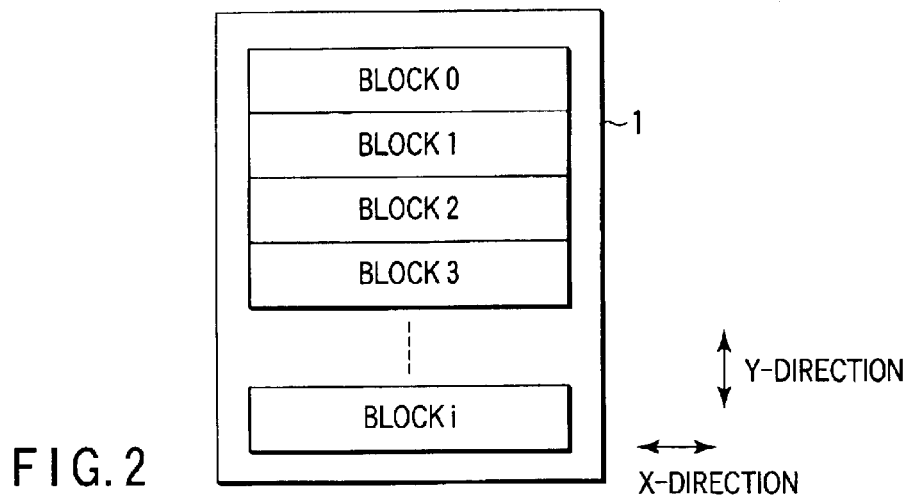
FIG. 2 is a view showing an example of a memory cell array.
Figure 3:
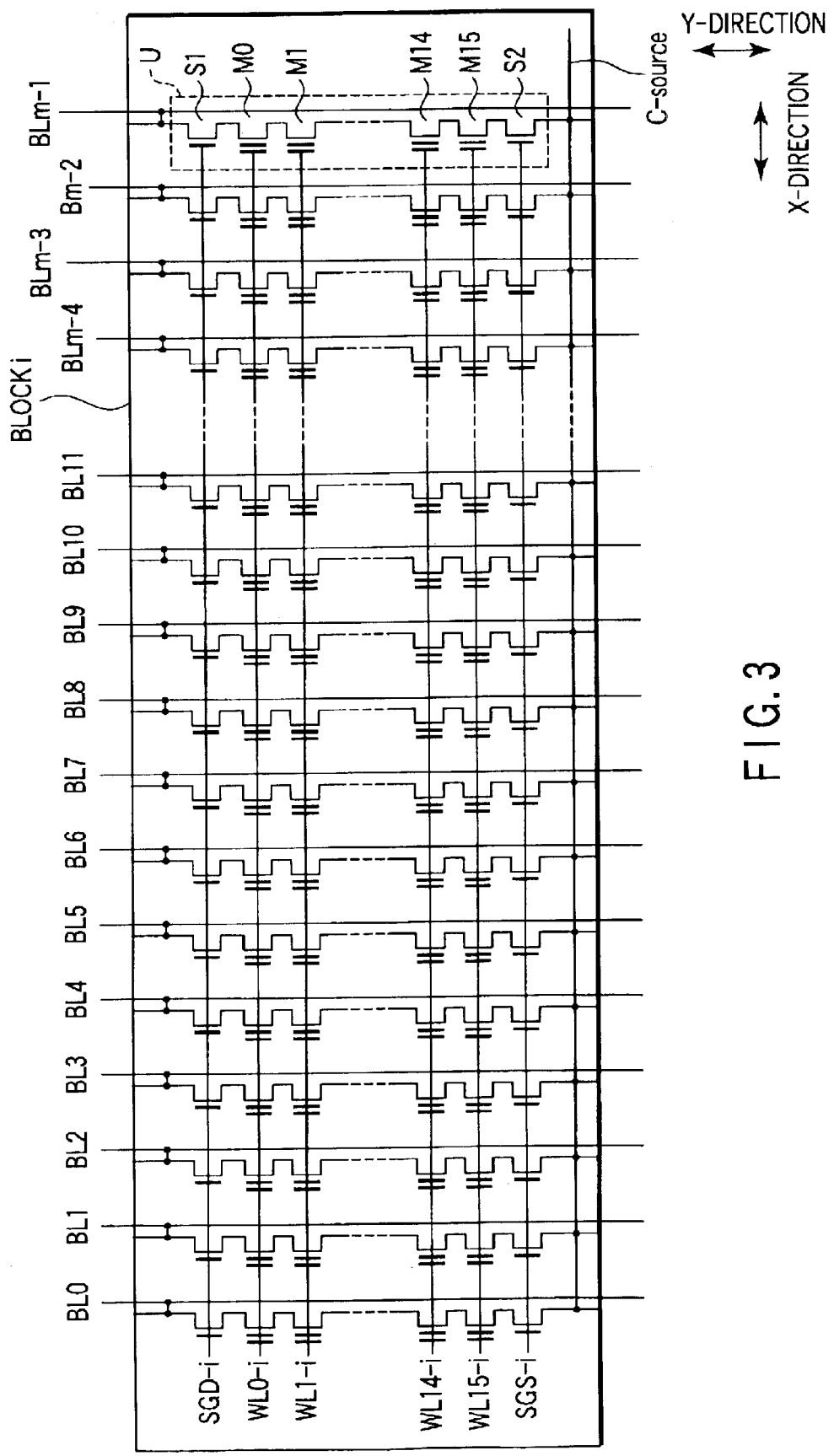
FIG. 3 is a view showing an example of a memory cell array.

FIG. 2 shows a structural example of a memory cell array. FIG. 3 shows a circuit example of one BLOCK i among a plurality of blocks shown in FIG. 2.

The memory cell array 1 includes a plurality (i pieces in the example) of blocks BLOCK 0 to BLOCK i. The plurality of blocks BLOCK 0 to BLOC i are arranged side by side in a Y direction. The block means a smallest erasing unit, i.e., the smallest number of memory cells to be erased all at once.

The block i includes a plurality (m pieces in the example) of NAND cell units U arrayed in an X direction. Each NAND cell unit includes a NAND row constituted of sixteen serially connected memory cells M0, M1, ... M14, M15, a select gate transistor S1 connected to one end of the NAND row, and a select gate transistor S2 connected to the other end of the NAND row.

In the example, the NAND row is constituted of the sixteen memory cells M0, M1, ... M14, M15. However, it needs to be constituted of only one, two or more memory cells, and the number thereof is not particularly limited to sixteen.

The select gate transistor S1 is connected to a bit line BLq (q=0, 1, ... m−2, m−1), and the select gate transistor S2 is connected to a source line C-source.

Word lines (control gate lines) WL0-i, WL1-i, ... WL14-i, WL15-i are extended in the X direction, and connected in common to the plurality of memory cells in the X direction. A select gate line SGD-i is extended in the X direction, and connected in common to a plurality of select gate transistors S1 in the X direction. A select gate line SGS-i is also extended in the X direction, and connected in common to a plurality of select gate transistors S2 in the X direction.

When one memory cell stores 1-bit data, m pieces of memory cells located at intersection points between one word line, e.g., a word line WL0-i and a plurality of bit lines BL0, BL1, ... BLm−2, BLm−1 constitute a unit called a page. As in the example, when one memory cell stores 2-bit data, m pieces of memory cells located at the intersection points between one word line and the plurality of bit lines BL0, BL1, ... BLm−2, BLm−1 store data of two pages.

(4) Device Structural Example

Well Structural Example

Figure 4:
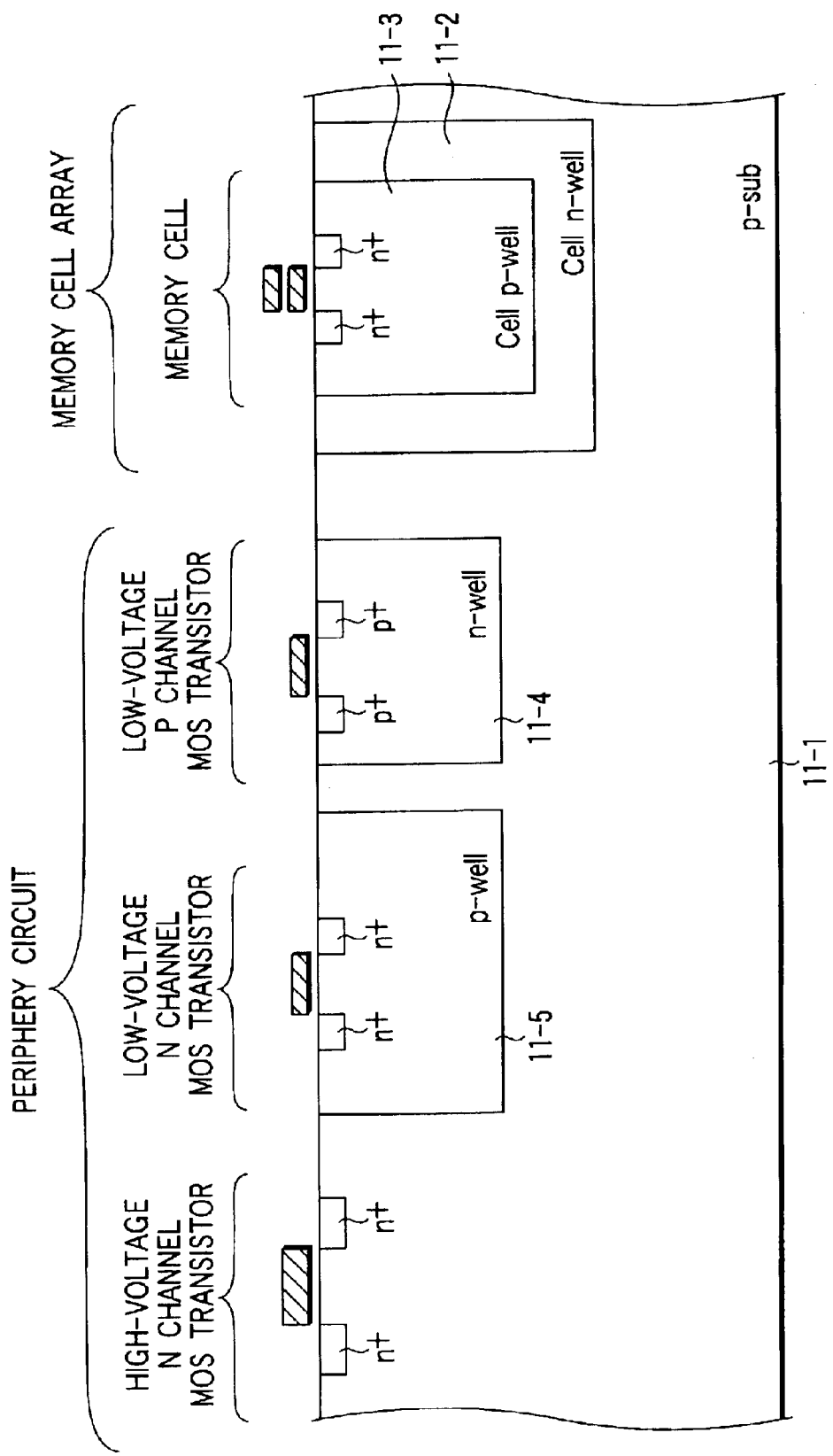
FIG. 4 is a sectional view showing a structural example of elements in a chip.

FIG. 4 shows an example of a well structure of a NAND cell type flash memory.

In a p-type silicon substrate (p-sub) 11-1, a double well region constituted of an n-type well region (Cell n-well) 11-2 and a p-type well region (Cell p-well) 11-3, an n-type well region (n-well) 11-4, and a p-type well region (p-well) 11-5 are formed.

The double well region is formed in the memory cell array, and the n-type well region 11-4 and the p-type well region 11-5 are formed in a periphery circuit.

A memory cell is constituted of an n channel MOS transistor, and arranged in the p-type well region 11-3. The n-type well region 11-2 and the p-type well region 11-3 are set at equal potentials.

A high voltage n channel MOS transistor to which a voltage higher than a power supply voltage is applied is formed in the p-type silicon substrate (p-sub) 11-1. A low voltage p channel MOS transistor to which a power supply voltage is applied is formed in the n-type well region (n-well) 11-4. A low voltage n channel MOS transistor to which a power supply voltage is applied is formed in the p-type well region (p-well) 11-5.

Cell Array Structural Example

Figure 5:
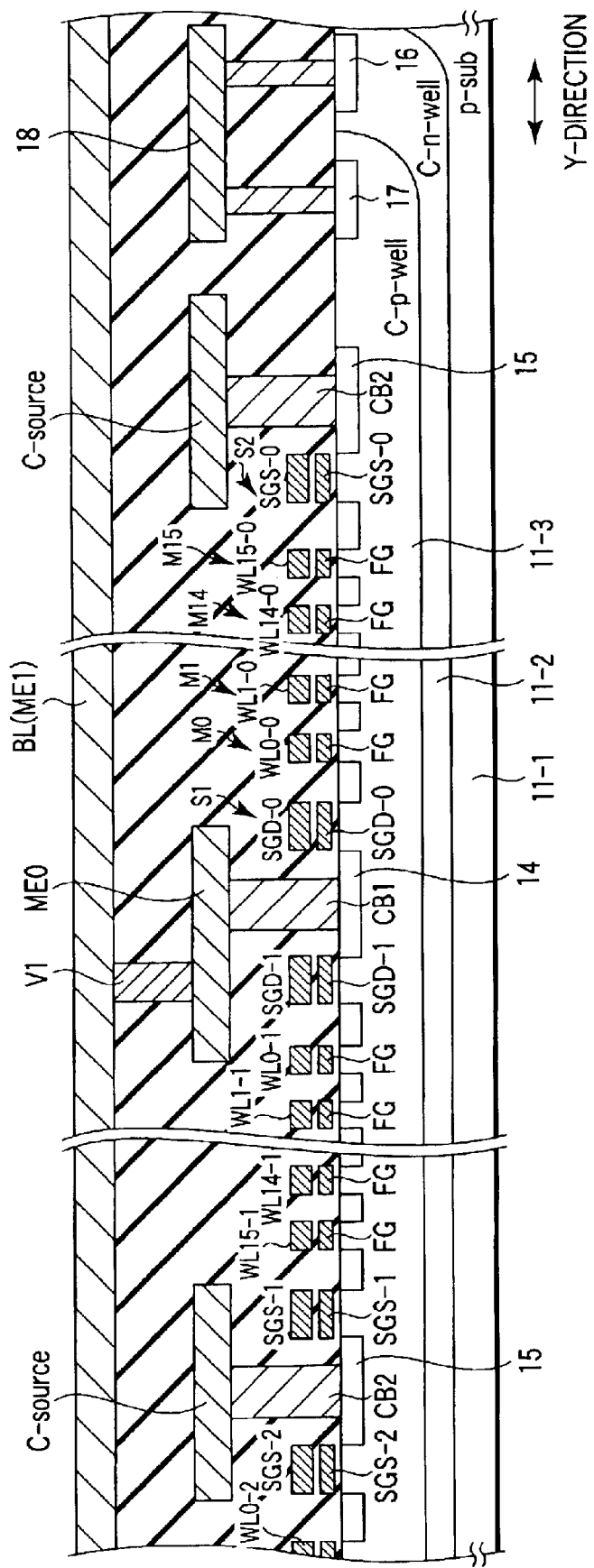
FIG. 5 is a sectional view showing a structural example of a memory cell array.

FIG. 5 shows an example of a sectional structure of the memory cell array of the NAND cell type flash memory in a Y direction.

In the p-type silicon substrate 11-1, the double well region constituted of the n-type well region 11-2 and the p-type well region 11-3 is formed.

Sixteen serially connected memory cells M0, M1, ... M14, M15 are arranged in the p-type well region 11-3. Each of the sixteen memory cells M0, M1, ... M14, M15 is constituted of an N channel MOS transistor, and has a stack gate structure constituted of, for example, a floating gate electrode FG and control gate electrodes WL0-0, WL1-0, ... WL14-0, WL15-0.

The select gate transistor S1 is connected to one end of the NAND row constituted of the serially connected memory cells M0, M1, ... M14, M15, and the select gate transistor S2 is connected to the other end thereof. Each of the select gate transistors S1, S2 is constituted of an N channel MOS transistor, and has select gate lines SGS-0, SGS-0 of a structure approximating the memory cells M0, M1, ... M14, M15, i.e., the stack gate structure.

One end of the NAND cell unit, i.e., a diffusion layer (drain diffusion layer) 14 of the select gate transistor S1 is connected through a contact plug CB1 to a first metal wiring layer ME0. The first metal wiring layer ME0 is connected through a via plug V1 to a second metal wiring layer ME1 as a bit line BL. The bit line BL is connected to the data circuit.

The other end of the NAND cell unit, i.e., a diffusion layer (source diffusion layer) 15 of the select gate transistor S2 is connected through a contact plug CB2 to the first metal wiring layer ME0 as a source line C-source. The source line C-source is connected to a source potential control circuit.

The n-type well region (Cell n-well) 11-2 is connected through an n-type diffusion layer 16 to a C-p-well potential setting line 18, and the p-type well region (Cell p-well) 11-3 is connected through a p-type diffusion layer 17 to the C-p-well potential setting line 18. That is, the n-type well region 11-2 and the p-type well region 11-3 are set at identical potentials. The C-p-well potential setting line 18 is connected to a well potential control circuit.

The floating gate electrode FG, the control gate electrodes WL0-j, WL1-j, ... WL14-j, WL15-j, and the select gate lines SGS-j, SGS-j (j=0, 1, ... i) are made of, for example, conductive polysilicon containing impurities. The first and second metal wiring layers ME0, ME1 are made of, for example, aluminum, copper, an alloy thereof, or the like.

Figure 6:
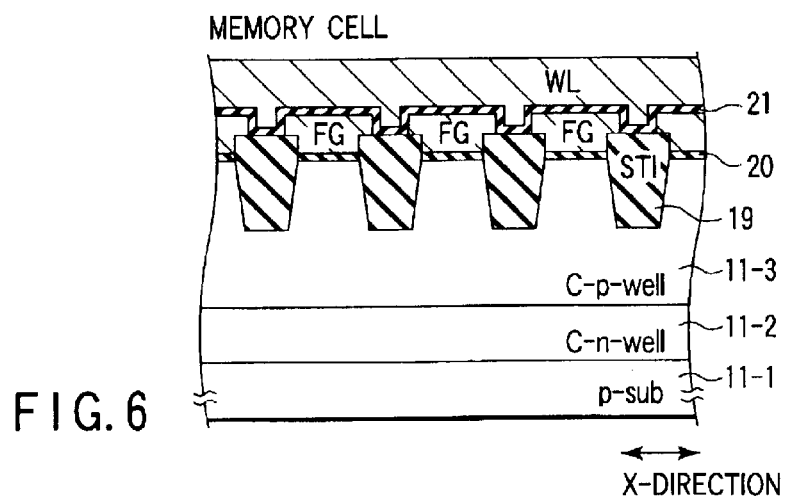
FIG. 6 is a sectional view showing a structural example of a memory cell array.
Figure 7:
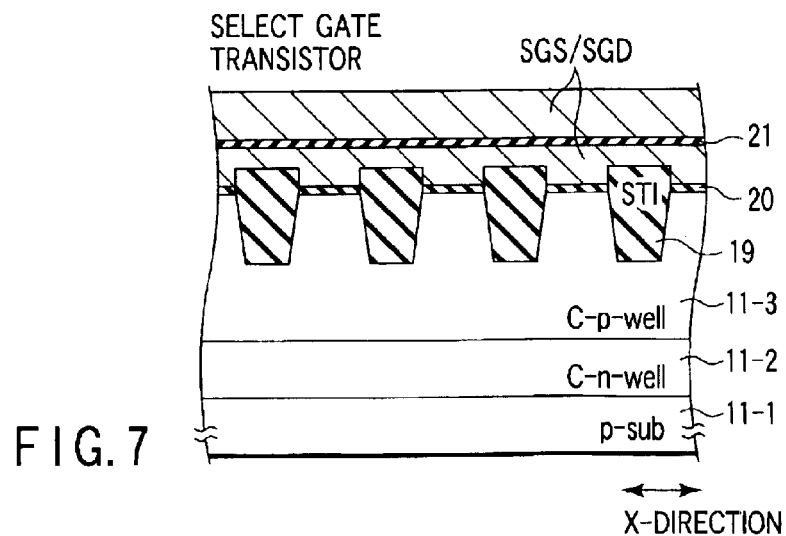
FIG. 7 is a sectional view showing a structural example of a memory cell array.

FIG. 6 is shows an example of a sectional structure of the memory cell in the X direction. FIG. 7 shows an example of a sectional structure of the select gate transistor in the X direction.

A plurality of memory cells (FG+WL) in the X direction are electrically separated from one another by an element separation layer 19 of a shallow trench isolation structure. On the p-type well region 11-3, a floating gate electrode FG is arranged through a very thin tunnel oxide film 20. On the floating gate electrode FG, a control gate electrode WL is arranged through an oxide/nitride/oxide (ONO) film 21.

The select gate line SGS/SGD has a stack gate structure. The lower select gate line SGS/SGD and the upper select gate line SGS/SGD are electrically connected to each other at, for example, an end of the memory cell array. Also in the memory cell array, they are electrically connected to each other at constant intervals, e.g., 512 bit lines.

(5) Constitutional Example of Data Circuit

Outline of Data Circuit

FIG. 8 shows a constitutional example of a data circuit.

The data circuit 2 includes m pieces of sub-data circuits, REGRq−1, REGRq, REGRq+1, . . . . The m pieces of sub-data circuits REGRq−1, REGRq, REGRq=1, ... correspond to m bit lines BL0, BL1, ... BLm−2, BLm−1.

The sub-data circuit REGRq has five data latch sections DS1, DS2, DS3, DS4, DS5. By using these data latch sections DS1, DS2, DS3, DS5, DS5, reading/writing of 2-bit data is carried out for one selected memory cell. The sub-data circuit REGRq is connected through N channel MOS transistors Qn1, Qn5 to the bit line BLq.

The data latch section DS3 has a function of temporarily storing data to decide execution of a writing operation in programming, and functions as a sense amplifier S/A to sense read data in reading. The data latch section DS4 has a function of temporality storing an upper bit HB in reading/ writing, and the data latch section DS5 has a function of temporarily storing a lower bit LB in reading/writing.

Sub-data Circuit

Figure 9:
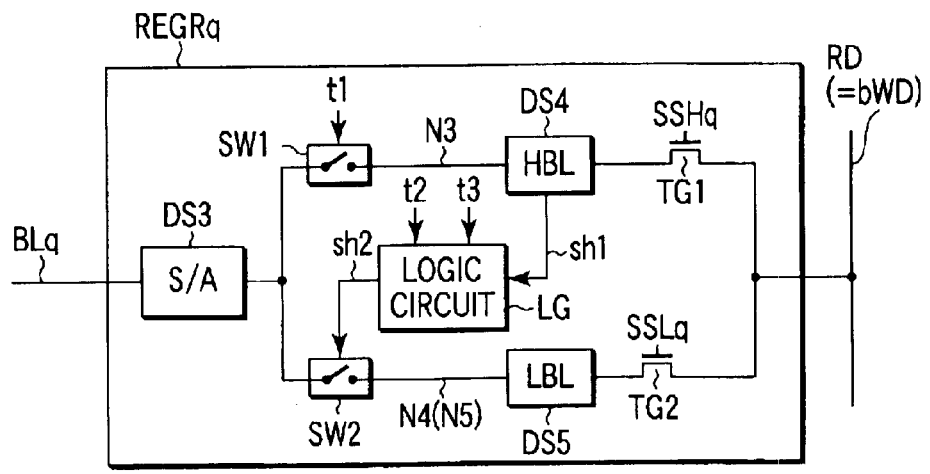
FIG. 9 is a view showing an example of a data circuit.

FIG. 9 shows main sections of the sub-data circuit.

The sub-data circuit REGRq has main sections of data latch sections DS3, DS4, DS5, a logic circuit LG, switch circuits SW1, SW2, and transfer gate transistors TG1, TG2.

The data latch section (S/A) DS3 is connected to the bit line BLj. As described above, the data latch section DS3 temporarily stores data to decide execution of a writing operation for a selected cell connected to the bit line BLj in programming. Additionally, the data latch section DS3 senses read data in reading.

Between the data latch section DS3 and the read/write data line (or I/O line) RD, bWD, the switch circuit SW1, the data latch section DS4 and the transfer gate transistor TG1 are serially connected and, in parallel with these, the switch circuit SW2, the data latch section DS5 and the transfer gate transistor TG2 are serially connected.

The data latch section DS4 is electrically connected to the read/write data line RD, bWD when the transfer gate transistor TG1 is turned ON by a serial accessing operation in reading/writing. The data latch section DS4 temporarily stores an upper bit (read/write data) HB.

The data latch section DS5 is electrically connected to the read/write data line RD, bWD when the transfer gate transistor TG2 is turned ON by the serial accessing operation in reading/writing. The data latch section DS5 temporarily stores a lower bit (read/write data) LB.

Figure 10:
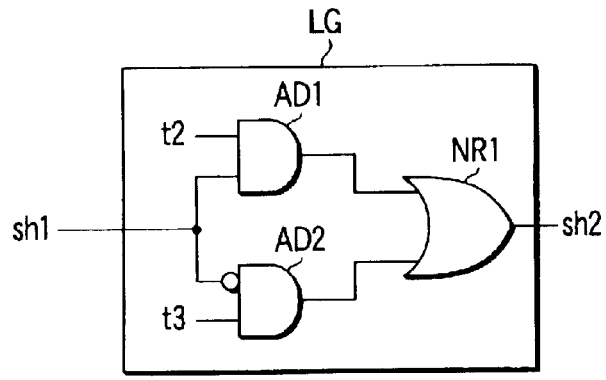
FIG. 10 is a view showing an example of a logic circuit.

Turning ON/OFF of the switch circuit SW1 is controlled by a control signal t1, and turning ON/OFF of the switch circuit SW2 is controlled by, for example, an output signal sh2 of a logic circuit LG. The logic circuit LG includes, for example, as shown in FIG. 10, AND gates AD1, AD2, and an OR gate NR1. The logic circuit LG generates an output signal sh2 based on a value sh1 of the upper bit HB and control signals t2, t3.

The control signal t1 becomes "H" in a reading/writing operation for the upper bit HB to turn ON the switch SW1. For example, in the first step of the program operation and the first step of the reading operation in the foregoing "Summary of the invention", the control signal t1 becomes "H" in a reading/writing operation for the upper bit HB.

For example, in the program operation, when a value of program data for the upper bit HB latched by the upper bit latch circuit HBL is "1" (N3="H"), in the second step of the foregoing "Summary of the invention", the control signal t2 becomes "H" and the control signal sh2 becomes "H". As a result, the switch SW2 is turned ON. When a value of program data for the upper bit HE latched by the upper bit latch circuit HBL is "0" (N3="L"), in the second step, the control signal sh2 is maintained at "L" even while the control signal t2 becomes "H". Thus, the switch circuit SW2 is not turned ON.

In the program operation, when the value of the program data for the upper bit HB latched by the upper bit latch circuit HBL is "0" (N3="L"), in the third step in the foregoing "Summary of the invention", the control signal t3 becomes "H", and the control signal sh2 becomes "H". As a result, the switch SW2 is turned ON. When the value of the program data for the upper bit HB latched by the upper bit latch circuit HBL is "1" (N3="H"), in the third step, the control signal sh2 is maintained at "L" even while the control signal t3 becomes "H". Thus, the switch circuit SW2 is not turned ON.

In the reading operation, when a value of the upper bit HB latched by the upper bit latch circuit HBL is "1" (N3="L"), in the second step of the foregoing "Summary of the invention", the control signal t3 becomes "H" and the control signal sh2 becomes "H". As a result, the switch SW2 is turned ON. When a value of the upper bit HB latched by the upper bit latch circuit HBL is "0" (N3="H"), in the second step, the control signal sh2 is maintained at "L" even while the control signal t3 becomes "H". Thus, the switch circuit SW2 is not turned ON.

In the reading operation, when the value of the upper bit HB latched by the upper bit latch circuit HBL is "0" (N3="H"), in the third step in the foregoing "Summary of the invention", the control signal t2 becomes "H", and the control signal sh2 becomes "H". As a result, the switch SW2 is turned ON. When the value of the upper bit HB latched by the upper bit latch circuit HBL is "1" (N3="L"), in the third step, the control signal sh2 is maintained at "L" even while the control signal t2 becomes "H". Thus, the switch circuit SW2 is not turned ON.

It should be noted that regarding the same node, e.g., N3 or N4 (N5), logic in programming and logic in reading are reversed.

That is, when program data is "1", N3 (or N4 (N5))="0", RD="1" are set. When read data is "0", N3 (or N4 (N5))= "1", RD="0" are set.

In the program operation, the program data for the upper bit HB is latched at the upper bit latch circuit (HBL) DS4 by serial accessing based on a control signal SSHq. The program data for the lower bit LB is latched at the lower bit latch circuit (LBL) DS5 by serial accessing based on a control signal SSLq.

In the reading operation, the upper bit (read data) HB latched by the upper bit latch circuit (HBL) DS4 is outputted to the read/write data line RD, bWD by serial accessing based on the control signal SSHq. The lower bit (read data) LB latched by the lower bit latch circuit (LBL) DS5 is outputted to the read/write data line RD, bWD by serial accessing based on the control signal SSLq.

Circuit Example of Sub-data Circuit

FIG. 11 shows a circuit example of a sub-data circuit.

The sub-data circuit REGRq includes five data latch sections DS1, DS2, DS3, DS4, DS5.

The data latch sections DS1, DS2 are constituted of, for example, depression type N channel MOS capacitors C1, C2. Needless to say, the data latch sections DS1, DS2 may be constituted of other types of capacitors. If a sufficient function as a latch section can be provided by stray capacitance of a wiring, it is not necessary to actively attach capacitors to the wiring.

The data latch section DS1 stores read/write data. In this example, as described above, it should be noted that logic of the read data and logic of the write data are reversed.

That is, when the read data is "1", the node N2 becomes "0". When the read data is "0", the node N2 becomes "1". When the program data is "1", the node N2 becomes "1". When the program data is "0", the node N2 becomes "0".

Due to such logic reversal, the data latch section DS2 is disposed. That is, in the case of "1"-programming (program for nonfluctuation of a threshold value), the data latch section DS3 stores "1" (N2="1"). However, in the case of "1"-programming, verification reading becomes N2="0". Thus, the data latch section DS2 has a function as a recharging circuit for forcibly setting the node N2 to "1" to store "1" again in the data latch section DS3 in verification reading.

The data latch section (S/A) DS3 is constituted of a latch circuit. This latch circuit is a cross-couple flip-flop circuit where supplying of a power supply potential is controlled by control signals SEN, SEN'. The control signal SEN' is a signal delayed slightly from the control signal SEN. By setting such timing deviation, a sensing operation and a latching operation can be surely carried out.

The data latch section (HBL) DS4 is constituted of a cross-couple flip-flop circuit where supplying of a power supply potential is controlled by control signals LAT1, LAT1'. The control signal LAT1' is a signal delayed slightly from the control signal LAT1. Accordingly, a sensing operation and a latching operation of the upper bit HB can be surely carried out.

The data latch section (LBL) DS5 is constituted of a cross-couple flip-flop circuit where supplying of a power supply potential is controlled by control signals LAT2, LAT2'. The control signal LAT2' is a signal delayed slightly from the control signal LAT2. Accordingly, a sensing operation and a latching operation of the lower bit LB can be surely carried out.

Figure 12:
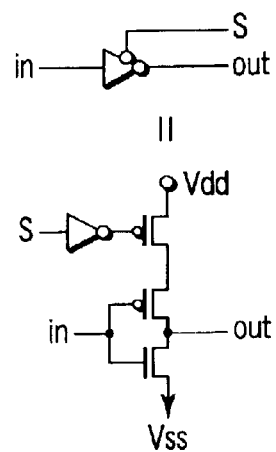
FIG. 12 is a circuit diagram showing an example of an inverter circuit.

A specific component example of the cross-couple flip-flop circuit is shown in FIG. 12.

One end of a MOC capacitor C1 is connected through N channel MOS transistors Qn5, Qn1 to the bit line BLq, while the other end thereof is connected to a ground point Vss.

The MOS transistor Qn1 cuts off an erasing potential in erasing. That is, in erasing, a channel of the memory cell is set to a high potential (erasing potential) to discharge electrons from a floating gate electrode. When this high potential is transferred to the sub-data circuit REGRq, elements constituting the sub-data circuit are destroyed. Thus, in erasing, the MOS transistor Qn1 is turned OFF to prevent the transfer of the high potential to the sub-data circuit. In reading/writing, the MOS transistor Qn1 is turned ON.

The MOS transistor Qn5 is a clamp transistor for deciding a precharging level of the bit line BLq in reading. That is, the MOS transistor Qn5 limits the precharging level of the bit line BLQ to a value lowered from BLCLAMP by an amount equal to its threshold voltage to speed up discharging of charge from the bit line BLq, to increase transfer efficiency of charge from the bit line BLq to the data latch section (S/A), or to cut off charge transfer depending on a potential situation.

This example has circuitry where one bit line BLq is connected between the MOS transistors Qn1, Qn2. However, p (p means plurality) units each constituted of the MOS transistors Qn1, Qn5 and the bit line BLq may be prepared, and these p units may be connected to one sub-data circuit REGRq. In this case, p column banks are formed as described later. Selection of a column bank is carried out by the MOS transistor Qn1.

The MOS transistor Qn2 in a selected column bank is turned OFF when a control signal BIAS becomes "L". The MOS transistor Qn2 in an unselected column bank is turned ON when the control signal BIAS becomes "H". A bias potential (shield potential) is applied to the bit line BLq in the unselected column bank to carry out reading at a high speed.

An N channel MOS transistor Qn6 is connected to one end of the MOS capacitor C1. The MOS transistor Qn6 charges one end of the MOS capacitor C1 to a precharging potential VPRE. When a control signal BLPRE is "H", one end of the MOS capacitor C1 is charged to the precharging potential VPRE. The control signal BLPLE is larger than a power supply potential Vdd.

N channel MOS transistors Qn7, Qn8 are serially connected, and one end of each thereof is connected to one end of the MOS capacitor C1. A gate of the MOS transistor Qn8 is connected to one end of a MOS capacitor C2, and VREG is applied to its source.

When a control signal REG is "H", i.e., the MOS transistor Qn7 is ON, the MOS transistor Qn8 is turned ON or OFF in accordance with a value of data stored in the data latch section DS2. That is, when a value of the data stored in the data latch section DS2 is "1", a potential of one end of the MOS capacitor C1 is forcibly set to VREG (=1"H"), i.e., "1", irrespective of a value of read data by verification reading.

For example, when the data stored in the data latch section DS2 is "1", i.e., a gate level of the MOS transistor Qn8 is "H", the MOS transistor Qn8 is turned ON. Accordingly, when the control signal REG becomes "H", one end of the MOS capacitor C1 is forcibly set to VREG. When the data stored in the data latch section DS2 is "0", i.e. a gate level of the MOS transistor Qn8 is "L", the MOS transistor Qn8 is OFF. Accordingly, a potential of one end of the MOS capacitor C1 is not influenced by VREG.

The data latch section (S/A) DS3 is constituted of a cross-couple flop-flop circuit as described above. An output node N7 of the data latch section DS3 is connected to a gate of a N channel MOS transistor Qn17.

The N channel MOS transistor Qn17 decides a level of a common node PCD based on data stored in the data latch section DS3. Here, the common node PCD is a node to which MOS transistors Qn17 in a plurality or all sub-data circuits . . . , REGRq, . . . are connected in common. The batch detecting circuit 10 of FIG. 1 carries out verification determination based on a potential of the common node PCD.

For example, in "0"-programming, program data ("0"— data) is stored in the data latch section DS3. That is, since the node N7 becomes "H", the N channel MOS transistor Qn17 is turned ON to set a level of the common node PCD to "L". In verification reading, if there is "0"—data correctly stored in the memory cell, read data becomes "1", and thus "1"—data is stored in the data latch section DS3. That is, since the node N7 becomes "L", the N channel MOS transistor Qn17 is turned OFF.

The potential of the common node PCD is precharged for each verification operation. When the MOS transistors Qn17 in the plurality of sub-data circuits . . . , REGRq, . . . connected to the common node PCD are all OFF, the precharging is maintained. In this case, the writing operation is finished (status=Pass). When at least one of the MOS transistors Qn17 in the plurality of sub-data circuits . . . , REGRq, . . . connected to the common node PCD is ON, the potential of the common node PCD is lowered. In this case, the writing operation is continued.

Between the data latch section DS2 and the data latch section DS3, an N channel MOS transistor Qn9 as a switch element is connected. The MOS transistor Qn9 is controlled by a control signal DTG, and used to transfer data stored in the data latch section DS3 to the data latch section DS2.

Between the data latch section DS1 and the data latch section (HBL) DS4, an N channel MOS transistor Q1 as a switch element is connected. The MOS transistor Q1 is controlled by a control signal t1, and used to execute data transfer between the data latch section DS1 and the data latch section DS4. The MOS transistor Q1 is equivalent to the switch circuit SW1 of FIG. 9.

Between the data latch section DS1 and the data latch section (LBL) DS5, N channel MOS transistors Q2, Q4 as switch elements are connected. The MOS transistor Q2 is controlled by a control signal t2. The MOS transistor Q4 is controlled by data latched by the data latch section DS4, i.e., a potential level of the node N3.

Between the data latch section DS1 and the node N5 (=N4) of the data latch section DS5, N channel MOS transistors Q3, Q5 as switch elements are connected. The MOS transistor Q3 is controlled by a control signal t3. The MOS transistor Q5 is controlled by data obtained by reversing a value of data latched by the data latch section DS4, i.e., a potential level of the node N6.

The MOS transistors Q2, Q3, Q4, Q5 are equivalent to the logic circuit LG and the switch circuit SW2 of FIG. 9.

The data latch section DS4 is connected through an N channel MOS transistor TG1 as a transfer gate transistor to a read/write data line (I/O line) RD, bWD. A control signal SSHq is for controlling serial accessing of the upper bit (logic upper pate data) HB.

The data latch section DS5 is connected through an N channel MOS transistor TG2 as a transfer gate transistor to a read/write data line (I/O line) RD, bWD. A control signal SSLq is for controlling serial accessing of the lower bit (logic lower pate data) LB.

In the foregoing description, there are "0" and "1" for the data, and there are "L" and "H" for the node level. A relation therebetween is that "0" is equivalent to "L", and "1" is equivalent to "H".

3. Basic Operation

Hereinafter, detailed description will be made of operations of main sections, especially the data circuit (FIG. 11) of the 4-level NAND cell type flash memory (FIG. 1) on each operation mode such as reading or programming.

Before the operation is described, first, an example of a threshold voltage of the memory cell will be briefly explained.

(1) Threshold Voltage of Memory Cell

Threshold Zone of Memory Cell

Figure 13:
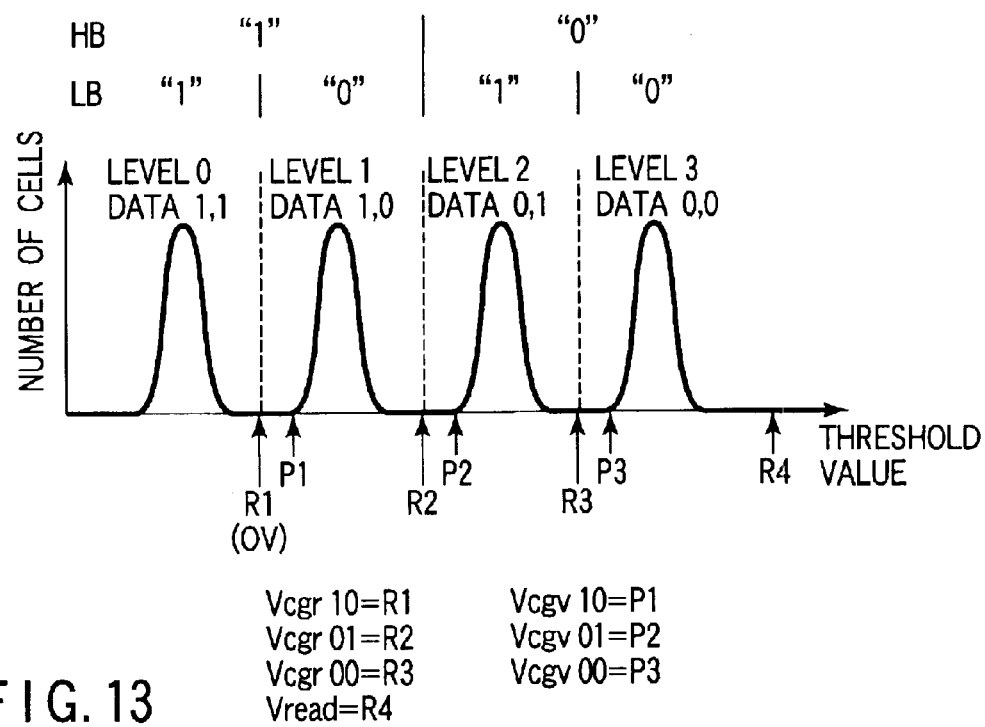
FIG. 13 is a view showing a relation between data of a memory cell and a threshold voltage distribution.

FIG. 13 shows a threshold zone of the memory cell of the 4-level NAND cell type flash memory.

In one memory cell, 2-bit data (4-level data) is stored. In the example, as described above, the 2-bit data is constituted of "11", "10", "01", "00". 1 bit and the other 1 bit of the 2-bit data are stored in the same memory cell respectively as an upper bit (logic upper page data) HB and a lower bit (logic lower page data) LB.

A relation between the 2-bit data ("11", "10", "01", "00") and a threshold voltage of the memory cell becomes similar to that shown in FIG. 13.

"11" is an erasing state. In the erasing state, a value of the upper bit HB and a value of the lower bit LB are both "1". The memory cell of the erasing state has a negative threshold voltage Vth.

"10", "01", "00" are writing states. The memory cell of the writing state has a positive threshold voltage Vth. Among the writing states, the "10" state has a lowest threshold voltage, the "00" state has a highest threshold voltage, and the "01" state has a threshold voltage between the "10" state and the "00" state.

Vcgr 10 (=R1), Vcgr 01 (=R2) and Vcgr 00 (=R3) are potentials applied to a selected word line in a selected block in normal reading, and Vread (=R4) is a potential applied to an unselected word line in the selected block in normal reading.

If a threshold voltage of the memory cell is less than Vcgr 10, data of the memory cell is "11". If a threshold voltage of the memory cell exceeds Vcgr 10 and lower than Vcgr 01, data of the memory cell is "10". If a threshold voltage of the memory cell exceeds Vcgr 01 and lower than Vcgr 00, data of the memory cell is "01". If a threshold voltage of the memory cell exceeds Vcgr 00, data of the memory cell is "00".

Vcgv 10 (=P1), Vcgv 01 (=P2) and Vcgv 00 (=P3) are potentials applied to a selected word line in a selected block in verification reading, and Vread (=R4) is a potential applied to an unselected word line in the selected block in verification reading.

For example, Vcgr 10 is set to about 0 V, Vcgr 01 to about 1 V, and Vcgr 00 to about 2 V. Vcgv 10 is set to about 0.4 V, Vcgv 01 to about 1.4 V, and Vcgv 00 to about 2.4 V.

As described above, the 2-bit data is constituted of the upper bit HB and the lower bit LB. The 2-bit data is written in the memory cell by a program operation for the upper bit HB and a program operation for the lower bit LB.

Programming of Upper Bit (Logic Upper Page Data)

Figure 14:
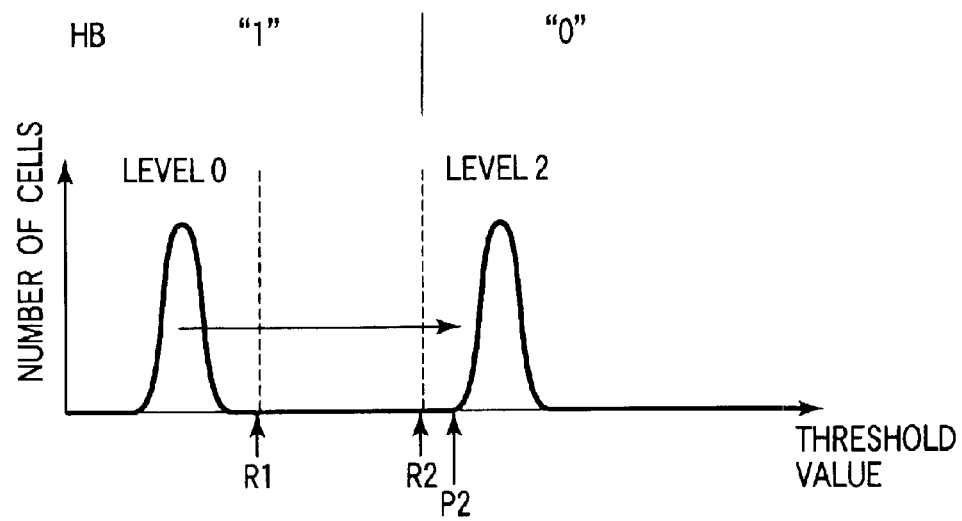
FIG. 14 is a view showing a change in a threshold voltage in programming of logic upper page data.

First it is assumed that all the memory cells are in erasing states, i.e., "11". Then, as shown in FIG. 14, when programming of the logic upper page data is carried out, a distribution of a threshold voltage Vth of the memory cell is divided into two in accordance with a value ("1" or "0") of program data (upper bit HB).

That is, if program data for the upper bit HB is "1", the bit line is set to "H" (selected word line is set to a program potential Vpgm) to prevent application of a high electric field to a tunnel oxide film of the memory cell, thereby preventing an increase in the threshold voltage Vth of the memory cell. As a result, the memory cell maintains the erasing state ("11"), i.e., a threshold level 0 (programming of upper bit HB="1").

On the other hand, if programming data for the upper bit HB is "0", the bit line is set to "L" (selected word line is set to a program potential Vpgm) to apply a high electric field to the tunnel oxide film of the memory cell. Electrons are injected into the floating gate electrode to increase the threshold voltage of the memory cell by a predetermined amount. As a result, the memory cell is changed to a writing state ("01" state), i.e., a threshold level 2 (programming of upper bit HB="0").

Programming of Lower Bit (Logic Lower Page Data)

After the programming of the upper bit HB, programming of the lower bit LB is carried out. The programming of the lower bit LB is carried out by two program operations.

First, only for the memory cell of the upper bit HB of "1", programming of the lower bit LB is carried out.

When the upper bit HB is "1", program data is transferred from, for example, the data latch section DS5 to the data latch section DS3 of FIG. 11. When the upper bit HB is "0", the data latch section DS3 is set to a state where "1" has been stored irrespective of a value of the program data.

Figure 15:
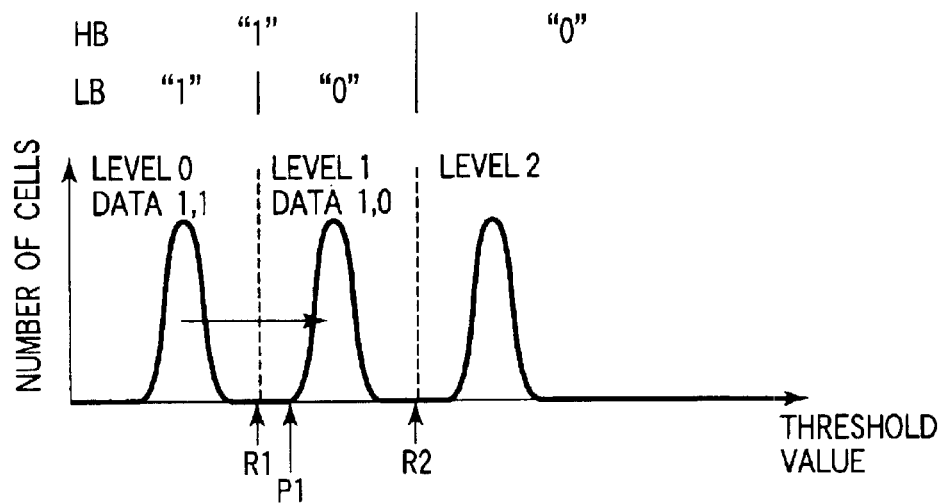
FIG. 15 is a view showing a change in a threshold voltage in programming of logic lower page data.

As shown in FIG. 15, if "1" is programmed as the lower bit LB for the memory cell of the upper bit HB of "1", since the selected word line has been set to the program potential Vpgm, the bit line is set to "H" to prevent application of a high electric field to the tunnel oxide film of the selected memory cell. As a result, it is possible to prevent an increase in the threshold voltage Vth of the selected memory cell.

Accordingly, the memory cell of the upper bit HB of "1", i.e., "11" (erasing state) maintains the "11" state ("1"-programming for the lower bit LB).

If "0" is programmed as the lower bit LB for the memory cell of they upper bit HB of "1", since the selected word line has been set to the program potential Vpgm, the bit line is set to "L" to apply a high electric field to the tunnel oxide film of the selected memory cell. As a result, the threshold voltage Vth of the selected memory cell is increased.

Accordingly, the memory cell of the upper bit HB of "1", i.e., "11" (erasing state), is changed from the "11" state to a "10" state ("0"-programming for the lower bit LB).

Then, programming of the lower bit LB is carried out only for the memory cell of the upper bit HB of "0".

When the upper bit HB is "0", program data is transferred, for example, from the data latch section D55 to the data latch section DS3 of FIG. 11. When the upper bit HB is "1", the data latch section DS3 is set a state where "1" has been stored irrespective of a value of the program data.

Figure 16:
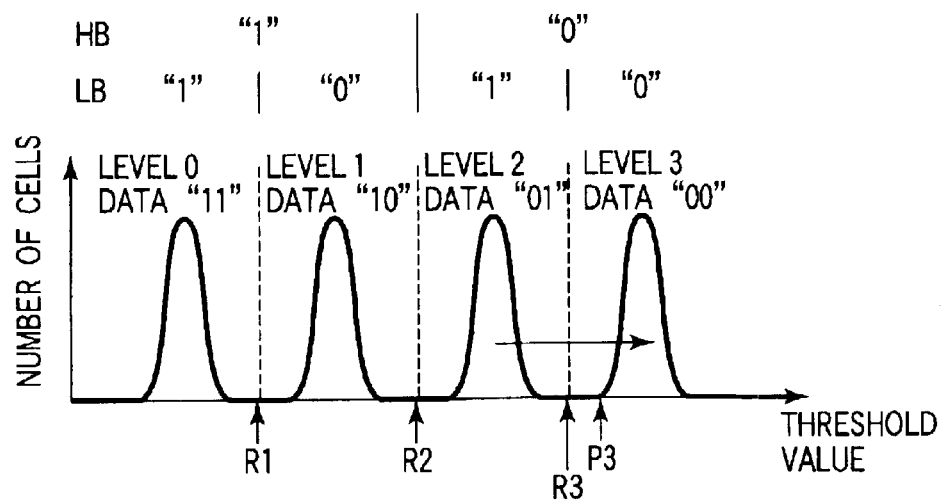
FIG. 16 is a view showing a change in a threshold voltage in programming of logic lower page data.

As shown in FIG. 16, if "1" is programmed as the lower bit LB for the memory cell of the upper bit HB of "0", since the selected word line has been set to the program potential Vpgm, the bit line is set to "H" to prevent application of a high electric field to the tunnel oxide film of the selected memory cell. As a result, it impossible to prevent an increase in the threshold voltage Vth of the selected memory cell.

Accordingly, the memory cell of the upper bit HB of "0", i.e., "01", maintains the "01" state ("1"-programming for the lower bit LB).

If "0" is programmed as the lower bit LB for the memory cell of the upper bit HB of "0", since the selected word line has been set to the program potential Vpgm, the bit line is set to "L" to apply a high electric field to the tunnel oxide film of the selected memory cell. As a result, the threshold voltage Vth of the selected memory cell is increased.

Accordingly, the memory cell of the upper bit HB of "0", i.e., "00", is changed from the "01" state to a "00" state ("0"-programming for the lower bit LB).

Thus, by the two programming operations, a distribution of the threshold voltage Vth of the memory cell is divided into four states ("11", "10", "01", "00"). The program of the upper bit HB can be completed by one program operation (including verification). The program of the lower bit LB needs two program operations (including verification). However, it is not necessary to carry out data reading for the program operation or a logical operation between the read data and the program data. Thus, the time of the program operation can be shortened to set 1st access time approximately equal to that of the binary flash memory.

Potential Relation in Writing Operation

Figure 17:
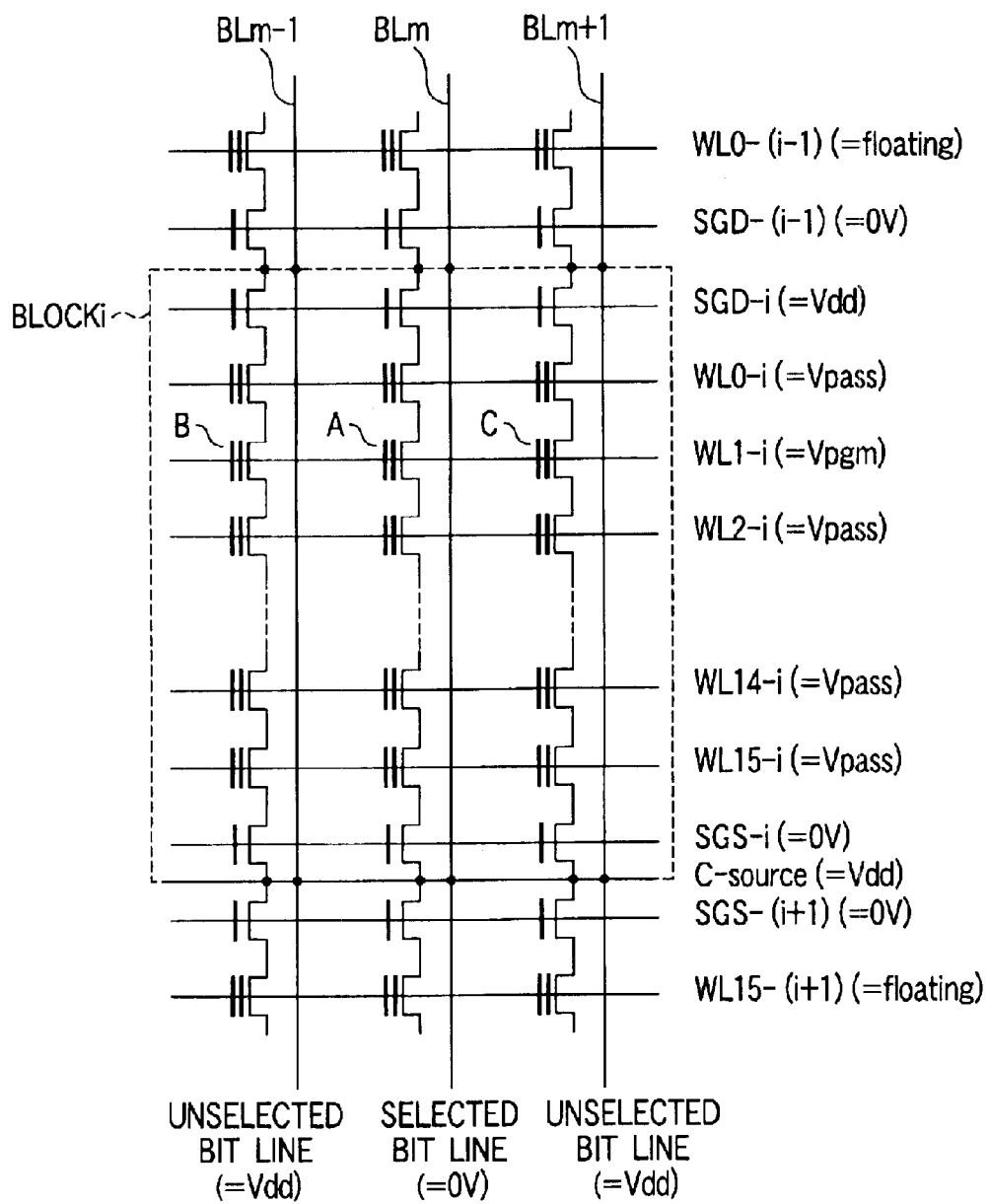
FIG. 17 is a view showing an example of a potential applied to a word line and a bit line in programming.

FIG. 17 shows an example of a potential applied to the memory cell and the select gate transistor in a writing operation.

A block BLOCK i is selected, and program data is programmed for each memory cell connected to a word line WL1-i in the block BLOCK i.

Bit lines BLm−1, BLm+1 are unselected (Vdd), which means that a threshold value of a selected memory cell connected to the bit lines BLm−1, BLm+1 is not increased ("0"-programming is not carried out). A bit line BLm is selected (0 V), which means that a threshold value of a selected memory cell connected to the bit line BLm is increased ("0"-programming is carried out).

Word lines WL0-(i−1), WL15-(i+1) in an unselected block are all set to floating states. Select gate lines SGD-(i−1), SGS-(i+1) in the unselected block are all set to 0 V.

A program potential Vpgm is applied to a selected word line WL1-i in the selected block BLOCK i, and a transfer potential Vpass is applied to unselected word lines WL0-i, WL2-i, . . . WL15-i in the selected block BLOCk i.

A source side select gate line SGS-i in the selected block BLOCK i is set to 0 V, and a drain side select gate line SGD-i in the selected block BLOCK i is set to Vdd.

A channel of a memory cell A connected to the bit lien BLm is 0 V. Since a high electric field is generated between the channel of the memory cell A and the word line (control gate electrode) WL1-i, electrons are injected into a floating gate electrode of the memory cell A by an FN tunnel phenomenon. As a result, a threshold value of the memory cell A is increased.

Channels of memory cells B, C connected to the bit lines BLm−1, BLm+1 are charged to Vdd-Vth (Vth is a threshold voltage of the select gate transistor), and then set to floating states because the drain side select gate transistor SGD-i is turned OFF. Thus, no high electric fields are generated between the channels of the memory cells B, C and the word line (control gate electrode) WL1-i. As a result, no electrons are injected into the floating gate electrodes of the memory cells B, C, and threshold values of the memory cells B, C are not increased.

Verification Technology

A point to note in setting of the flash memory to multiple levels is that a width of the threshold value distribution is sufficiently narrowed to prevent excessive closeness between threshold zones. It is because the narrowed width of the threshold value distribution becomes important for realizing a reduction in a power supply potential and a high speed for a reading operation.

For example, the narrowed width of the threshold value distribution enables enlargement of a threshold difference between two threshold levels. As a result, a sufficient difference can be secured between a threshold value of the memory cell and a reference potential. This means that a cell current of the memory cell can be increased to contribute to the achievement of the high speed of the reading operation.

In the multi-level flash memory, a technology of narrowing the width of the threshold value distribution and making the threshold value distribution sharp is a verification technology.

Figure 18:
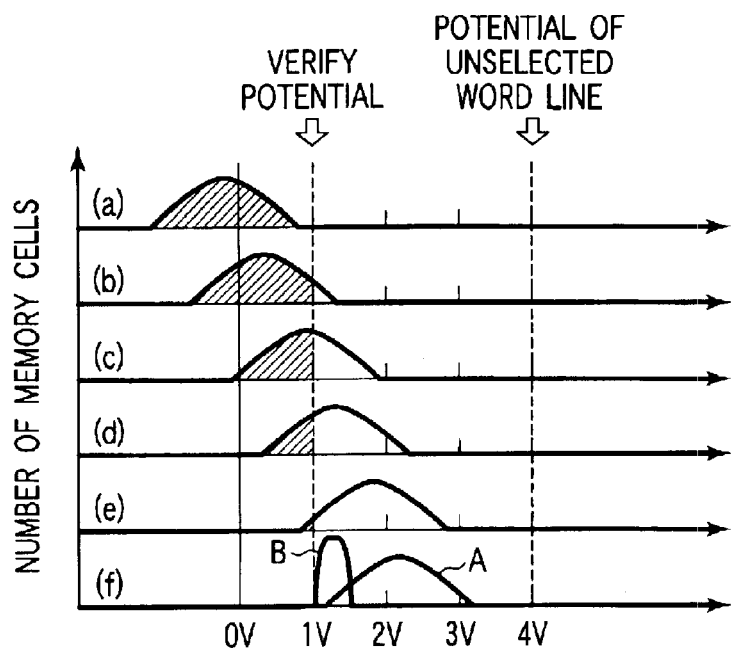
FIG. 18 is a view showing a change in a threshold voltage when verification is applied.

FIG. 18 shows an outline of the verification technology.

The threshold value distribution after erasing is a broad distribution reflecting erasing characteristics thereof (see (a)). When a writing operation is carried out in this state to slightly increase the threshold value of the memory cell, its distribution is only moved in parallel, and almost no changes occur in a shape of the distribution. As a result, the threshold value distribution of the memory cell after the end of the program operation also becomes a broad distribution (see A of (f)).

Accordingly, the verification technology is applied.

According to the verification technology, briefly, injection of electrons to the floating gate electrode by an FN tunnel current is carried out by a plurality of writing operations. For each end of a writing operation, checking is made on whether a threshold value has reached a predetermined level (verify potential) or not. For the memory cell which threshold value has not reached the predetermined level, the writing operation is carried out thereafter. When threshold values of all the memory cells reach the predetermined level, the program operation is finished.

According to the verification technology, since the amount of electrons (shifting amount of the threshold value) injected to the floating gate electrode by one writing operation is set small, the threshold value of the memory cell is increased little by little (see (b) to (e)).

For the memory cell which threshold value has reached the predetermined level (verify potential), the writing operation is not carried out thereafter. Thus, a threshold value distribution after completion of the data program for all the memory cells becomes a narrow and sharp distribution (see B of (f)).

Therefore, also in the multi-level, if the verification technology is applied, for example, as shown in FIG. 13, a width of each threshold value distribution of a plurality of threshold zones can be narrowed to realize a reduction in the power supply potential and a high speed of a reading operation.

(2) Reading Operation

Now, a reading operation will be described.

Algorithm

Figure 19:
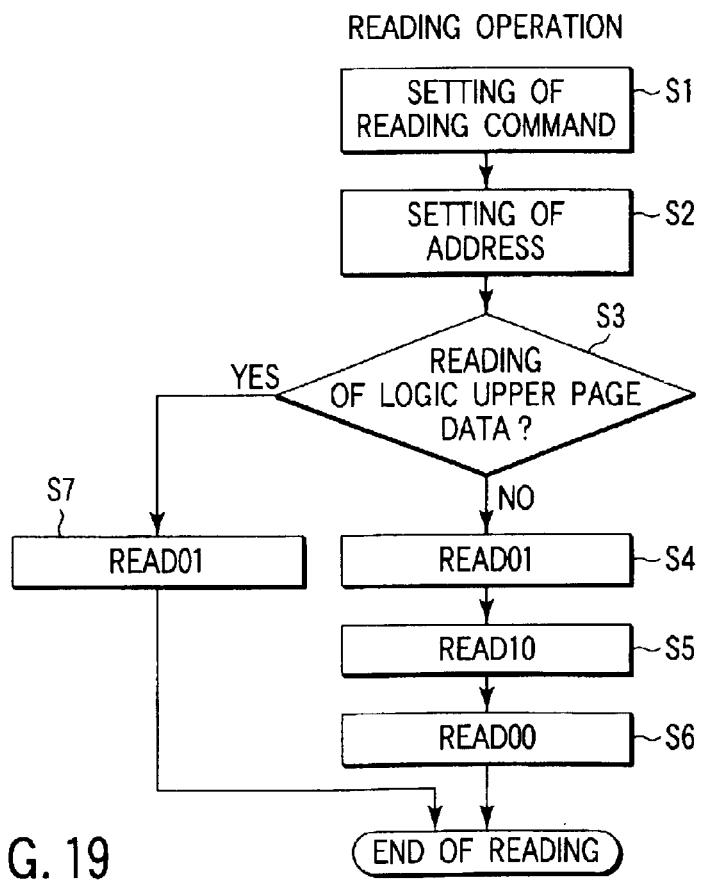
FIG. 19 is a view showing an algorithm of a reading operation.

FIG. 19 shows an algorithm of the reading operation.

First, a command interface circuit checks a reading command supplied from a host microcomputer. Then, the reading command is set in a state machine (control circuit) (step S1).

When an address signal is supplied from the host microcomputer into a memory chip, an address for selecting a read page is set in the state machine (step S2).

After the setting of the reading command and the address signal in the state machine, operations from step S3 to step S7 are automatically carried out under control by the state machine.

For reading of the upper bit (logic upper page data) HB, as described above, one reading operation "READ 01" is carried out (steps S3, S7). In the READ 01, in a selected block, a potential of a selected word line is set to Vcgr 01, and a potential of an unselected word line is set to Vread.

When the upper bit HB of a selected memory cell is "1", a threshold value of the memory cell is lower than Vcgr 01. Thus, the selected memory cell is turned ON, an unselected memory cell is also turned ON, and a potential of the bit line becomes "L". The read data (upper bit HB) is latched by the upper bit latch circuit HBL.

When the upper bit HB of the selected memory cell is "0", a threshold value of the memory cell is higher than Vcgr 01. Thus, the selected memory cell is OFF while an unselected memory cell is ON, and a potential of the bit line becomes "H". The read data (upper bit HB) is latched by the upper bit latch circuit HBL.

The read data latched by the latch circuit HBL is transferred to the read data line RD by, for example, serial accessing during the reading operation of the lower bit (logic lower page data) LB.

For reading of the lower bit (logic lower page data) LB, as described above, the reading "READ 01" of the upper bit HB is required, and two reading operations "READ 10" and "READ 00" are carried out (steps S3 to S6).

First, reading READ 10 targeting only the memory cell of the upper bit HB of "1" is carried out (step S5). In the READ 10, in a selected block, a potential of a selected word line is set to Vcgr 10, and a potential of an unselected word line is set to Vread.

When the lower bit LB of a selected memory cell is "1", a threshold value of the memory cell is lower than Vcgr 10. Thus, the selected memory cell is turned ON, an unselected memory cell is also turned ON, and a potential of the bit line becomes "L". The read data (lower bit LB) is latched by the lower bit latch circuit LBL.

When the lower bit LB of the selected memory cell is "0", a threshold value of the memory cell is higher than Vcgr 10. Thus, the selected memory cell is OFF while an unselected memory cell is ON, and a potential of the bit line becomes "H". The read data (lower bit LB) is latched by the lower bit latch circuit LBL.

Then, reading READ 00 targeting only the memory cell of the upper bit HB of "0" is carried out (step S6). In the READ 00, in a selected block, a potential of a selected word line is set to Vcgr 00, and a potential of an unselected word line is set to Vread.

When the lower bit LB of a selected memory cell is "1", a threshold value of the memory cell is lower than Vcgr 00. Thus, the selected memory cell is turned ON, an unselected memory cell is also turned ON, and a potential of the bit line becomes "L". The read data (lower bit LB) is latched by the lower bit latch circuit LBL.

When the lower bit LB of the selected memory cell is "0", a threshold value of the memory cell is higher than Vcgr 00. Thus, the selected memory cell is OFF while an unselected memory cell is ON, and a potential of the bit line becomes "H". The read data (lower bit LB) is latched by the lower bit latch circuit LBL.

The read data latched by the latch circuit LBL is transferred to the read data RD by, for example, serial accessing during the reading operation of the upper bit (logic upper page data) HB.

Operation Explanation Based on Operating Waveform

Hereinafter, a specific operation will be described by using an operation timing chart of FIG. 20.

For reading operations, there are a reading operation of an upper bit (logic upper page data), a reading operation of a lower bit (logic lower page data), and a reading operation of both. The reading operation of both where the upper bit and the lower bit are continuously read is similar to the reading operation of the lower bit. Thus, hereinafter, the reading operation of the upper bit and the reading operation of the lower bit will be described.

[1] Reading Operation of Upper Bit (Logic Upper Page Data)

The reading operation of the upper bit (logic upper page data) is constituted of one reading operation, i.e., "READ 01".

[1]-1 "READ 01"

Figure 20:
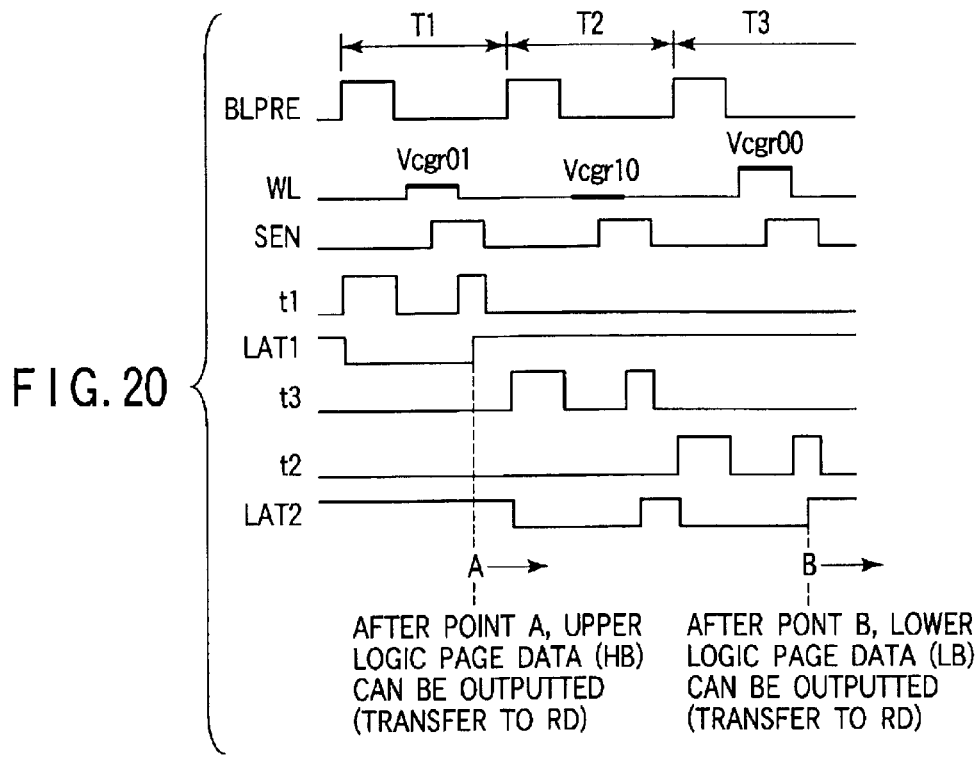
FIG. 20 is a view showing an example of an operating waveform of a reading operation.
Figure 21:
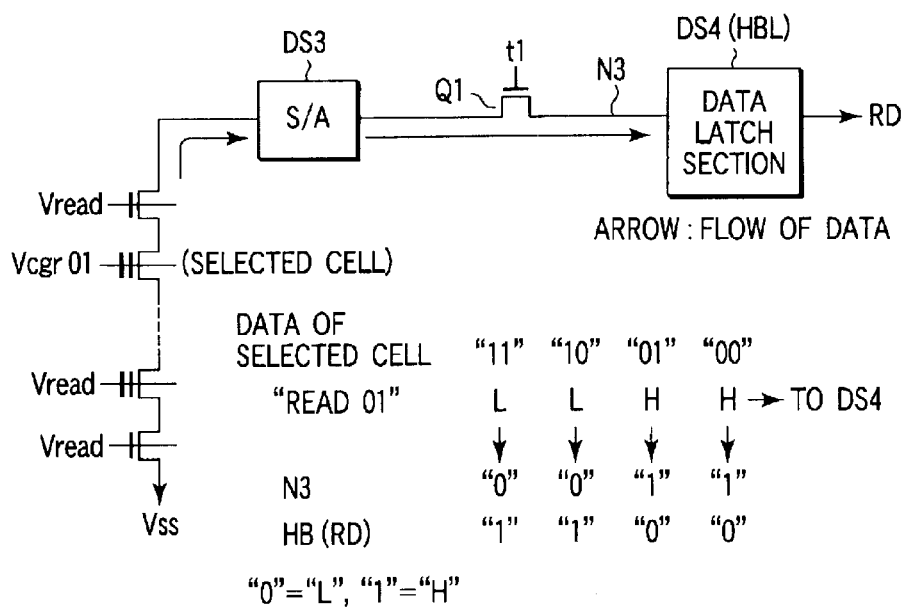
FIG. 21 is a view showing a data flow in reading of logic upper page data.

As shown in FIGS. 20 and 21, the "READ 01" operation sets a reading potential (potential of a selected word line WL) to Vcgr 01 (e.g., 1 V), and recognizes that data of the memory cell are "11", "10" or other data "01", "00".

[1]-1-1 Data Reading (Period T1)

First, a control signal BLPRE becomes "H", and the N channel MOS transistor Qn6 (FIG. 11) is turned ON. A control signal BLCLAMP becomes Vclamp (e.g., 2 V), and a control signal BLS becomes Vsghh (e.g., 4.5 V), whereby the bit line BLq is precharged to a predetermined potential (e.g., about 1 V).

At this time, a control signal BIAS is "L". The input node of the data latch section (sense latch) DS3 is simultaneously precharged.

Since a control signal t1 becomes "H", the MOS transistor Q1 is turned ON to precharge the node N3 of the data latch section DS3 side of the data latch section DS4. Here, the data latch section DS4 is in an nonoperated state because control signals LAT1, LAT1' are set to "L". Thus, a precharging potential is not latched by the data latch section DS4.

After the end of the precharging, the control signal t1 becomes "L" to cut off the data latch section DS3 and the data latch section DS4 from each other.

Subsequently, the control signal BLCLAMP becomes Vss (e.g., 0 V) and the control signal BLPRE becomes "L" to set the bit line BLq in a floating state. Additionally, a transfer potential Vread (e.g., 4.5 V) is applied to the select gate line and the unselected bit line of the bit line side, and a reading potential Vcgr 01 is applied to the selected word line WL.

Then, when a potential of the select gate line of the source line side is set to a transfer potential Vread, an influence appears in the potential of the bit line BLq in accordance with the state of the selected memory cell, i.e., a value of data stored in the memory cell.

That is, if the data of the memory cell are "11", "10", the selected memory cell is turned ON by a reading potential Vcgr 01. Accordingly, charge of the bit line BLq is discharged to reduce the potential of the bit line BLq to 0.8 V or lower.

On the other hand, if the data of the memory cell are "01", "00", the selected memory cell is not turned ON by the reading potential Vcgr 01. Thus, no charge of the bit line BLq is discharged, whereby the bit line BLq maintains a precharging potential (about 1 V).

Subsequently, a control signal SEN is set to "H" and, a little later, a control signal SEN' is set to "H", whereby the aforementioned potential change of the bit line BLq is latched by the data latch section (sense latch) DS3.

An example of a method for latching the potential change of the bit line BLq is as follows.

First, by setting the control signal BLPRE to about 4.5 V and the control signal VPRE to Vdd (e.g., 3 V), one end of the capacitor C1 of the data latch section DS1, i.e., the node N2, is charged to Vdd. In FIG. 20, this step is omitted.

Subsequently, when the control signal BLCLAMP is set to Vsense (e.g., 1.8 V), a potential of one end of the capacitor C1 of the data latch section DS1 is changed as follows.

That is, if the potential of the bit line BLq is still at the precharging potential (about 1 V) (data of the memory cell are "01", "00"), the N channel MOS transistor (clamp transistor) Qn5 (FIG. 11) is OFF, and the potential of one end of the capacitor C1 of the data latch section DS1 is maintained at Vdd ("H").

On the other hand, if the potential of the bit line BLq is 0.8 V or lower (data of the memory cell are "11", "10"), the N channel MOS transistor (clamp transistor) Qn5 (FIG. 11) is ON to discharge charge of one end of the capacitor C1 of the data latch section DS1 to the bit line BLq, and its potential is reduced to a value ("L") lower than Vdd.

As a result, in the data latch section DS1 (one end of the capacitor C1), read data is stored by the reading potential Vcgr 01. That is, if the data of the memory cell are "11", "10" (upper bit HB is "1"), the node N2 becomes "L". If the data of the memory cell are "01", "00" (upper bit HB is "0"), the node N2 becomes "H", and this data is stored in the data latch section (sense latch) DS3.

Subsequently, when the control signal t1 becomes "H" and the control signal LAT1 becomes "H", the data of the data latch section DS3 is transferred to the data latch section (HBL) DS4. That is, as shown in FIG. 21, if the data of the memory cell are "11", "10" (upper bit HB is "1"), the node N3 becomes "L". If the data of the memory cell are "11", "10" (upper bit HB is "1"), the node N3 becomes "H".

Then, when the control signal LAT1' becomes "H" a little after the control signal LAT1 has become "H", the read data (upper bit HB) is latched by the data latch section DS4.

[1]-2 Serial Accessing

When the "READ 01" operation is finished, and the read data (upper bit HB) of one page is latched by the data latch section DS4, thereafter (after a point A in FIG. 20), outputting of the upper bit HB by serial accessing, i.e., transfer to the read data line RD, can be carried out.

The serial accessing is carried out by sequentially setting values of the control signal SSHq (q=0, 1, 2, . . . ) of FIG. 11 to "H".

To read the lower bit LB continuously after the upper bit HB, for example, during the serial accessing for the upper bit (logic upper page data) HB, the following reading operation ("READ 10" and "READ 00") of the lower bit (logic lower page data) LB is carried out.

[1]-3 Summary

FIG. 21 briefly shows a flow of the read data in the reading operation of the upper bit (logic upper page data) HB.

The reading operation of the upper bit HB is easily carried out by executing the "READ 01" and latching the read data thereby read from the memory cell at the data latch section DS4.

That is, the reading operation of the upper bit HB in the 4-level flash memory is similar to the reading operation in the binary flash memory. As a result, the 1st access time in the 4-level flash memory becomes approximately equal to that in the binary flash memory, and thus it is possible to realize high-speed reading/writing in the multi-level flash memory.

[2] Reading Operation of Lower Bit (Logic Lower Page Data)

The reading operation of the lower bit (logic lower page data) requires the upper bit reading operation "READ 01", and two reading operations "READ 10" and "READ 00".

[2]-1 "READ 01"

The "READ 01" operation has been described in the "upper bit reading operation", and thus its explanation is omitted.

Figure 22:
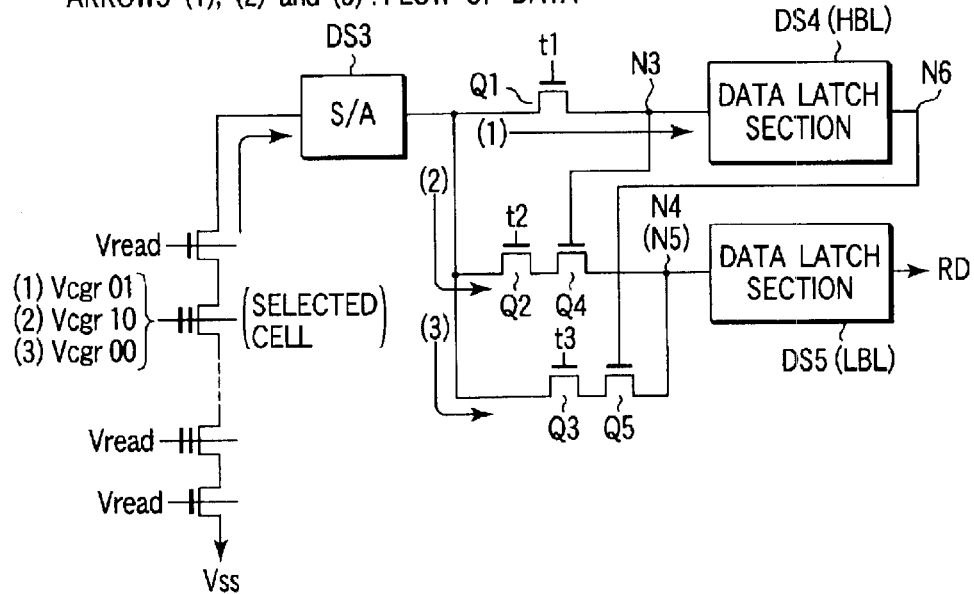
FIG. 22 is a view showing a data flow in reading of logic lower page data.

The upper bit (logic upper page data) HB is stored in the data latch section (HBL) DS4 as shown in (1) of FIG. 22.

[2]-2 "READ 10"

The "READ 10" operation sets, as shown in FIG. 20 and (2) of FIG. 22, a reading potential (potential of a selected word line WL) to Vcgr 10 (e.g., 0 V), and recognizes that data of the memory cell are "11", or other data "10", "01", "00".

[2]-2-1 Data Reading (Period T2)

First, a control signal BLPRE becomes "H", and the N channel MOS transistor Qn6 (FIG. 11) is turned ON. A control signal BLCLAMP becomes Vclamp (e.g., 2 V), and a control signal BLS becomes Vsghh (e.g., 4.5 V), whereby the bit line BLq is precharged to a predetermined potential (e.g., about 1 V).

At this time, a control signal BIAS is "L". The input node of the data latch section (sense latch) DS3 is simultaneously precharged.

In the READ 10, since a control signal t3 becomes "H", the MOS transistor Q3 is turned ON.

At this time, if a value of the upper bit HB read by the READ 01 is "1", i.e., data latched by the data latch section DS4 is "1" (node N3="L", node N6="H"), the MOS transistor Q5 is turned ON, and thus the node N4 (N5) of the data latch section DS3 side of the data latch section DS5 is also precharged.

Here, the data latch section DS5 is in an nonoperated state because control signals LAT1, LAT1' are set to "L". Thus, a precharging potential is not latched by the data latch section DS5.

On the other hand, if the value of the upper bit HB read by the READ 01 is "0", i.e., the data latched by the data latch section DS4 is "0" (node N3="H", node N6="L"), the MOS transistor Q5 is turned OFF, and thus the node N4 N5) of the data latch section DS5 is cut off from the data latch section DS3 (node N2) and not precharged.

After the end of the precharging period, the control signal t3 becomes "L" to cut off the data latch section DS3 and the data latch section DS5 from each other.

Subsequently, the control signal BLCLAMP becomes Vss (e.g., 0 V) and the control signal BLPRE becomes "L" to set the bit line BLq in a floating state. Additionally, a transfer potential Vread (e.g., 4.5 V) is applied to the select gate line and the unselected bit line of the bit line side, and a reading potential Vcgr 10 is applied to the selected word line WL.

Then, when a potential of the select gate line of the source line side is set to a transfer potential Vread, an influence appears in the potential of the bit line BLq in accordance with the state of the selected memory cell, i.e., a value of data stored in the memory cell.

That is, if the data of the memory cell is "11", the selected memory cell is turned ON by a reading potential Vcgr 01. Accordingly, charge of the bit line BLq is discharged to reduce the potential of the bit line BLq to 0.8 V or lower.

On the other hand, if the data of the memory cell are "10", "01", "00", the selected memory cell is not turned ON by the reading potential Vcgr 01. Thus, no charge of the bit line BLq is discharged, whereby the bit line BLq maintains a precharging potential (about 1 V).

Subsequently, a control signal SEN is set to "H" and, a little later, a control signal SEN' is set to "H", whereby the aforementioned potential change of the bit line BLq is latched by the data latch section (sense latch) DS3. As a method for latching the potential change of the bit line BLq at the data latch section DS3, for example, the method described above in the "READ 01" operation is used.

That is, if the data of the memory cell is "11" (lower bit LB is "1"), the node N2 becomes "L", and this data is stored in the data latch section (sense latch) DS3. If the data of the memory cell are "10", "00" (lower bit LB is "0") and the data of the memory cell is "01" (lower bit LB is "1"), the node N2 becomes "H", and this data is stored in the data latch section (sense latch) DS3.

Subsequently, when the control signal t3 becomes "H" and the control signal LAT2 becomes "H", the data of the data latch section DS3 is transferred to the data latch section (LBL) DS5 if a value of the upper bit HB is "1" (node N3="L", node N6="H").

That is, as shown in (3) of FIG. 22, the value "1" of the upper bit HB means that the data of the memory cell are "11", "10". If the data of the memory cell is "11" (lower bit LB is "1"), since the node N2 is "L", the node N4 (N5) becomes "L". If the data of the memory cell is "10" (lower bit LB is "0"), since the node N2 is "H", the node N4 (N5) becomes "H".

Then, when the control signal LAT2' becomes "H" a little after the control signal LAT2 has become "H", the read data (lower bit LB) is latched by the data latch section DS5.

Even when the control signal t3 becomes "H" and the control signal LAT2 becomes "H", if the value of the upper bit HB is "0" ("01", "00") (node N3="H", node N6="L"), the data of the data latch section DS3 is not transferred to the data latch section (LBL) DS5. It is because the MOS transistor Q5 is OFF.

[2]-3 "READ 00"

Continuously after the end of the "READ 10" operation, a "READ 00" operation is carried out. The "READ 00" operation sets, as shown in FIG. 20 and (2) of FIG. 22, a reading potential (potential of a selected word line WL) to Vcgr 00 (e.g., 2 V), and recognizes that data of the memory cell are "11", "10", "01", or other data "00".

[2]-3-1 Data Reading (Period T3)

First, a control signal BLPRE becomes "H", and the N channel MOS transistor Qn6 (FIG. 11) is turned ON. A control signal BLCLAMP becomes Vclamp (e.g., 2 V), and a control signal BLS becomes Vsghh (e.g., 4.5 V), whereby the bit line BLq is precharged to a predetermined potential (e.g., about 1 V).

At this time, a control signal BIAS is "L". The input node of the data latch section (sense latch) DS3 is simultaneously precharged.

In the READ 00, since a control signal t2 becomes "H", the MOS transistor Q2 is turned ON.

At this time, if a value of the upper bit HB read by the READ 01 is "0", i.e., data latched by the data latch section DS4 is "0" (node N3="H", node N6="L"), the MOS transistor Q4 is turned ON, and thus the node N4 (N5) of the data latch section DS3 side of the data latch section DS5 is also precharged.

Here, the data latch section DS5 is in an nonoperated state because control signals LAT1, LAT1' are set to "L". Thus, a precharging potential is not latched by the data latch section DS5.

On the other hand, if the value of the upper bit HB read by the READ 01 is "1", i.e., the data latched by the data latch section DS4 is "1" (node N3="L", node N6="H"), the MOS transistor Q4 is turned OFF, and thus the node N4 N5) of the data latch section DS5 is cut off from the data latch section DS3 (node N2) and not precharged.

After the end of the precharging period, the control signal t2 becomes "L" to cut off the data latch section DS3 and the data latch section DS5 from each other.

Subsequently, the control signal BLCLAMP becomes Vss (e.g., 0 V) and the control signal BLPRE becomes "L" to set the bit line BLq in a floating state. Additionally, a transfer potential Vread (e.g., 4.5 V) is applied to the select gate line and the unselected bit line of the bit line side, and a reading potential Vcgr 00 is applied to the selected word line WL.

Then, when a potential of the select gate line of the source line side is set to a transfer potential Vread, an influence appears in the potential of the bit line BLq in accordance with the state of the selected memory cell, i.e., a value of data stored in the memory cell.

That is, if the data of the memory cell are "11", "10", "01", the selected memory cell is turned ON by a reading potential Vcgr 00. Accordingly, charge of the bit line BLq is discharged to reduce the potential of the bit line BLq to 0.8 V or lower.

On the other hand, if the data of the memory cell is "00", the selected memory cell is not turned ON by the reading potential Vcgr 00. Thus, no charge of the bit line BLq is discharged, whereby the bit line BLq maintains a precharging potential (about 1 V).

Subsequently, a control signal SEN is set to "H" and, a little later, a control signal SEN' is set to "H", whereby the aforementioned potential change of the bit line BLq is latched by the data latch section (sense latch) DS3. As a method for latching the potential change of the bit line BLq at the data latch section DS3, for example, the method described above in the "READ 01" operation is used.

That is, if the data of the memory cell is "11", "01" (lower bit LB is "1") and the data of the memory cell is "10" (lower bit LB is "0"), the node N2 becomes "L", and this data is stored in the data latch section (sense latch) DS3. If the data of the memory cell is "00" (lower bit LB is "0"), the node N2 becomes "H", and this data is stored in the data latch section (sense latch) DS3.

Subsequently, when the control signal t2 becomes "H" and the control signal LAT2 becomes "H", the data of the data latch section DS3 is transferred to the data latch section (LBL) DS5 if a value of the upper bit HB is "0" (node N3="H", node N6="L").

That is, as shown in (2) of FIG. 22, the value "0" of the lower bit LB means that the data of the memory cell are "01", "00". If the data of the memory cell is "01" (lower bit LB is "1"), since the node N2 is "L", the node N4 (N5) becomes "L". If the data of the memory cell is "00" (lower bit LB is "0"), since the node N2 is "H", the node N4 (N5) becomes "H".

Then, when the control signal LAT2' becomes "H" a little after the control signal LAT2 has become "H", the read data (lower bit LB) is latched by the data latch section DS5.

Even when the control signal t2 becomes "H" and the control signal LAT2 becomes "H", if the value of the upper bit HB is "1" ("11", "10") (node N3="L", node N6="H"), the data of the data latch section DS3 is not transferred to the data latch section (LBL) DS5. It is because the MOS transistor Q4 is OFF.

[2]-4 Serial Accessing

When the "READ 10" and "READ 00" operations are finished, and the read data (lower bit LB) of one page is latched by the data latch section DS5, thereafter (after a point B in FIG. 20), outputting of the lower bit LB by serial accessing, i.e., transfer to the read data line RD, can be carried out.

The serial accessing is carried out by sequentially setting values of the control signal SSLq (q=0, 1, 2, . . . ) of FIG. 11 to "H".

To read the upper bit HB and the lower bit HB repeatedly by a plurality of times, for example, during the serial accessing for the lower bit (logic lower page data) LB, the aforementioned reading operation ("READ 01") of the upper bit (logic upper page data) HB is carried out.

[2]-5 Summary

FIG. 22 briefly shows a flow of the read data in the reading operation of the lower bit (logic lower page data) LB.

In the reading operation of the lower bit LB, first, a reading operation, i.e., "READ 01", is carried out for the upper bit HB, and this data is stored in the data latch section (higher bit latch) DS4 ((1)). Then, two reading operations "READ 10", "READ 00" dependent on a value of the upper bit HB are carried out, and this read data is stored in the data latch section (lower bit latch) DS5.

As described above, the reading operation of the lower bit LB in the 4-level flash memory can be carried out by a small number of signals and by a simple operation method. As a result, the 1st access time in the 4-level flash memory is shortened to realize high-speed reading/writing in the 4-level flash memory.

(3) Program Operation

Next, a program operation will be described.

The program operation is constituted of a program operation for the upper bit HB and a program operation for the lower bit LB. The program operation for the upper bit HB is first carried out, and then the program operation for the lower bit LB is carried out by considering a value of the upper bit HB.

(1) Program for Upper Bit HB

[1] Algorithm

Figure 23:
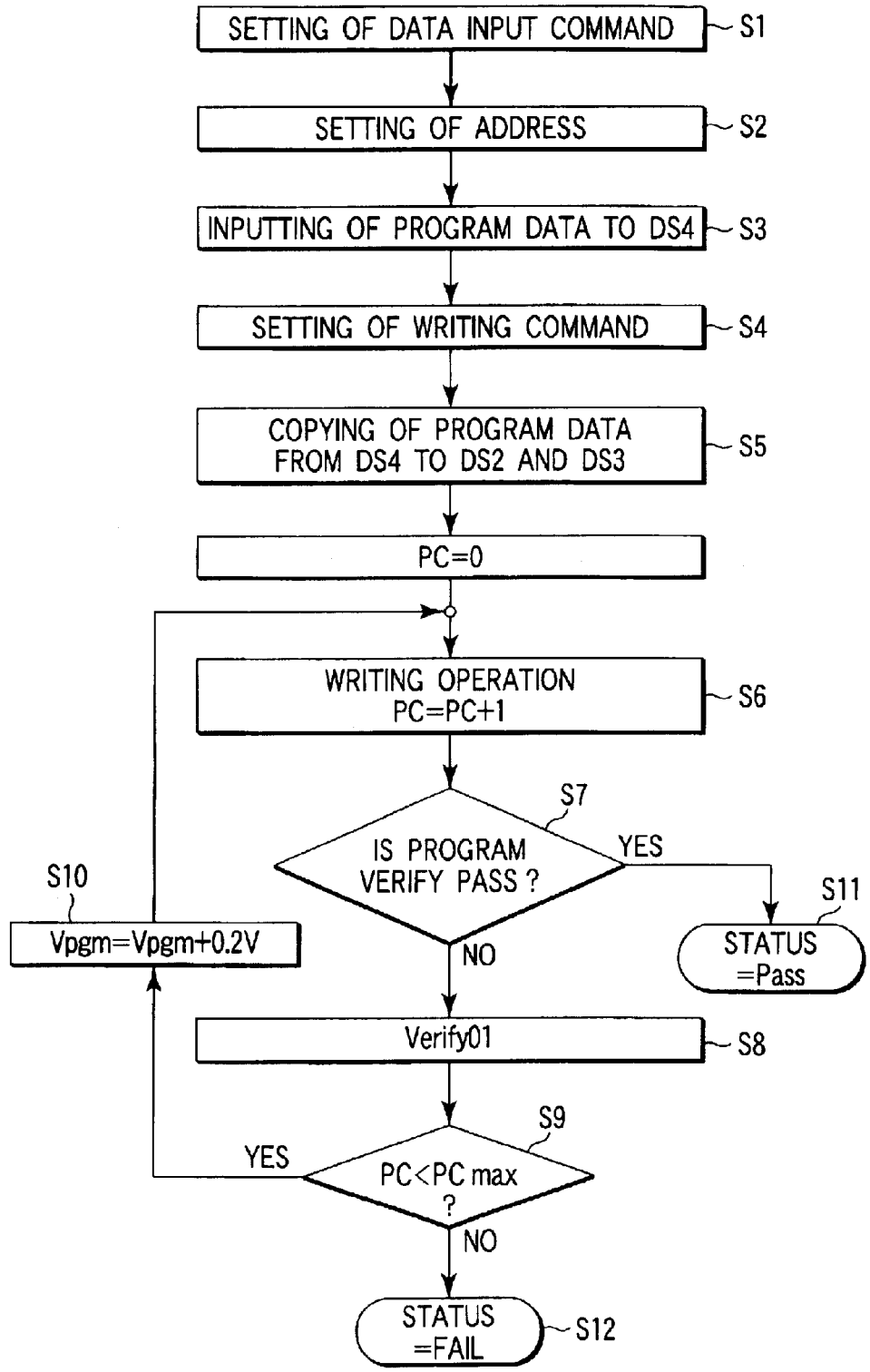
FIG. 23 is a view showing an algorithm of a programming operation of logic upper page data.
Figure 24:
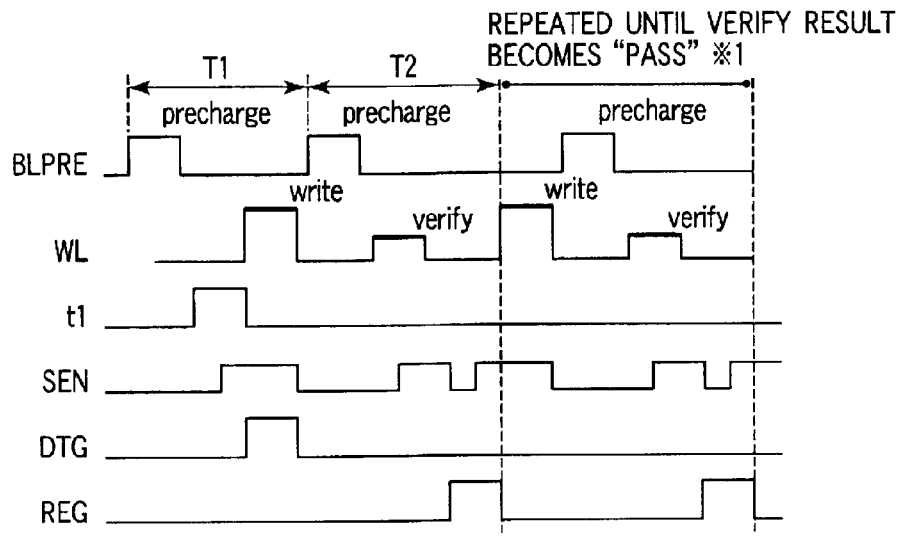
FIG. 24 is a view showing an example of an operating waveform of a programming operation of logic upper page data.

FIG. 23 shows an example of an algorithm of the program operation for the upper bit HB.

First, the command interface circuit receives a data input command from the host microcomputer. Then, the data input command is set in the state machine (control circuit) (step S1).

When an address signal is supplied from the host microcomputer into the memory chip, an address for selecting a page targeted by a program is set in the state machine (step S2).

Then, program data of one page for the upper bit are inputted through a data input/output buffer to the memory chip. The program data of one page are stored in the data latch section (higher bit latch) DS4 by serial accessing (step S3).

Then, after the command interface circuit checks a writing command supplied from the host microcomputer, the writing command is set in the state machine (step S4).

Figure 33:
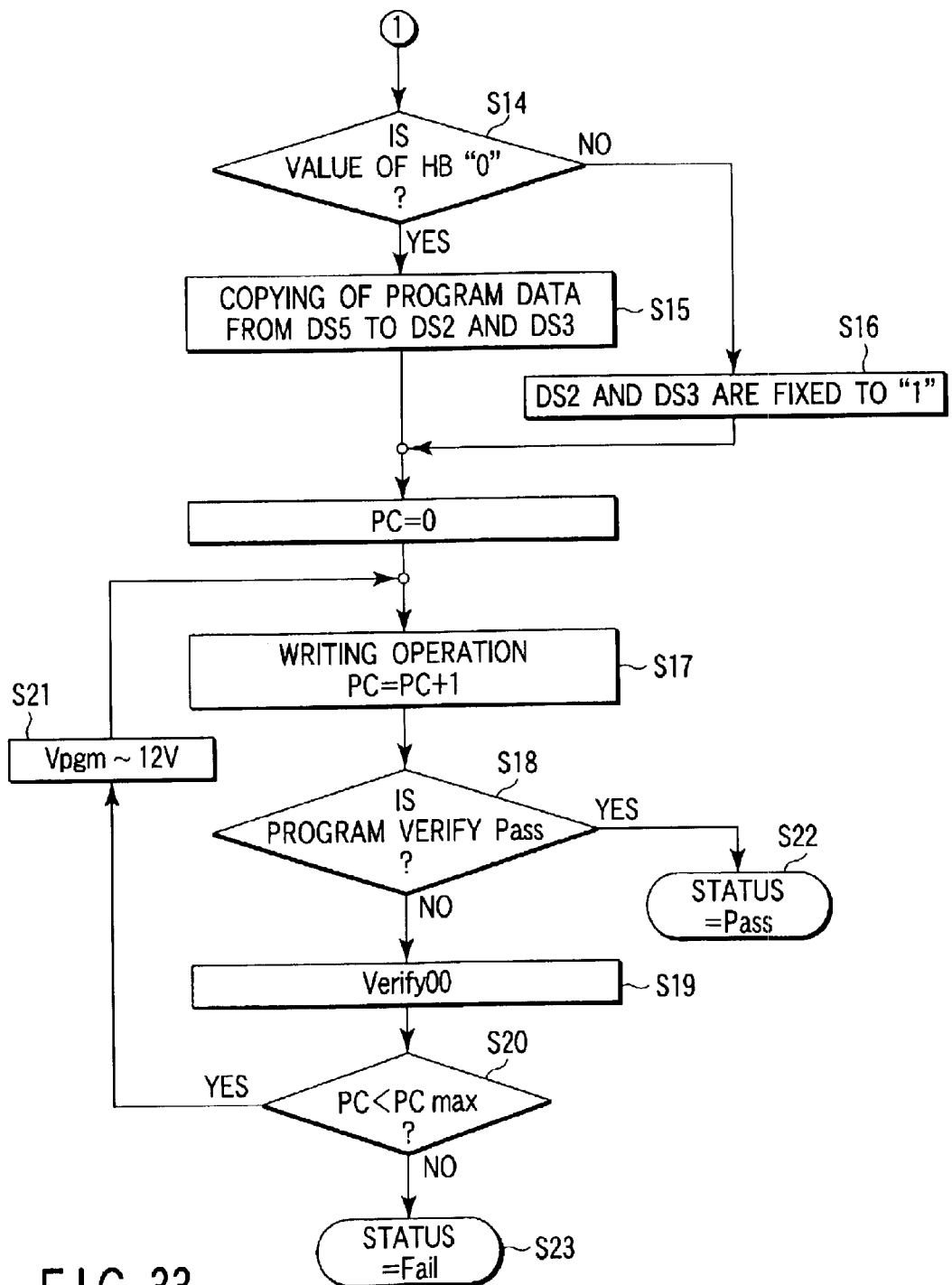
FIG. 33 is a view showing an algorithm of a programming operation of logic lower page data.

As a result, under control by the state machine, operations from step S5 to step S12 shown in FIG. 23, and operations from step S14 to step S23 shown in FIG. 33 are automatically carried out.

First, the program data stored in the data latch section DS4 is copied in the data latch sections DS2, DS3 (step S5). That is, if the program data is "1", the nodes N1, N8 become "H". If the program data is "0", the nodes N2, N8 become "L".

Then, a writing voltage Vpgm is set to, for example, about 12 V, and a value PC of a program counter in the state machine is set to 0. The value PC of the program counter indicates the number of times of carrying out the writing operation.

Then, the writing operation is carried out (step S6).

If the program data stored in the data latch section DS3 is "0", for example, a high voltage is applied between a substrate and the floating gate electrode, and electrons are injected into the floating gate electrode to increase a threshold voltage of the memory cell ("0"-programming). If the program data stored in the data latch section DS3 is "1", for example, application of a high voltage between the substrate and the floating gate electrode is prevented, and the threshold voltage of the memory cell is not changed ("1"-programming).

Subsequently, based on the data stored in the data latch section DS3, determination is made as to whether program verification is a Pass state (completed state of the program) or an NG state (incomplete state of the program) (step S7).

In this case, immediately after the first writing operation, since "Verify 01" is not carried out at all, the data latch section DS3 stores the program data itself.

If the data latch sections D33 in all the columns store "1", i.e., the program data for the upper bit HB are all "1", in all the columns, the N channel MOS transistor Qn17 of FIG. 11 is OFF, and the PCD of FIG. 11 maintains "H".

Accordingly, the Pass state of program verification (completed state of the program) is determined (step S11).

On the other hand, if the data latch section DS3 in at least one column stores "0", i.e., at least one program data for the upper bit HB is "0", the N channel MOS transistor Qn17 (FIG. 11) connected to the data latch section DS3 which stores "0" is ON, and for example, a level of the PCD of FIG. 11 becomes "L".

Accordingly, the NG state of program verification (incomplete state of the program) is determined, and the process proceeds to "Verify 01" (step S8).

The "Verify 01" is an operation where a reading operation is carried out for a selected memory cell to be programmed by using a reading potential Vcgv 01 (see FIG. 13) and, based on read data obtained by this reading operation and data (program data) of the data latch section DS2, a value of data to be newly stored in the data latch section DS3 is decided.

In the case of the program for the upper bit HB, initially, all the selected memory cells to be programmed are in "11" states. Thus, for the memory cell targeted for "1"-programming (memory cell corresponding to the data latch section DS3 which stores "1"-data), since there is no fluctuation in a threshold voltage, read data read by the "Verify 01" is always "0".

Thus, "0" is stored in the data latch section DS1. However, as described later, if "1" is stored in the data latch section DS2, the data of the data latch section DS1 is forcibly changed to "1" irrespective of the read data. This "1" data is stored again from the data latch section DS1 in the data latch section DS3.

On the other hand, for the memory cell which is a target of "0"-programming (memory cell corresponding to the data latch section DS3 which stores "0"-data), if a threshold voltage is sufficiently increased by the writing operation (step S6) (program is completed), the read data read by the "Verify 01" becomes "1".

Accordingly, "1" is stored in the data latch section DS1. This "1" data is transferred from the data latch section DS1 to the data latch section DS3. That is, the data of the data latch section DS3 is changed from "0" to "1".

After the data of the data latch section DS3 has become "1", even for the memory cell which is a target of "0"-programming, a threshold value is not increased by the writing operation. As a result, only the memory cell of insufficient "0"-programming becomes a target of "0"-programming to realize a sharp threshold value distribution.

For the memory cell which is a target of "0"-programming (memory cell corresponding to the data latch section DS3 which stores "0"-data), if a threshold voltage is not sufficiently increased by the writing operation (step S6) (program is not completed), the read data read by the "Verify 01" becomes "0".

Accordingly, "0" is stored in the data latch section DS1. This "0" data is transferred from the data latch section DS1 to the data latch section DS3. That is, the data of the data latch section DS3 maintains "0".

As long as the data of the data latch section DS3 maintains "0", in principle, the "0"-programming by the writing operation is continued.

Subsequently, if a value PC of the program counter reaches a preset maximum writing number of times PCmax, a program failure (Fail) is set in a status register in the state machine to finish the program operation (steps S9, S12).

If a value PC of the program counter is smaller than the preset maximum writing number of times PCmax, a writing voltage Vpgm is applied again, and then the writing operation is carried out again (steps S9, S10, S6).

Then, program verification is carried out (step S7). In the case of "1"-programming, as described above, the data of the data latch section DS3 is always "1". In the case of "0"-programming, if "0"-programming is completed, the data of the data latch section DS3 is changed from "0" to "1". Only in the case of incomplete "0"-programming, the data of the data latch section DS3 maintains "0".

Thus, if programming ("1"-programming or "0"-programming) is completed for all the selected memory cells to be programmed, all the data latch sections DS3 store "1"-data. That is, in all the columns, the N channel MOS transistor Qn17 of FIG. 11 is turned OFF to set the PCD of FIG. 11 to "H" (program verification becomes a Pass state) (step S11).

If programming is not completed ("0"-programming) for at least one of the selected memory cells to be programmed, at least one data latch section DS3 stores "0"-data. That is, in at least one column, the N channel MOS transistor Qn17 of FIG. 11 is turned ON to set the PCD of FIG. 11 to "L" (program verification becomes an NG state), whereby the verification reading and writing operations are repeated again (steps S6 to S10).

In the aforementioned manner, based on the data stored in the data latch section DS3, determination is made as to completion of programming.

[2] Operation Explanation Based on Operating Waveform

Hereinafter, specific operation explanation will be made by using an operation timing chart.

[2]-1 Serial Accessing Operation

First, program data of one page for the upper bit are serially inputted through the data input/output buffer to the memory chip. The program data of one page are stored in the data latch section (higher bit latch) DS4 by serial accessing.

The serial accessing operation is finished before later-describe precharging of the input node of the data latch section (sense latch) DS3 is completed.

In the example, before it is inputted to the data latch section DS4, data on the write data line bWD has a value which is reverse to a value of the program data. However, a value of data outputted from the data latch section DS4 is equal to the value of the program data.

[2]-2 Copying Operation from DS4 to DS2, DS3: First Half of Period T1

Figure 25:
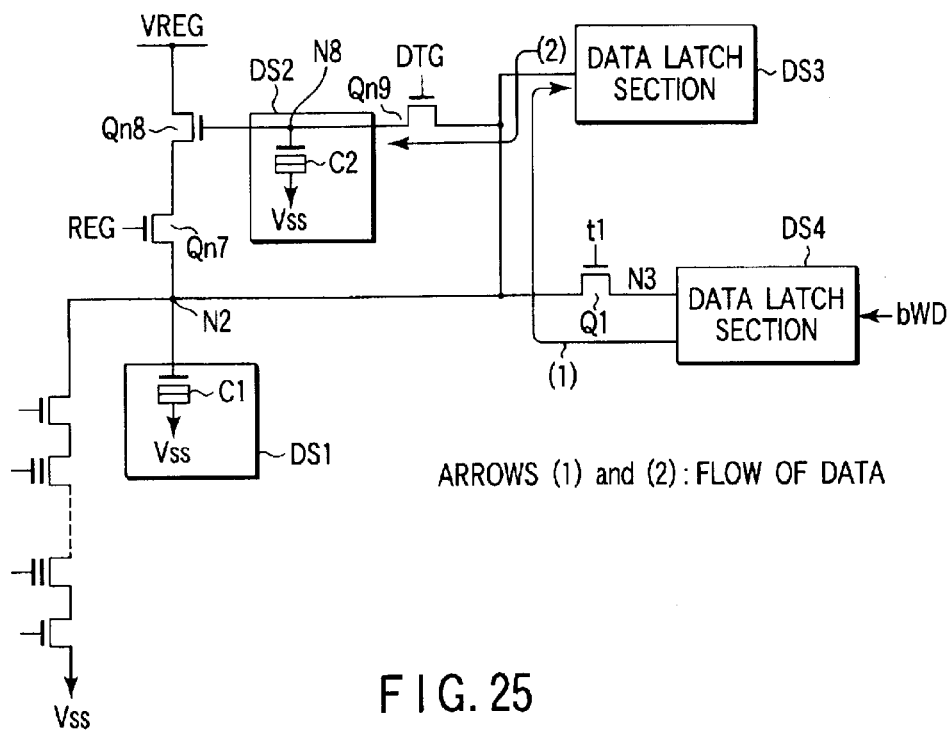
FIG. 25 is a view showing a data flow in data copying.

FIG. 25 shows a flow of data in a copying operation of program data from the data latch section DS4 to the data latch sections DS2, DS3.

This copying operation is equivalent to step S5 of FIG. 23.

First, the control signal BLPRE becomes "H", and the N channel MOS transistor Qn6 (FIG. 11) is turned ON to precharge the input node of the data latch section (sense latch) DS3. This precharging means a preparatory operation for transferring the program data stored in the data latch section DS4 to the data latch sections DS2, DS3.

After the end of the precharging, the control signal t1 is set to "H". At this time, the N channel MOS transistor Q1 is turned ON to electrically connect the data latch sections DS3 and the data latch section DS4.

Then, if the data latch section DS4 (node N3) stores "1" (="H") as the program data, the input node of the data latch section DS3 maintains "H". If the data latch section DS4 (node N3) stores "0" (="L") as the program data, the input node of the data latch section DS3 is changed from "H" to "L" ((1)).

Subsequently, the control signal SEN is set to "H", and the control signal SEN' is set to "H" a little later, whereby the program data of the data latch section DS4 is stored in the data latch section (sense latch) DS3. Also, by setting a control signal DTG to "H", the program data of the data latch section DS4 is stored in the data latch section DS2 ((2)).

At this time, the same data, i.e., the program data for the upper bit HB, is stored in the data latch sections DS2, DS3. Then, the control signal t1 becomes "L", and the control signal DTG becomes "L", whereby the data latch sections DS2, DS3 are electrically cut off from each other.

Incidentally, the copying operation from the DS4 to the DS2, DS3 is simultaneously carried out in data circuits of all the columns.

[2]-3 Writing Operation (Write): Latter Half of Period T1

Figure 26:
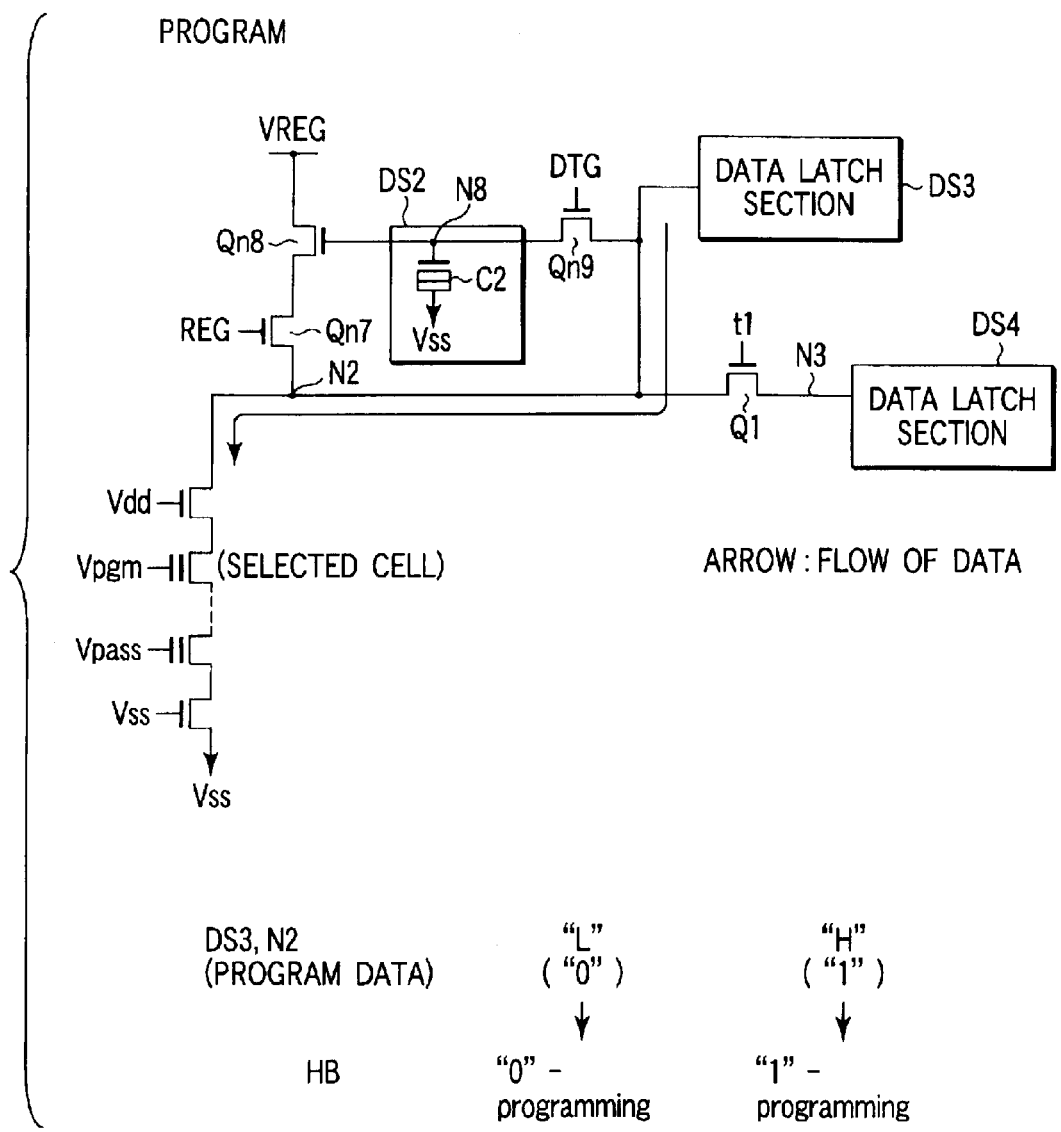
FIG. 26 is a view showing a data flow in programming.

FIG. 26 shows a flow of data in the writing operation. The writing operation is equivalent to step S6 of FIG. 23.

First, the control signal BLCLAMP is set to about 4.5 V. When the control signal BLS becomes 4.5 V, the bit line BLq and the data latch section DS3 are electrically connected.

If data of the data latch section DS3 (node N2) is "1", the bit line BLq is charged to Vdd. If the data of the data latch section DS3 (node N2) is "0", the bit line BLq is charged to Vss (0 V).

Subsequently, Vpass, e.g., 10 V, is applied to the unselected word line, while Vpgm (e.g., about 12 V) is applied to the selected word line. As a result, programming is carried out for the memory cell.

For example, if the data stored in the data latch section DS3 "1", the bit line BLq is Vdd, and the channel of the memory cell is Vdd-Vth (threshold voltage of the select gate transistor) and set in a floating state. As a result, a potential difference between the selected word line (control gate electrode) and the channel of the memory cell does not become a value sufficient for injecting electrons to the floating gate electrode of the memory cell.

On the other hand, if the data stored in the data latch section DS3 is "0", the bit line BLq is 0 V, and the channel of the memory cell also becomes 0 V. As a result, a potential difference between the selected word line (control gate electrode) and the channel of the memory cell becomes a value sufficient for injecting electrons to the floating gate electrode of the memory cell.

Thus, if the data stored in the data latch section DS3 is "1", a threshold voltage of the memory cell is not increased. If the data stored in the data latch section DS3 is "0", the threshold voltage of the memory cell is increased.

After the end of the writing operation, the control signals SEN, SEN' are set to "L", and thus the state of the data latch section DS3 is reset.

[2]-4 Verification Operation (Verify 01): Period T2

Figure 27:
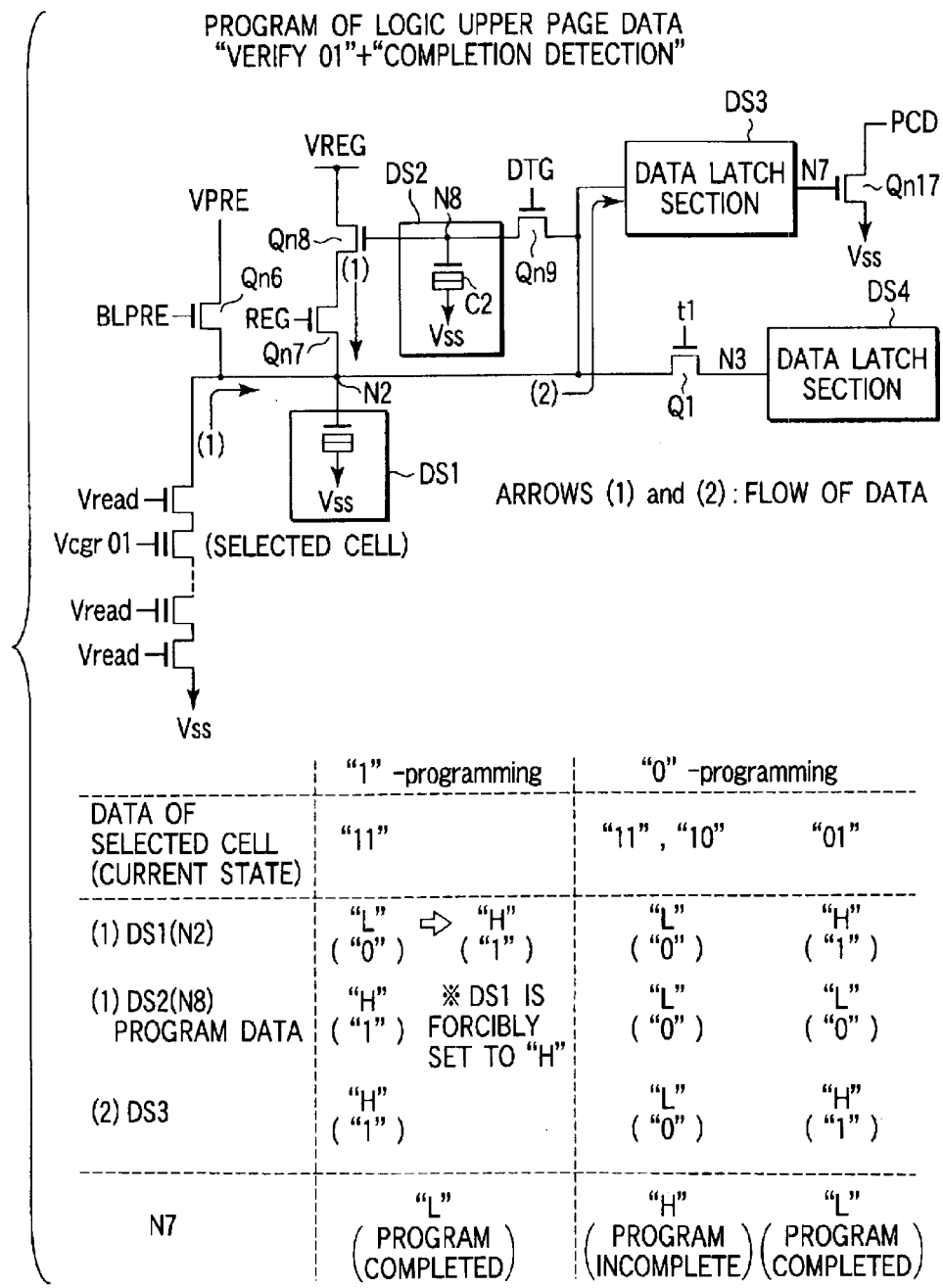
FIG. 27 is a view showing a data flow in verification.

FIG. 27 shows a flow of data in verification reading.

The verification operation is constituted of verification reading and completion detection. The completion detection means an operation for detecting whether data programs have been completed for all selected memory cells or not based on data read by the verification reading.

The verification reading is equivalent to step S8 of FIG. 23, and the completion detection is equivalent to step S7 of FIG. 23.

The verification reading is carried out after the writing operation to read, from the memory cell, data for determining whether a threshold voltage of the memory cell has reached a predetermined level or not.

First, a control signal BLPRE becomes "H", and the N channel MOS transistor Qn6 (FIG. 11) is turned ON. A control signal BLCLAMP becomes Vclamp (e.g., 2 V), and a control signal BLS becomes Vsghh (e.g., 4.5 V), whereby the bit line BLq is electrically connected to VPRE (=Vdd).

As a result, the bit line BLq is precharged to a predetermined potential regulated by a threshold voltage of the N channel MOS transistor Qn5, e.g., about 1 V.

Subsequently, the control signal BLCLAMP becomes Vss (e.g., 0 V) and the control signal BLPRE becomes "L" to set the bit line BLq in a floating state.

Incidentally, at this time, the input node of the data latch section DS3, i.e., the node N2, is precharged to VPRE (=Vdd).

A transfer potential Vread (e.g., 4.5 V) is applied to the select gate line and the unselected bit line of the bit line side, and a verification reading potential Vcgv 01 is applied to the selected word line WL (see FIG. 13). When a potential of the select gate line of the source line side is set to a transfer potential Vread, an influence appears in the potential of the bit line BLq in accordance with the state of the selected memory cell, i.e., a current threshold voltage of the memory cell.

That is, if a threshold voltage of the selected memory cell is lower than a potential (verification reading potential) Vcgv 01 of the selected word,line, the selected memory cell is turned ON by this verification reading potential Vcgv 01. Accordingly, charge of the bit line BLq is discharged to reduce the potential of the bit line BLq to 0.8 V or lower (unselected memory cell in the selected block is ON by Vread).

On the other hand, if the threshold voltage of the selected memory cell is higher than the verification reading potential Vcgv 01, the selected memory cell is not turned ON by the verification reading potential Vcgv 01. Thus, no charge of the bit line BLq is discharged, whereby the bit line BLq maintains a precharging potential (about 1 V).

By setting the control signal BLPRE to about 4.5 V and the control signal VPRE to Vdd (e.g., 3 V), one end of the capacitor C1 of the data latch section DS1, i.e., the node N2, is charged to Vdd. Subsequently, when the control signal BLCLAMP is set to Vsense (e.g., 1.8 V), a potential of one end of the capacitor C1 of the data latch section DS1 is changed as follows.

That is, if the potential of the bit line BLq is still at the precharging potential (about 1 V) (threshold voltage of the memory cell is higher than Vcgv 01), the N channel MOS transistor (clamp transistor) Qn5 (FIG. 11) is OFF, and the potential of one end of the capacitor C1 of the data latch section DS1 is maintained at Vdd ("H").

On the other hand, if the potential of the bit line BLq is 0.8 V or lower (threshold voltage of the memory cell is lower than Vcgv 01), the N channel MOS transistor (clamp transistor) Qn5 (FIG. 11) is ON to discharge charge of one end of the capacitor C1 of the data latch section DS1 to the bit line BLq, and its potential is reduced to a value ("L") lower than Vdd.

As a result, in the data latch section DS1 (one end of the capacitor C1), read data is stored by the verification reading potential Vcgv 01. That is, if the threshold voltage of the memory cell is lower than Vcgv 01 ("1"-programming or "0"-programming is incomplete), "L", i.e., "0", is stored in the data latch section DS1. If the threshold voltage of the memory cell is higher than Vcgv 01 ("0"-programming is completed), "H", i.e., "1", is stored in the data latch section DS1.

Then, the control signal SEN is set to "H", and the control signal SEN' is set to "H" a little later, whereby the data of the data latch section DS1 is stored in the data latch section (sense latch) DS3.

In this case, the state of the data latch section DS3 is reset by setting the control signals SEN, SEN' to "L" after the end of the aforementioned writing operation. Thus, after the verification reading, data is stored again in the data latch section DS3 in accordance with a result of the verification reading.

Subsequently, a control signal VREG becomes "H". Additionally, when a control signal REG becomes, e.g., 4.5 V, the N channel MOS transistor Qn7 is turned ON. Thus, the potential of one end (node N2) of the capacitor C1 of the data latch section DS1 is influenced by the data stored in the data latch section DS2.

For example, if the data (program data) stored in the data latch section DS2 is "1", the N channel MOS transistor Qn8 is turned ON to transfer VREG (=Vdd) to one end (node N2) of the capacitor C1 of the data latch section DS1.

In this case, irrespective of a value of the data read in the aforementioned verification reading, the potential of one end (node N2) of the capacitor C1 of the data latch section DS1 is forcibly set to "H", i.e., "1". Thus, the data (node N2) stored in the data latch section DS3 is also forcibly set to "1".

If the data (program data) stored in the data latch section DS2 is "0", the N channel MOS transistor Qn8 is OFF. Thus, VREG (=Vdd) is not transferred to one end (node N2) of the capacitor C1 of the data latch section DS1. That is, a potential of one end of the capacitor C1 of the data latch section DS1 is not changed.

That is, the data (node N2) stored in the data latch section DS3 becomes data consistent with the result of the verification reading.

Then, completion detection is carried out based on the data stored in the data latch section DS3. That is, if the data (of one page) stored in the data latch section DS3 are all "1" ("1"-programming or "0"-programming is completed), in all the columns, the node N7 is "L", and the MOS transistor Qn17 is OFF.

Accordingly, the PCD of FIG. 11 maintains "H", and a status becomes Pass. Thus, the program operation is finished.

If at least one of the data (of one page) stored in the data latch section DS3 is "0" ("0"-programming incomplete), at least in one column, the node N7 is "H", and the MOS transistor Qn17 is ON.

Therefore, since the PCD of FIG. 11 becomes "L", the writing operation and the verification operation are repeated until the status of the verification result becomes Pass. However, when the number of times of carrying out the writing operation exceeds a predetermined number of times PCmax, the program operation is finished considering that the status is NG.

Here, in the case of repeating the writing operation and the verification operation, the "0"-programming operation is carried out only for a memory cell of incomplete "0"-programming. That is, no "0"-programming is carried out for a memory cell of completed "0"-programming thereafter.

In the case of repeating the writing operation (period T1) and the verification operation (period T2), in the second writing operation and thereafter, the precharging operation immediately before the writing operation (equivalent to the first half of the period T1) is not carried out.

A reason is as follows. In the first writing operation, the node N2 must be precharged in order to transfer the program data from the DS4 to DS2, DS3. However, in the second writing operation and thereafter, in the verification operation carried out immediately before, the node N2 is precharged to transfer the read data by verification reading to the data latch section DS3.

Then, a writing operation thereafter is carried out based on the data stored in the data latch circuit DS3. Accordingly, for the second writing operation and thereafter, it is not necessary to carry out a precharging operation immediately before the writing operation.

(2) Program for Lower Bit LB

The program for the lower bit LB is carried out after the end of the program for the upper bit HB, and it is constituted of two program operations corresponding to a value of the upper bit HB.

That is, the first program operation is for a memory cell of an upper bit HB "1", and the second program operation is for a memory cell of an upper bit HB "0". Needless to say, however, this order may be changed.

[1] Algorithm of Program Operation of Lower Bit LB for Memory Cell of Upper Bit HB "1"

Figure 28:
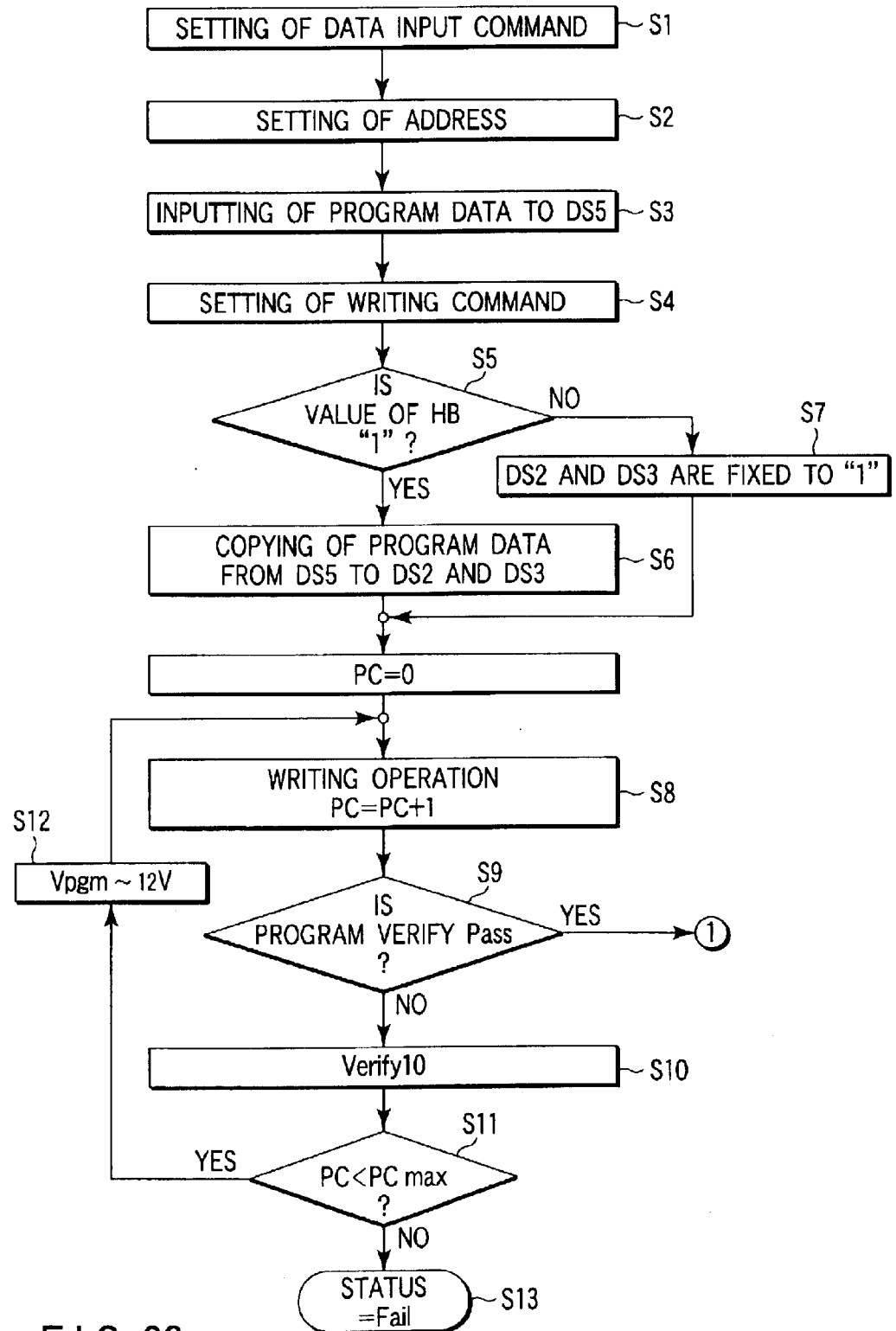
FIG. 28 is a view showing an algorithm of a programming operation of logic lower page data.
Figure 29:
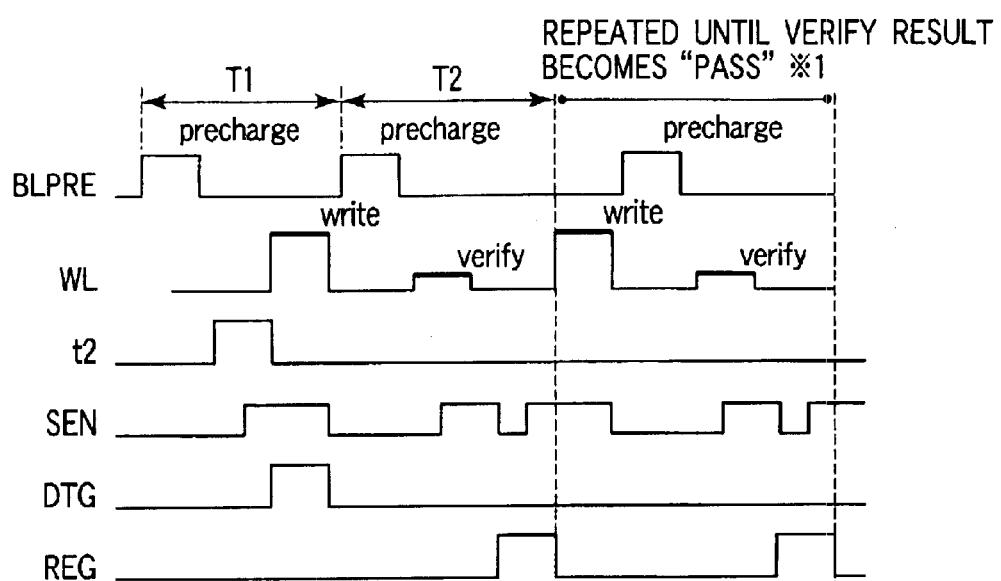
FIG. 29 is a view showing an example of an operating waveform of a programming operation of logic lower page data.

FIG. 28 shows an example of an algorithm of a program operation of a lower bit LB for a memory cell of an upper bit HB "1".

For two writing operations, steps S1 to S4 are common, and carried out once.

First, the command interface circuit receives a data input command from the host microcomputer. Then, the data input command is set in the state machine (control circuit) (step S1).

When an address signal is supplied from the host microcomputer into the memory chip, an address for selecting a page to be programmed is set in the state machine (step 52).

Then, program data of one page for the lower bit are inputted through the data input/output buffer to the memory chip. The program data of one page are stored in the data latch section (lower bit latch) DS5 by serial accessing (step S3).

Then, the command interface circuit checks a writing command supplied from the host microcomputer, and the writing command is set in the state machine (step S4).

As a result, under control of the state machine, operations from step S5 to step S13 of FIG. 28 (program operation of the lower bit LB for the memory cell of the upper bit HB "1") and operations of step S14 to step S23 of FIG. 33 (program operation of the lower bit LB for the memory cell of the upper bit HB "0") are automatically carried out.

First, checking is made on whether a value of an upper bit HB of a selected memory cell is "1" or not. If it is "1", the program data stored in the data latch section DS5 is copied to the data latch sections DS2, DS3 (steps S5 to S6).

That is, if the value of the upper bit HB of the selected memory cell is "1", specifically, in the program operation already carried out for the upper bit HB, when the program data for the upper bit HB is "1", the nodes N2, N8 are set to "H" when the program data for the lower bit LB is "1". The nodes N2, N8 are set to "L" when the program data for the lower bit LB is "0".

If the value of the upper bit HB of the selected memory cell is "0", i.e., in the program operation already carried out for the upper bit HB, when the program data for the upper bit HB is "0", values of the data latch sections DS2, DS3 are set to "1" irrespective of a value of the program data stored in the data latch section DS5 (step S7).

Subsequently, a writing voltage Vpgm is set to, e.g., about 12 V, and a value PC of the program counter in the state machine is set to 0. The value PC of the program counter indicates the number of times of carrying out a writing operation.

Then, a writing operation is carried out (step S8).

If the program data stored in the data latch section DS3 is "0", for example, a high voltage is applied between the substrate and the floating gate electrode, and electrons are injected into the floating gate electrode to increase a threshold voltage of the memory cell ("0"-programming). If the program data stored in the data latch section DS3 is "1", for example, application of a high voltage between the substrate and the floating gate electrode is prevented, injection of electrons into the floating gate electrode is prevented, and the threshold voltage of the memory cell is not changed ("1"-programming).

After the writing operation, "1" is added to the value PC of the program counter (step S8). Subsequently, based on the data stored in the data latch section DS3, determination is made as to whether program verification is a Pass state (completed state of the program) or an NG state (incomplete state of the program) (step S9).

In this case, immediately after the first writing operation, since "Verify 10" is not carried out at all, the data latch section DS3 stores the program data itself.

If the data latch sections DS3 in all the columns store "1", i.e., the program data for the lower bit LB are all "1", in all the columns, the N channel MOS transistor Qn17 of FIG. 11 is OFF, and the PCD of FIG. 11 maintains "H".

Accordingly, since the Pass state of program verification (completed state of the program) is determined, the process can proceed to a later-described second writing operation (step S9).

On the other hand, if the data latch section DS3 in at least one column stores "0", i.e., at least one program data for the lower bit HB is "0", the N channel MOS transistor Qn17 (FIG. 11) connected to the data latch section DS3 which stores "0" is OFF, and for example, a level of the PCD of FIG. 11 becomes "L".

Accordingly, the NG state of program verification (incomplete state of the program) is determined, and the process proceeds to "Verify 10" (steps S9 to S10).

The "Verify 10" is an operation where a reading operation is carried out for a selected memory cell to be programmed by using a reading potential Vcgv 10 (see FIG. 13) and, based on read data obtained by this reading operation and data (program data) of the data latch section DS2, a value of data to be newly stored in the data latch section DS3 is decided.

In the case of the program of the lower bit LB for the memory cell of the upper bit HB "1", those among all the selected memory cells to be programmed for the lower bit LB are in "11" states (at a point of time when the program for the upper bit HB is finished, the state of the memory cell is "11" or "01").

Thus, for the memory cell targeted for "1"-programming (memory cell corresponding to the data latch section DS3 which stores "1"-data), since there is no fluctuation in a threshold voltage, the "11" state is maintained, and read data read by the "Verify 10" is always "0".

Thus, "0" is stored in the data latch section DS1. However, as described later, if "1" is stored in the data latch section DS2, the data of the data latch section DS1 is forcibly changed to "1" irrespective of the read data. That is, this "1" data is stored again from the data latch section DS1 in the data latch section DS3.

On the other hand, for the memory cell which is a target of "0"-programming (memory cell corresponding to the data latch section DS3 which stores "0"-data), if a threshold voltage is sufficiently increased by the writing operation (step S8) (program is completed), that is, if the "11" state (threshold level 0) is changed to the "10" state (threshold level 1), the read data read by the "Verify 10" becomes "1".

Accordingly, "1" is stored in the data latch section DS1. This "1" data is transferred from the data latch section DS1 to the data latch section DS3. That is, the data of the data latch section DS3 is changed from "0" to "1".

For the memory cell which is a target of "0"-programming (memory cell corresponding to the data latch section DS3 which stores "0"-data), if a threshold voltage is not sufficiently increased by the writing operation (step S8) (program is not completed), that is, if the "11" state (threshold level 0) is not changed to the "10" state (threshold level 1), the read data read by the "Verify 10" becomes "0".

Accordingly, "0" is stored in the data latch section DS1. This "0"-data is transferred from the data latch section DS1 to the data latch section DS3. That is, the data of the data latch section DS3 maintains "0".

Subsequently, if a value PC of the program counter reaches a preset maximum writing number of times PCmax, a program failure (Fail) is set in the status register in the state machine to finish the program operation (steps S11, S13).

If a value PC of the program counter is smaller than the preset maximum writing number of times PCmax, a writing voltage Vpgm is applied again, and then the writing operation is carried out again (steps S8, S1, S12).

Then, program verification is carried out (step S9). As described above, in the case of "1"-programming (at a point of this time, the memory cells of the upper bit HB "0" are all "1"-programming), the data of the data latch section DS3 is always "1". In the case of "0"-programming, if "0"-programming is completed, the data of the data latch section DS3 is changed from "0" to "1". Only in the case of incomplete "0"-programming, the data of the data latch section DS3 maintains "0".

Thus, if programming ("1"-programming or "0"-programming) is completed for the memory cells of the upper bit HB "1", all the data latch sections DS3 store "1"-data. That is, in all the columns, the N channel MOS transistor Qn17 of FIG. 11 is turned OFF to set the PCD of FIG. 11 to "H" (program verification becomes a Pass state) (step S9).

In this case, a later-described program operation of the lower bit LB is carried out for the memory cell of the upper bit HB "0" (FIG. 33).

If programming is not completed ("0"-programming) for at least one of the selected memory cells of the upper bit HB "1", at least one data latch section DS3 stores "0"-data. That is, in at least one column, the N channel MOS transistor Qn17 of FIG. 11 is turned ON to set the PCD of FIG. 11 to "L" (program verification becomes an NG state), whereby the verification reading and writing operations are repeated again (steps S8 to S12).

Thus, in the first program operation, the program of the lower bit LB is carried out only for the memory cell of the upper bit HB "1". At this time, the program of the lower bit LB is not carried out for the memory cell of the upper bit HB "0".

[2] Operation Explanation Based on Operating Waveform

Hereinafter, specific operation explanation will be made by using an operation timing chart.

[2]-1 Serial Accessing Operation

First, program data of one page for the lower bit are serially inputted through the data input/output buffer to the memory chip. The program data of one page are stored in the data latch section (lower bit latch) DS5 by serial accessing.

The serial accessing operation is finished before later-described precharging of the input node of the data latch section (sense latch) DS3 is completed. For example, this serial accessing operation is carried out during the aforementioned program operation for the upper bit (logic upper page data) HB.

In the example, before it is inputted to the data latch section DS5, data on the write data line bWD has a value which is reverse to a value of the program data. However, a value of data outputted from the data latch section DS5 is equal to the value of the program data.

[2]-2 Copying Operation from DS5 to DS2, DS3: First Half of Period T1

Figure 30:
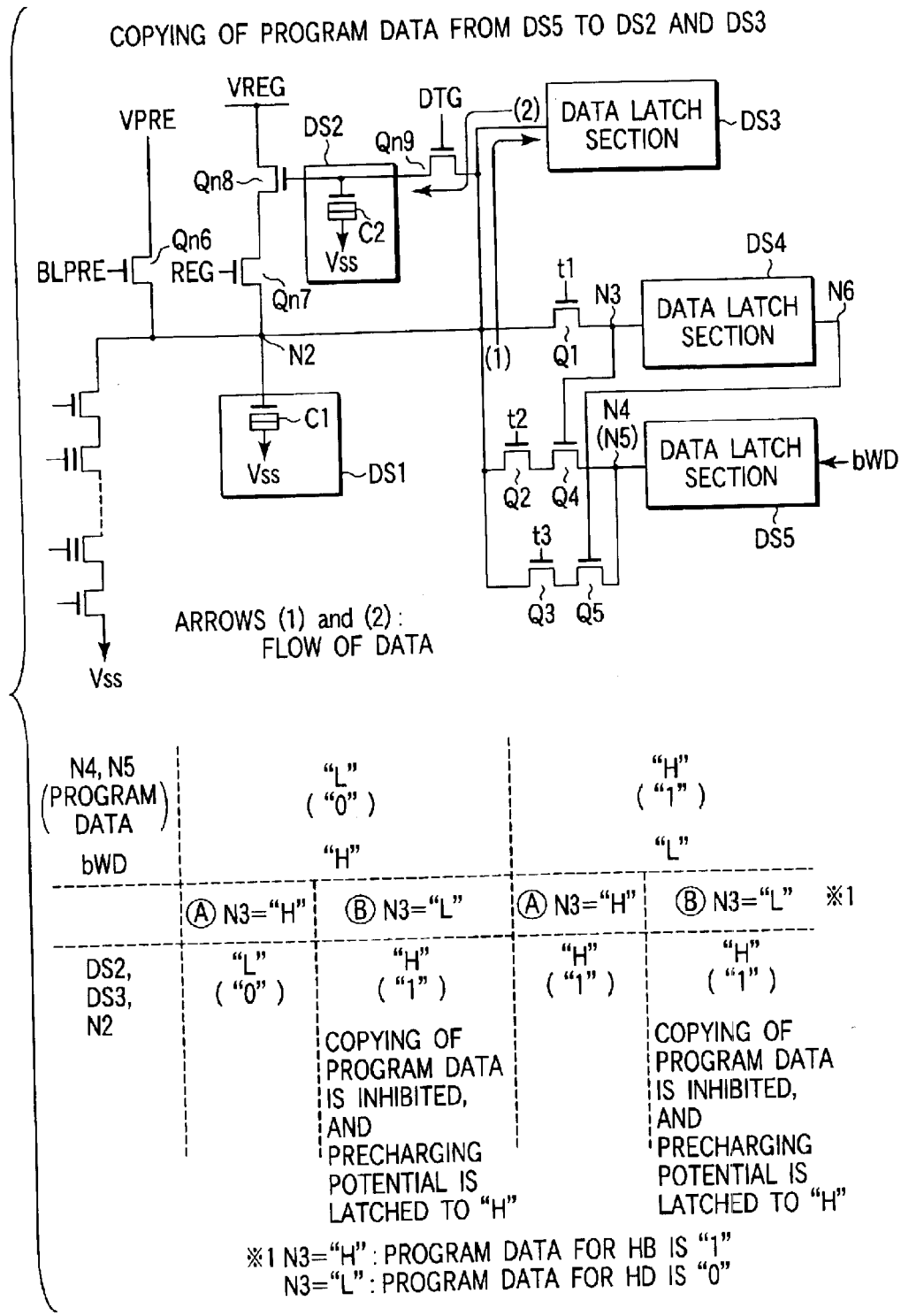
FIG. 30 is a view showing a data flow in data copying.

FIG. 30 shows a flow of data in a copying operation of program data from the data latch section DS5 to the data latch sections DS2, DS3.

This copying operation is equivalent to step S6 of FIG. 28.

First, the control signal BLPRE becomes "H", and the N channel MOS transistor Qn6 (FIG. 11) is turned ON to precharge the input node of the data latch section (sense latch) DS3. This precharging means a preparatory operation for transferring the program data stored in the data latch section DS5 to the data latch sections DS2, DS3.

After the end of the precharging, the control signal t2 is set to "H". At this time, the N channel MOS transistor Q2 is turned ON.

Thus, in the aforementioned program operation for the upper bit HB, if the value of the program data is "1", i.e., the output node N3 of the data latch section (higher bit latch) DS4 is "H", the MOS transistor Q4 is turned ON to electrically connect the data latch section DS3 and the data latch section DS5.

If the data latch section DS5 (nodes N4, N5) stores "1" (="H") as the program data, the input node of the data latch section DS3 maintains "H". If the data latch section DS5 (nodes N4, N5) stores "0" (="L") as the program data, the input node of the data latch section DS3 is changed from "H" to "L" ((1)).

In the aforementioned program operation for the upper bit HB, if the value of the program data is "0", i.e., the output node N3 of the data latch section (higher bit latch) DS4 is "L", the MOS transistor Q4 is turned OFF. Thus, the data latch section DS3 and the data latch section DS5 are not electrically connected to each other.

Therefore, the input node of the data latch section DS3 corresponding to the memory cell of the upper bit HB "0" maintains a precharging potential, i.e., "H".

Subsequently, the control signal SEN is set to "H", and the control signal SEN' is set to "H" a little later, whereby the program data of the data latch section DS5 is stored in the data latch section (sense latch) DS3. Also, by setting a control signal DTG to "H", the program data of the data latch section DS5 is stored in the data latch section DS2 ((2)).

At this time, the same data, i.e., the program data for the lower bit LB, is stored in the data latch sections DS2, DS3. Then, the control signal t2 becomes "L", and the control signal DTG becomes "L", whereby the data latch sections DS2, DS3, DS5 are electrically cut off from one another.

Incidentally, the copying operation from the DS5 to the DS2, DS3 is simultaneously carried out in data circuits of all the columns.

[2]-3 Writing Operation (Write): Latter Half of Period T1

FIG. 31 shows a flow of data in the writing operation. The writing operation is equivalent to step S8 of FIG. 28.

First, the control signal BLCLAMP is set to about 4.5 V. When the control signal BLS becomes 4.5 V, the bit line BLq and the data latch section DS3 are electrically connected.

If data of the data latch section DS3 (node N2) is "1", the bit line BLq is charged to Vdd. If the data of the data latch section DS3 (node N2) is "0", the bit line BLq is charged to Vss (0 V).

Subsequently, Vpass, e.g., 10 V, is applied to the unselected word line, while Vpgm (e.g., about 12 V) is applied to the selected word line. As a result, programming is carried out for the memory cell.

For example, if the data stored in the data latch section DS3 "1", the bit line BLq is Vdd, and the channel of the memory cell is Vdd-Vth (threshold voltage of the select gate transistor) and set in a floating state. As a result, a potential difference between the selected word line (control gate electrode) and the channel of the memory cell does not become a value sufficient for injecting electrons to the floating gate electrode of the memory cell.

On the other hand, if the data stored in the data latch section DS3 is "0", the bit line BLq is 0 V, and the channel of the memory cell also becomes 0 V. As a result, a potential difference between the selected word line (control gate electrode) and the channel of the memory cell becomes a value sufficient for injecting electrons to the floating gate electrode of the memory cell.

Thus, if the data stored in the data latch section DS3 is "1", a threshold voltage of the memory cell is not increased. If the data stored in the data latch section DS3 is "0", the threshold voltage of the memory cell is increased.

After the end of the writing operation, the control signals SEN, SEN' are set to "L", and thus the state of the data latch section DS3 is reset.

[2]-4 Verification Operation (Verify 10): Period T2

Figure 32:
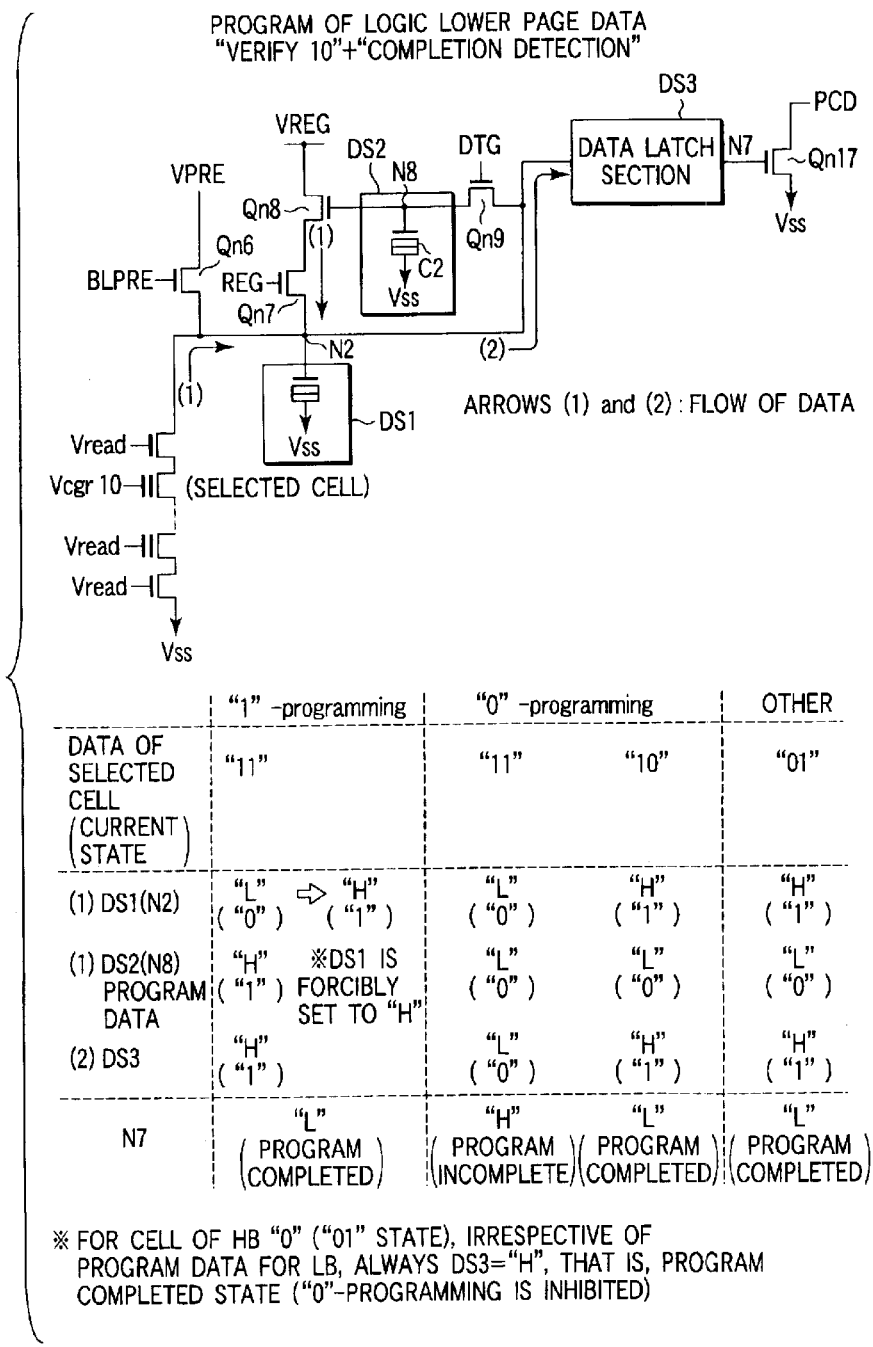
FIG. 32 is a view showing a data flow in verification.

FIG. 32 shows a flow of data in verification reading.

The verification operation is constituted of verification reading and completion detection.

The verification reading is equivalent to step S10 of FIG. 28, and the completion detection is equivalent to step S9 of FIG. 28.

In the verification reading, after the writing operation, data for determining whether a threshold voltage of the memory cell has reached a predetermined level or not (completion detection) is read from the memory cell.

First, a control signal BLPRE becomes "H", and the N channel MOS transistor Qn6 (FIG. 11) is turned ON. A control signal BLCLAMP becomes Vclamp (e.g., 2 V), and a control signal BLS becomes Vsghh (e.g., 4.5 V), whereby the bit line BLq is electrically connected to VPRE (=Vdd).

As a result, the bit line BLq is precharged to a predetermined potential regulated by a threshold voltage of the N channel MOS transistor Qn5, e.g., about 1 V.

Subsequently, the control signal BLCLAMP becomes Vss (e.g., 0 V) and the control signal BLPRE becomes "L" to set the bit line BLq in a floating state.

Incidentally, at this time, the input node of the data latch section DS3, i.e., the node N2, is precharged to VPRE (=Vdd).

A transfer potential Vread (e.g., 4.5 V) is applied to the select gate line and the unselected bit line of the bit line side, and a verification reading potential Vcgv 10 is applied to the selected word line (see FIG. 13). When a potential of the select gate line of the source line side is set to a transfer potential Vread, an influence appears in the potential of the bit line BLq in accordance with the state of the selected memory cell, i.e., a current threshold voltage of the memory cell.

That is, if a threshold voltage of the selected memory cell is lower than a potential (verification reading potential) Vcgv 10 of the selected word line, the selected memory cell is turned ON by this verification reading potential Vcgv 10. Accordingly, charge of the bit line BLq is discharged to reduce the potential of the bit line BLq to 0.8 V or lower (unselected memory cell in the selected block is ON by Vread).

On the other hand, if the threshold voltage of the selected memory cell is higher than the verification reading potential Vcgv 10, the selected memory cell is not turned ON by the verification reading potential Vcgv 10. Thus, no charge of the bit line BLq is discharged, whereby the bit line BLq maintains a precharging potential (about 1 V).

By setting the control signal BLPRE to about 4.5 V and the control signal VPRE to Vdd (e.g., 3 V), one end of the capacitor C1 of the data latch section DS1, i.e., the node N2, is charged to Vdd. Subsequently, when the control signal BLCLAMP is set to Vsense (e.g., 1.8 V), a potential of one end of the capacitor C1 of the data latch section DS1 is changed as follows.

That is, if the potential of the bit line BLq is still at the precharging potential (about 1 V) (threshold voltage of the memory cell is higher than Vcgv 10), the N channel MOS transistor (clamp transistor) Qn5 (FIG. 11) is OFF, and the potential of one end of the capacitor C1 of the data latch section DS1 is maintained at Vdd ("H").

On the other hand, if the potential of the bit line BLq is 0.8 V or lower (threshold voltage of the memory cell is lower than Vcgv 10), the N channel MOS transistor (clamp transistor) Qn5 (FIG. 11) is ON to discharge charge of one end of the capacitor C1 of the data latch section DS1 to the bit line BLq, and its potential is reduced to a value ("L") lower than Vdd.

As a result, in the data latch section DS1 (one end of the capacitor C1), read data is stored by the verification reading potential Vcgv 10.

That is, if the threshold voltage of the memory cell is lower than Vcgv 10 ("1"-programming or "0"-programming is incomplete), "L", i.e., "0", is stored in the data latch section DS1. If the threshold voltage of the memory cell is higher than Vcgv 10 ("0"-programming is completed), "H", i.e., "1", is stored in the data latch section DS1.

At this stage, programming is not carried out for the memory cells of the upper bit HB "0" ("01" state), and thus all are set to "1"-programming.

Then, the control signal SEN is set to "H", and the control signal SEN' is set to "H" a little later, whereby the data of the data latch section DS1 is stored in the data latch section (sense latch) DS3.

In this case, the state of the data latch section DS3 is reset by setting the control signals SEN, SEN' to "L" after the end of the aforementioned writing operation. Thus, after the verification reading, data is stored again in the data latch section DS3 in accordance with a result of the verification reading.

Subsequently, a control signal VREG becomes "H". Additionally, when a control signal REG becomes, e.g., 4.5 V, the N channel MOS transistor Qn7 is turned ON. Thus, the potential of one end (node N2) of the capacitor C1 of the data latch section DS1 is influenced by the data stored in the data latch section DS2.

For example, if the data (program data) stored in the data latch section DS2 is "1", the N channel MOS transistor Qn8 is turned ON to transfer VREG (=Vdd) to one end (node N2) of the capacitor C1 of the data latch section DS1.

In this case, irrespective of a value of the data read in the aforementioned verification reading, the potential of one end (node N2) of the capacitor C1 of the data latch section DS1 is forcibly set to "H", i.e., "1". Thus, the data (node N2) stored in the data latch section DS3 is also forcibly set to "1".

If the data (program data) stored in the data latch section DS2 is "0", the N channel MOS transistor Qn8 is OFF. Thus, VREG (=Vdd) is not transferred to one end (node N2) of the capacitor C1 of the data latch section DS1. That is, a potential of one end of the capacitor C1 of the data latch section DS1 is not changed.

That is, the data (node N2) stored in the data latch section DS3 becomes data consistent with the result of the verification reading.

Then, completion detection is carried out based on the data stored in the data latch section DS3. That is, if the data (of one page) stored in the data latch section DS3 are all "1" ("1"-programming or "0"-programming is completed), in all the columns, the node N7 is "L", and the MOS transistor Qn17 is OFF.

Accordingly, the PCD of FIG. 11 maintains "H", and a status becomes Pass. Thus, the process proceeds to a later-described program operation of a lower bit for the memory cell of the upper bit HB "0".

If at least one of the data (of one page) stored in the data latch section DS3 is "0" ("0"-programming incomplete), at least in one column, the node N7 is "H", and the MOS transistor Qn17 is ON.

Therefore, since the PCD of FIG. 11 becomes "L", the writing operation and the verification operation are repeated until the status of the verification result becomes Pass. However, when the number of times of carrying out the writing operation exceeds a predetermined number of times PCmax, the program operation is finished considering that the status is NG.

Here, in the case of repeating the writing operation and the verification operation, the "0"-programming operation is carried out only for a memory cell of incomplete "0"-programming. That is, no "0"-programming is carried out for a memory cell of completed "0"-programming thereafter.

In the case of repeating the writing operation (period T1) and the verification operation. (period T2), in the second writing operation and thereafter, the precharging operation immediately before the writing operation (equivalent to the first half of the period T1) is not carried out.

A reason is as follows. In the first writing operation, the node N2 must be precharged in order to transfer the program data from the DS5 to DS2, DS3. However, in the second writing operation and thereafter, in the verification operation carried out immediately before, the node N2 is precharged to transfer the read data by verification reading to the data latch section DS3.

Then, a writing operation thereafter is carried out based on the data stored in the data latch circuit DS3. Accordingly, for the second writing operation and thereafter, it is not necessary to carry out a precharging operation immediately before the writing operation.

[3] Algorithm of Program Operation of Lower Bit LB for Memory Cell of Upper Bit HB "0"

FIG. 33 shows an example of an algorithm of a program operation of a lower bit LB for a memory cell of an upper bit HB "0".

In the example, it is assumed that after the program operation of the lower bit LB is carried out for the memory cell of the upper bit HB "1", the program operation of the lower bit LB is carried out for the memory cell of the upper bit HB "0".

Thus, in the flowchart, for a chip where verification of the program operation of the lower bit LB for the memory cell of the upper bit HB "1" (FIG. 28) is Pass, the program operation of the lower bit LB for the memory cell of the upper bit HB "0" is carried out.

Incidentally, as described above, needless to say, it is possible to change an order of the program operation of the lower bit LB for the memory cell of the upper bit HB "1" and the program operation of the lower bit LB for the memory cell of the upper bit HB "0".

First, checking is made as to whether a value of the upper bit HB of a selected memory cell is "0" or not. If it is "0", the program data stored in the data latch section DS5 is copied to the data latch sections DS2, DS3 (steps S14 to S15).

That is, if the value of the upper bit HB of the selected memory cell is "0", specifically, in the program operation already carried out for the upper bit HB, when the program data for the upper bit HB is "0", the nodes N2, N8 are set to "H" when the program data for the lower bit LB is "1". The nodes N2, N8 are set to "L" when the program data for the lower bit LB is "0".

If the value of the upper bit HB of the selected memory cell is "1", i.e., in the program operation already carried out for the upper bit HB, when the program data for the upper bit HB is "1", values of the data latch sections DS2, DS3 are set to "1" irrespective of a value of the program data stored in the data latch section DS5 (step S16).

Subsequently, a writing voltage Vpgm is set to, e.g., about 12 V, and a value PC of the program counter in the state machine is set to 0. The value PC of the program counter indicates the number of times of carrying out a writing operation.

Then, a writing operation is carried out (step S17).

If the program data stored in the data latch section DS3 is "0", for example, a high voltage is applied between the substrate and the floating gate electrode, and electrons are injected into the floating gate electrode to increase a threshold voltage of the memory cell ("0"-programming). If the program data stored in the data latch section DS3 is "1", for example, application of a high voltage between the substrate and the floating gate electrode is prevented, injection of electrons into the floating gate electrode is prevented, and the threshold voltage of the memory cell is not changed ("1"-programming).

After the writing operation, "1" is added to the value PC of the program counter (step 317).

Subsequently, based on the data stored in the data latch section DS3, determination is made as to whether program verification is a Pass state (completed state of the program) or an NG state (incomplete state of the program) (step S18).

In this case, immediately after the first writing operation, since "Verify 00" is not carried out at all, the data latch section DS3 stores the program data itself.

If the data latch sections DS3 in all the columns store "1", i.e., the program data for the lower bit LB are all "1", in all the columns, the N channel MOS transistor Qn17 of FIG. 11 is OFF, and the PCD of FIG. 11 maintains "H".

Accordingly, since the Pass state of program verification (completed state of the program) is determined, a status Pass is determined to finish the program operation (step S22).

On the other hand, it the data latch section DS3 in at least one column stores "0", i.e., at least one program data for the lower bit HB is "0", the N channel MOS transistor Qn17 (FIG. 11) connected to the data latch section DS3 which stores "0" is OFF, and for example, a level of the PCD of FIG. 11 becomes "L".

Accordingly, the NG state of program verification (incomplete state of the program) is determined, and the process proceeds to "Verify 00" (steps S18 to S19).

The "Verify 00" is an operation where a reading operation is carried out for a selected memory cell to be programmed by using a reading potential Vcgv 00 (see FIG. 13) and, based on read data obtained by this reading operation and data (program data) of the data latch section DS2, a value of data to be newly stored in the data latch section DS3 is decided.

In the case of the program of the lower bit LB for the memory cell of the upper bit HB "0", those among all the selected memory cells to be programmed for the lower bit LB are in "01" states.

It is because at a point of time when the program for the upper bit HB is finished, the state of the memory cell is "11" or "01" and, in the program operation of the lower bit LB for the memory cell of the upper bit HB "1", no fluctuation occurs in a threshold value of the memory cell of the "01" state.

Thus, for the memory cell targeted for "1"-programming (memory cell corresponding to the data latch section DS3 which stores "1"-data), since there is no fluctuation in a threshold voltage, the "01" state is maintained, and read data read by the "Verify 00" is always "0".

Thus, "0" is stored in the data latch section DS1. However, as described later, if "1" is stored in the data latch section DS2, the data of the data latch section DS1 is forcibly changed to "1" irrespective of the read data. That is, this "1" data is stored again from the data latch section DS1 in the data latch section DS3.

On the other hand, for the memory cell which is a target of "0"-programming (memory cell corresponding to the data latch section DS3 which stores "0"-data), if a threshold voltage is sufficiently increased by the writing operation (step S17) (program is completed), that is, if the "01" state (threshold level 2) is changed to the "00" state (threshold level 3), the read data read by the "Verify 00" becomes "1".

Accordingly, "1" is stored in the data latch section DS1. This "1" data is transferred from the data latch section DS1 to the data latch section DS3. That is, the data of the data latch section DS3 is changed from "0" to "1".

For the memory cell which is a target of "0"-programming (memory cell corresponding to the data latch section DS3 which stores "0"-data), if a threshold voltage is not sufficiently increased by the writing operation (step S17) (program is not completed), that is, if the "01" state (threshold level 2) is not changed to the "00" state (threshold level 3), the read data read by the "Verify 00" becomes "0".

Accordingly, "0" is stored in the data latch section DS1. This "0"-data is transferred from the data latch section DS1 to the data latch section DS3. That is, the data of the data latch section DS3 maintains "0".

Subsequently, if a value PC of the program counter reaches a preset maximum writing number of times PCmax, a program failure (Fail) is set in the status register in the state machine to finish the program operation (steps S20, S23).

If a value PC of the program counter is smaller than the preset maximum writing number of times PCmax, a writing voltage Vpgm is applied again, and then the writing operation is carried out again (steps S17, S20, S21).

Then, program verification is carried out (step S18). As described above, in the case of "1"-programming (memory cells of the upper bit HB "1" are all "1"-programming), the data of the data latch section DS3 is always "1". In the case of "0"-programming, if "0"-programming is completed, the data of the data latch section DS3 is changed from "0" to "1". Only in the case of incomplete "0"-programming, the data of the data latch section DS3 maintains "0".

Thus, if programming ("1"-programming or "0"-programming) is completed for the memory cells of the upper bit HB "0", all the data latch sections DS3 store "1"-data. That is, in all the columns, the N channel MOS transistor Qn17 of FIG. 11 is turned OFF to set the PCD of FIG. 11 to "H" (program verification becomes a Pass state) (step S22).

If programming is not completed ("0"-programming) for at least one of the selected memory cells of the upper bit HB "0", at least one data latch section DS3 stores "0"-data. That is, in at least one column, the N channel MOS transistor Qn17 of FIG. 11 is turned ON to set the PCD of FIG. 11 to "L" (program verification becomes an NG state), whereby the verification reading and writing operations are repeated again (steps S17 to S21).

Thus, in the second program operation, the program of the lower bit LB is carried out only for the memory cell of the upper bit HB "0". At this time, the program of the lower bit LB is not carried out for the memory cell of the upper bit HB "1".

[4] Operation Explanation Based on Operating Waveform

Hereinafter, specific operation explanation will be made by using an operation timing chart.

[4]-1 Serial Accessing Operation

Program data of one page for the lower bit are stored in the data latch section (lower bit latch) DS5 by serial accessing before the program operation of the lower bit LB is carried out for the memory cell of the upper bit HB "1" (step S3 of FIG. 28).

[4]-2 Copying Operation from DS5 to DS2, DS3: First Half of Period T1

Figure 35:
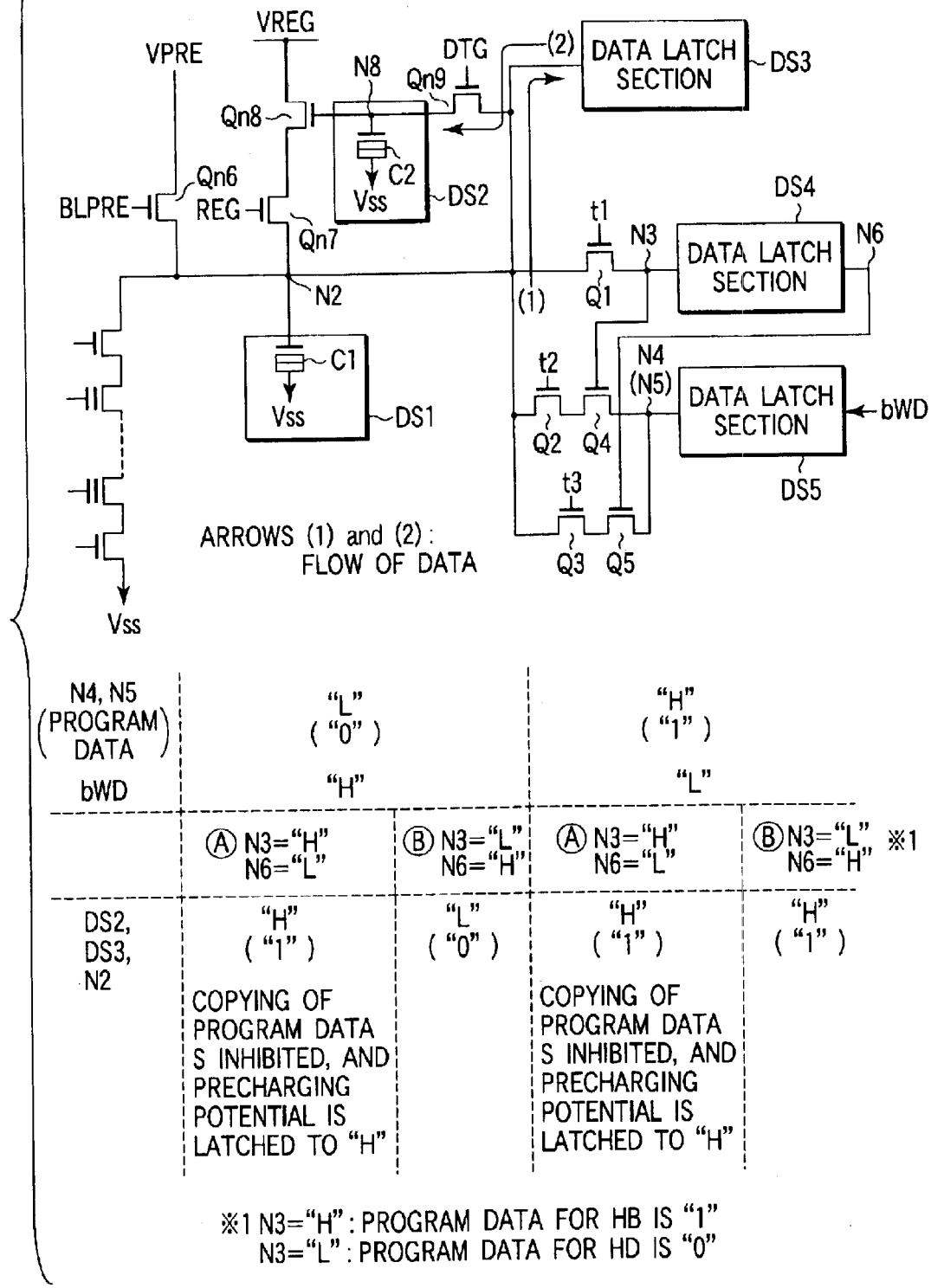
FIG. 35 is a view showing a data flow in data copying.

FIG. 35 shows a flow of data in a copying operation of program data from the data latch section DS5 to the data latch sections DS2, DS3.

This copying operation is equivalent to step S15 of FIG. 33.

First, the control signal BLPRE becomes "H", and the N channel MOS transistor Qn6 (FIG. 11) is turned ON to precharge the input node of the data latch section (sense latch) DS3. This precharging means a preparatory operation for transferring the program data stored in the data latch section DS5 to the data latch sections DS2, DS3.

After the end of the precharging, the control signal t3 is set to "H". At this time, the N channel MOS transistor Q3 is turned ON.

Thus, in the aforementioned program operation for the upper bit HB, if the value of the program data is "0", i.e., the node N6 of the data latch section (higher bit latch) DS4 is "H" (B), the MOS transistor Q5 is turned ON to electrically connect the data latch section DS3 and the data latch section DS5.

If the data latch section DS5 (nodes N4, N5) stores "1" (="H") as the program data, the input node of the data latch section DS3 maintains "H". If the data latch section DS5 (nodes N4, N5) stores "0" (="L") as the program data, the input node of the data latch section DS3 is changed from "H" to "L" ((1)).

In the aforementioned program operation for the upper bit HB, if the value of the program data is "1", i.e., the node N6 of the data latch section (higher bit latch) DS4 is "L" (A), the MOS transistor Q5 is turned OFF. Thus, the data latch section DS3 and the data latch section DS5 are not electrically connected to each other.

Therefore, the input node of the data latch section DS3 corresponding to the memory cell of the upper bit HB "1" maintains a precharging potential, i.e., "H".

Subsequently, the control signal SEN is set to "H", and the control signal SEN' is set to "H" a little later, whereby the program data of the data latch section DS5 is stored in the data latch section (sense latch) DS3. Also, by setting a control signal DTG to "H", the program data of the data latch section DS5 is stored in the data latch section DS2 ((2)).

At this time, the same data, i.e., the program data for the lower bit LB, is stored in the data latch sections DS2, DS3. Then, the control signal t3 becomes "L", and the control signal DTG becomes "L", whereby the data latch sections DS2, DS3, DS5 are electrically cut off from one another.

Incidentally, the copying operation from the DS5 to the DS2, DS3 is simultaneously carried out in data circuits of all the columns.

[4]-3 Writing Operation (Write): Latter Half of Period T1

FIG. 36 shows a flow of data in the writing operation. The writing operation is equivalent to step S17 of FIG. 33.

First, the control signal BLCLAMP is set to about 4.5 V. When the control signal BLS becomes 4.5 V, the bit line BLq and the data latch section DS3 are electrically connected.

If data of the data latch section DS3 (node N2) is "1", the bit line BLq is charged to Vdd. If the data of the data latch section DS3 (node N2) is "0", the bit line BLq is charged to Vss (0 V).

Subsequently, Vpass, e.g., 10 V, is applied to the unselected word line, while Vpgm (e.g., about 12 V) is applied to the selected word line. As a result, programming is carried out for the memory cell.

For example, if the data stored in the data latch section DS3 "1", the bit line BLq is Vdd, and the channel of the memory cell is, for example, Vdd-Vth (threshold voltage of the select gate transistor) and set in a floating state. As a result, a potential difference between the selected word line (control gate electrode) and the channel of the memory cell does not become a value sufficient for injecting electrons to the floating gate electrode of the memory cell.

On the other hand, if the data stored in the data latch section DS3 is "0", the bit line BLq is 0 V, and the channel of the memory cell also becomes 0 V. As a result, a potential difference between the selected word line (control gate electrode) and the channel of the memory cell becomes a value sufficient for injecting electrons to the floating gate electrode of the memory cell.

Thus, if the data stored in the data latch section DS3 is "1", a threshold voltage of the memory cell is not increased.

If the data stored in the data latch section DS3 is "0", the threshold voltage of the memory cell is increased.

After the end of the writing operation, the control signals SEN, SEN' are set to "L", and thus the state of the data latch section DS3 is reset.

[4]-4 Verification Operation (Verify 00): Period T2

Figure 37:
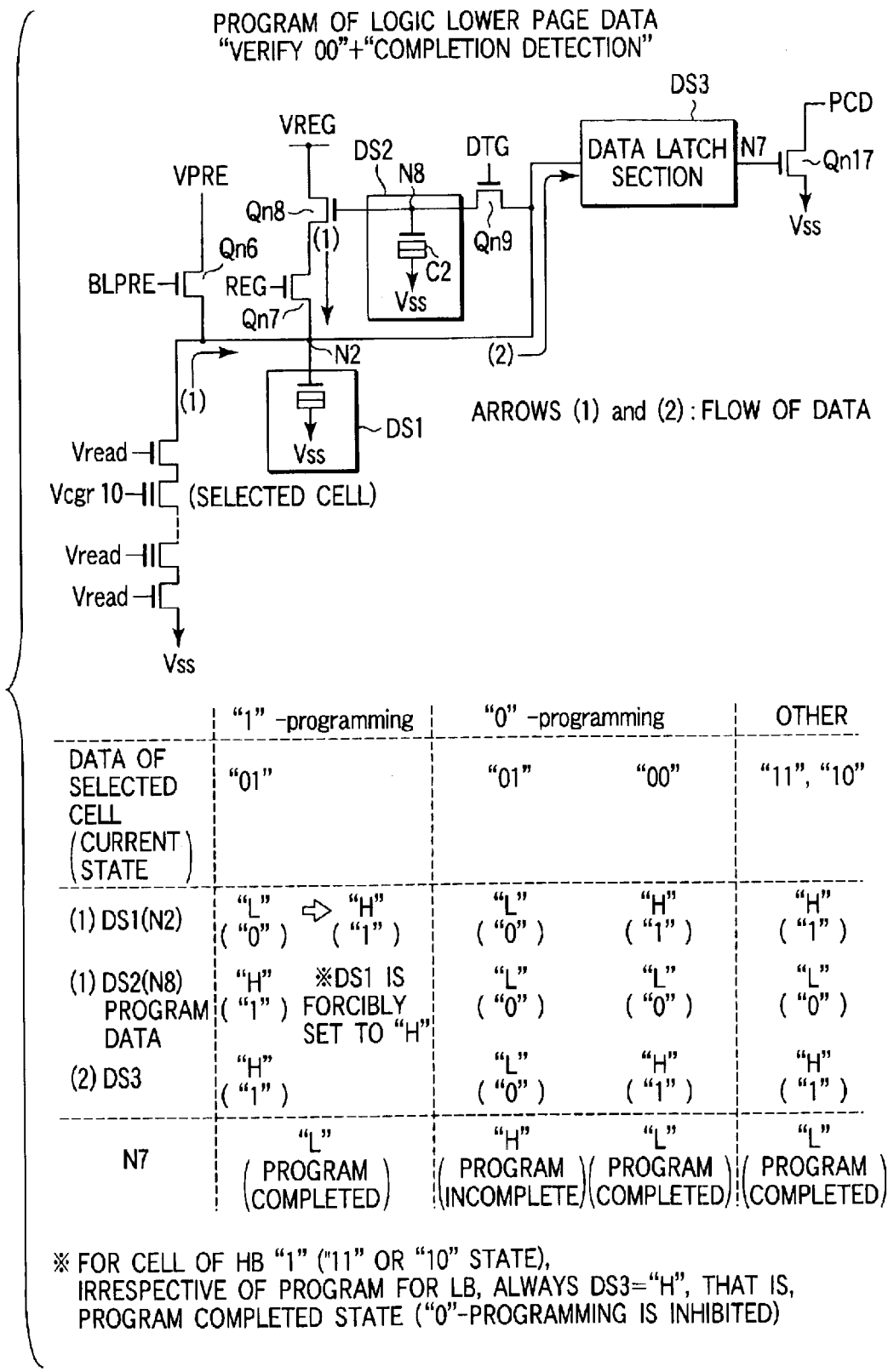
FIG. 37 is a view showing a data flow in verification.

FIG. 37 shows a flow of data in verification reading.

The verification operation is constituted of verification reading and completion detection.

The verification reading is equivalent to step S19 of FIG. 33, and the completion detection is equivalent to step S18 of FIG. 33.

In the verification reading, after the writing operation, data for determining whether a threshold voltage of the memory cell has reached a predetermined level or not (completion detection) is read from the memory cell.

First, a control signal BLPRE becomes "H", and the N channel MOS transistor Qn6 (FIG. 11) is turned ON. A control signal BLCLAMP becomes Vclamp (e.g., 2 V), and a control signal BLS becomes Vsghh (e.g., 4.5 V), whereby the bit line BLq is electrically connected to VPRE (=Vdd).

As a result, the bit line BLq is precharged to a predetermined potential regulated by a threshold voltage of the N channel MOS transistor Qn5, e.g., about 1 V.

Subsequently, the control signal BLCLAMP becomes Vss (e.g., 0 V) and the control signal BLPRE becomes "L" to set the bit line BLq in a floating state.

Incidentally, at this time, the input node of the data latch section DS3, i.e., the node N2, is precharged to VPRE (=Vdd).

A transfer potential Vread (e.g., 4.5 V) is applied to the select gate line and the unselected bit line of the bit line side, and a verification reading potential Vcgv 00 is applied to the selected word line (see FIG. 13). When a potential of the select gate line of the source line side is set to a transfer potential Vread, an influence appears in the potential of the bit line BLq in accordance with the state of the selected memory cell, i.e., a current threshold voltage of the memory cell.

That is, if a threshold voltage of the selected memory cell is lower than a potential (verification reading potential) Vcgv 00 of the selected word line, the selected memory cell is turned ON by this verification reading potential Vcgv 00. Accordingly, charge of the bit line BLq is discharged to reduce the potential of the bit line BLq to 0.8 V or lower (unselected memory cell in the selected block is ON by Vread).

On the other hand, if the threshold voltage of the selected memory cell is higher than the verification reading potential Vcgv 00, the selected memory cell is not turned ON by the verification reading potential Vcgv 00. Thus, no charge of the bit line BLq is discharged, whereby the bit line BLq maintains a precharging potential (about 1 V).

By setting the control signal BLPRE to about 4.5 V and the control signal VPRE to Vdd (e.g., 3 V), one end of the capacitor C1 of the data latch section DS1, i.e., the node N2, is charged to Vdd. Subsequently, when the control signal BLCLAMP is set to Vsense (e.g., 1.8 V), a potential of one end of the capacitor C1 of the data latch section DS1 is changed as follows.

That is, if the potential of the bit line BLq is still at the precharging potential (about 1 V) (threshold voltage of the memory cell is higher than Vcgv 00), the N channel MOS transistor (clamp transistor) Qn5 (FIG. 11) is OFF, and the potential of one end of the capacitor C1 of the data latch section DS1 is maintained at Vdd ("H").

On the other hand, if the potential of the bit line BLq is 0.8 V or lower (threshold voltage of the memory cell is lower than Vcgv 00), the N channel MOS transistor (clamp transistor) Qn5 (FIG. 11) is ON to discharge charge of one end of the capacitor C1 of the data latch section DS1 to the bit line BLq, and its potential is reduced to a value ("L") lower than Vdd.

As a result, in the data latch section DS1 (one end of the capacitor C1), read data is stored by the verification reading potential Vcgv 00.

That is, if the threshold voltage of the memory cell is lower than Vcgv 00 ("1"-programming or "0"-programming is incomplete), "L", i.e., "0", is stored in the data latch section DS1. If the threshold voltage of the memory cell is higher than Vcgv 00 ("0"-programming is completed), "H", i.e., "1", is stored in the data latch section DS1.

Incidentally, for the memory cells of the upper bit HB "1" ("11" or "10" state), all are set to "1"-programming in order to inhibit programming at this stage.

Then, the control signal SEN is set to "H", and the control signal SEN' is set to "H" a little later, whereby the data of the data latch section DS1 is stored in the data latch section (sense latch) DS3.

In this case, the state of the data latch section DS3 is reset by setting the control signals SEN, SEN' to "L" after the end of the aforementioned writing operation. Thus, after the verification reading, data is stored again in the data latch section DS3 in accordance with a result of the verification reading.

Subsequently, a control signal VREG becomes "H". Additionally, when a control signal REG becomes, e.g., 4.5 V, the N channel MOS transistor Qn7 is turned ON. Thus, the potential of one end (node N2) of the capacitor C1 of the data latch section DS1 is influenced by the data stored in the data latch section DS2.

For example, if the data (program data) stored in the data latch section DS2 is "1", the N channel MOS transistor Qn8 is turned ON to transfer VREG (=Vdd) to one end (node N2) of the capacitor C1 of the data latch section DS1.

In this case, irrespective of a value of the data read in the aforementioned verification reading, the potential of one end (node N2) of the capacitor C1 of the data latch section DS1 is forcibly set to "H", i.e., "1". Thus, the data (node N2) stored in the data latch section DS3 is also forcibly set to "1".

If the data (program data) stored in the data latch section DS2 is "0", the N channel MOS transistor Qn8 is OFF. Thus, VREG (=Vdd) is not transferred to one end (node N2) of the capacitor C1 of the data latch section DS1. That is, a potential of one end of the capacitor C1 of the data latch section DS1 is not changed.

That is, the data (node N2) stored in the data latch section DS3 becomes data consistent with the result of the verification reading.

Then, completion detection is carried out based on the data stored in the data latch section DS3. That is, if the data (of one page) stored in the data latch section DS3 are all "1" ("1"-programming or "0"-programming is completed), in all the columns, the node N7 is "L", and the MOS transistor Qn17 is OFF.

Accordingly, the PCD of FIG. 11 maintains "H", and a status becomes Pass to finish the program operation.

If at least one of the data (of one page) stored in the data latch section DS3 is "0" ("0"-programming incomplete), at least in one column, the node N7 is "H", and the MOS transistor Qn17 is ON.

Therefore, since the PCD of FIG. 11 becomes "L", the writing operation and the verification operation are repeated until the status of the verification result becomes Pass.

However, when the number of times of carrying out the writing operation exceeds a predetermined number of times PCmax, the program operation is finished considering that the status is NG.

Here, in the case of repeating the writing operation and the verification operation, the "0"-programming operation is carried out only for a memory cell of incomplete "0"-programming. That is, no "0"-programming is carried out for a memory cell of completed "0"-programming thereafter.

In the case of repeating the writing operation (period T1) and the verification operation (period T2), in the second writing operation and thereafter, the precharging operation immediately before the writing operation (equivalent to the first half of the period T1) is not carried out.

A reason is as follows. In the first writing operation, the node N2 must be precharged in order to transfer the program data from the DS5 to DS2, DS3. However, in the second writing operation and thereafter, in the verification operation carried out immediately before, the node N2 is precharged to transfer the read data by verification reading to the data latch section DS3.

Then, a writing operation thereafter is carried out based on the data stored in the data latch circuit DS3. Accordingly, for the second writing operation and thereafter, it is not necessary to carry out a precharging operation immediately before the writing operation.

(3) Summary

As described above, in the programming operation in the example of the present invention, first, programming is carried out for the upper bit HB. Then, programming of a lower bit is carried out for the memory cell of the upper bit HB "1" (or "0"), and programming of a lower bit is carried out for the memory cell of the upper bit HB "0" (or "1").

In the case of repeating the programming of the upper bit HB and the programming of the lower bit LB, serial accessing of program data for the lower bit LB is carried out during the programming of the upper bit HB. Serial accessing of program data for the upper bit HB is carried out during the programming of the lower bit LB.

Therefore, 1st access time of the multi-level flash memory can be set approximately equal to that of the binary flash memory, which contributes to achievement of a high speed of the reading/writing operation.

(4) Serial Accessing Method

Next, description will be made of a serial accessing method of the multi-level flash memory of the example of the present invention.

Figure 38:
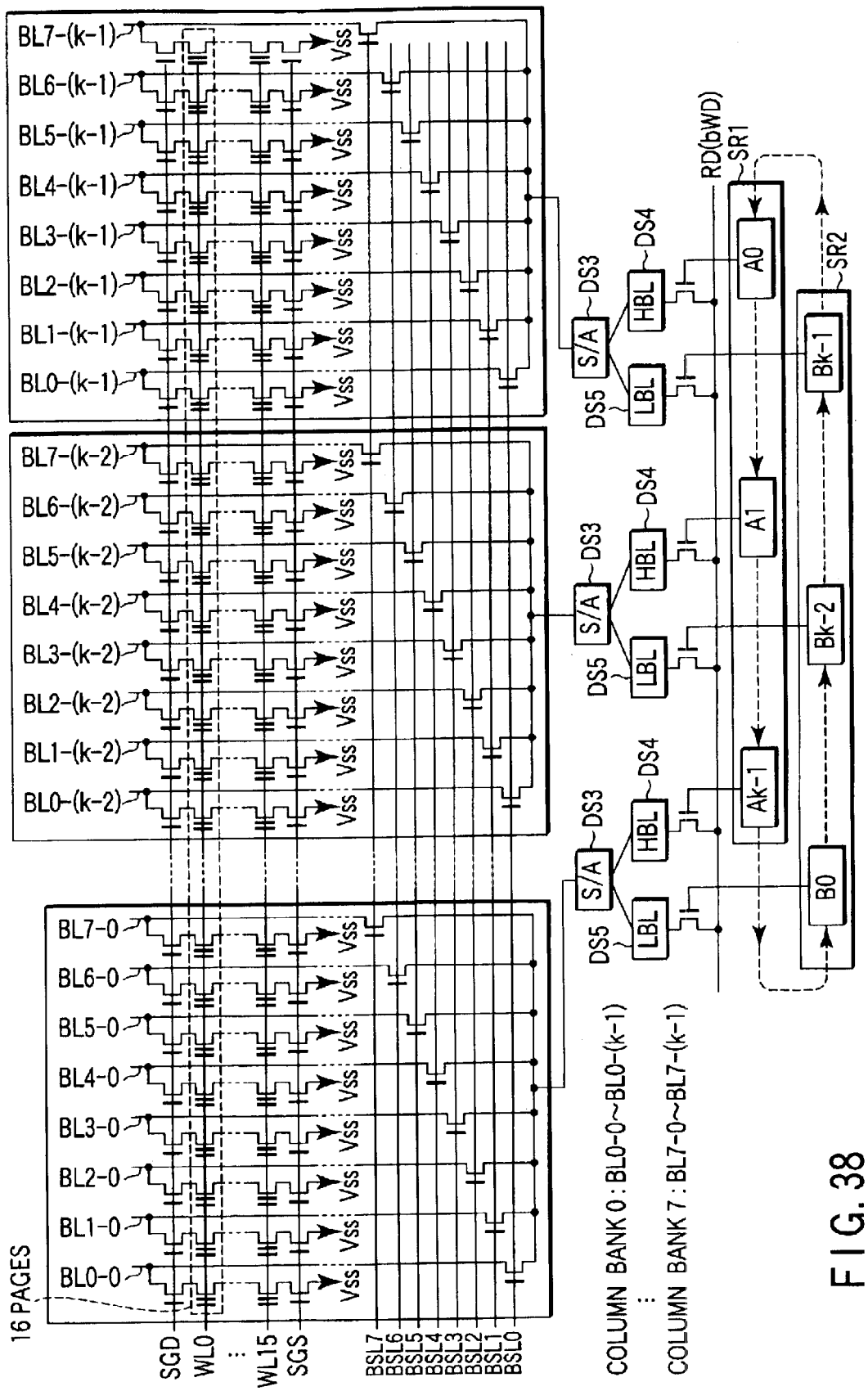
FIG. 38 is a view showing an example of a multi-level memory having a plurality of column banks.

FIG. 38 shows main sections of a multi-level NAND cell type flash memory targeted by the serial accessing method of the example of the present invention.

Normally, in a chip, a bit line is laid out at a minimum pitch, while a size of a sense latch becomes sufficiently larger than this minimum pitch. Accordingly, one sense latch cannot be installed for one bit line. Generally, one sense latch is installed for a plurality of bit lines.

In the example, eight bit lines BL0-q, BL1-q, ... BL7-q (q=0, 1, ... k−1) are connected to one data latch section (sense latch) DS3. In this case, a memory cell array comprises eight column banks 0 to 7. One column bank is constituted of k bit lines BLi-0, BLi-1, ... BLi-(k−1). Here, i denotes a column bank number.

Selection of a column bank is carried out by bank selection lines BSL0, BSL1, ... BSL7. A bit line in a selected column bank is electrically connected to the data latch section (sense latch) DS3. A memory cell connected to one row, i.e., one word line, stores 2-bit data and, if the number of column banks is eight, data of 16 pages (2 bits×8 banks) are stored by the memory cell connected to one word line.

If one memory cell stores 2-bit data, two data latch sections (latch circuits) for serial accessing, i.e., DS4, DS5, are only necessary with respect to one data latch section DS3. Needless to say, if one memory cell stores n (n is a natural number of 2 or higher) bit data, n data latch sections (latch circuits) for serial accessing are necessary with respect to one data latch section DS3.

The data latch section (HBL) DS4 temporarily stores read/write data for the upper bit HB. Serial accessing of the read/write data for the upper bit HB is controlled by output signals A0, A1, . . . Ak–1 of a shift register SR1.

The data latch section (LBL) DS5 temporarily stores read/write data for the lower bit LB. Serial accessing of the read/write data for the lower bit LB is controlled by output signals B0, B1, . . . Bk–1 of a shift register SR2.

The number of times of serial accessing is proportional to the number of data latch sections DS4, DS5 for serial accessing. When the number of bits to be stored in one memory cell is increased, the number of data latch sections for serial accessing is also increased and, in proportion, the number of times of serial accessing is increased.

A serial accessing operation in a reading/writing operation is carried out first from the upper bit (logic upper page data) HB.

For example, in the case of the reading operation, the output signals A0, A1, . . . Ak–1 of the shift register SR1 are sequentially set one by one to "H" (all others are "L") (serial accessing operation) to serially transfer read data (upper bit) from the data latch section DS4 to the read data line RD.

This serial accessing operation can be carried out in parallel with a reading operation for the lower bit (logic lower page data) LB.

In the case of a program operation, the output signals A0, A1, . . . Ak–1 of the shift register SR1 are sequentially set one by one to "H" (all others are "L") (serial accessing operation) to serially transfer program data (upper bit) from the write data line bWD to the data latch section DS4.

After the end of the serial accessing of the upper bit (logic upper page data) HB, a serial accessing operation is carried out for the lower bit (logic lower page data) LB.

For example, in the case of the reading operation, output signals B0, B1, . . . Bk-i of the shift register SR2 are sequentially set one by one to "H" (all others are "L") (serial accessing operation) to serially transfer read data (lower bit) from the data latch section DS5 to the read data line RD.

In the case of a program operation, the output signals B0, B1, . . . Bk–1 of the shift register SR2 are sequentially set one by one to "H" (all others are "L") (serial accessing operation) to serially transfer program data (lower bit) from the write data line bWD to the data latch section DS5.

This serial accessing operation can be carried out in parallel with the program operation for the upper bit (logic upper page data) HB.

If the reading/writing operation is repeatedly carried out, the serial accessing operation for the upper bit HB and the serial accessing operation for the lower bit LB are repeatedly carried out.

Thus, as shown in FIG. 38, a constitution is employed where the shift registers SR1, SR2 are connected in a ring shape, and "H" is shifted sequentially in the shift registers SR1, SR2. Accordingly, the serial accessing operation for the upper bit HB and the serial accessing operation for the lower bit LB can be continuously carried out.

In order to smoothly shift "H" from the shift register SR1 to the shift register SR2 or from the shift register SR2 to the shift register SR1, for example, output pointers of the shift registers SR1, SR2 are used. By these output pointers, a head of serial accessing can be decided.

Figure 39:
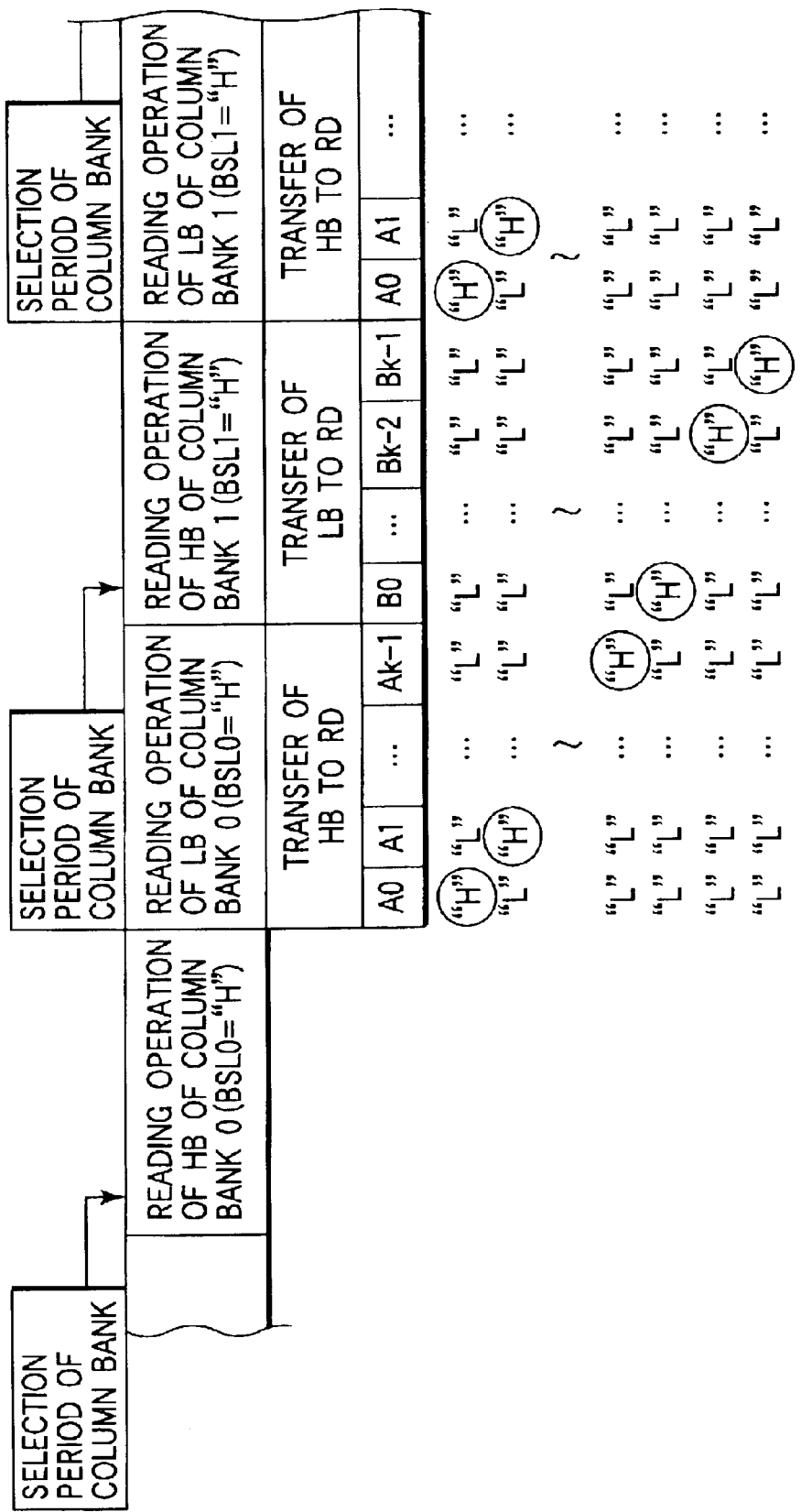
FIG. 39 is a view showing an outline of a pipeline operation in reading.

FIG. 39 shows a timing example of column bank selection in a reading operation, the reading operation and serial accessing.

To read data from the memory cell, first, a column bank is selected, then the reading operation for the upper bit HB and the reading operation for the lower bit LB are carried out, and lastly transfer of read data (serial accessing operation) is carried out.

As shown in the same drawing, the serial accessing operation is easily carried out by sequentially setting the output signals A0, A1, . . . Ak–1, B0, B1, . . . Bk–1 of the shift registers SR1, SR2 to "1" one by one.

In the example, during the reading operation of the lower bit LB, a selection operation of selecting a next column bank and a transfer operation of the upper bit HB latched by the data latch section DS4 (serial accessing operation) are carried out.

For the column bank selected by the selection operation, during the reading operation of the upper bit HB, a transfer operation of the lower bit LB latched by the data latch section DS5 (serial accessing operation) is carried out.

FIG. 40 shows a timing example of column bank selection in a program operation, the program operation and serial accessing.

To program data in the memory cell, first a column bank is selected, then program data is fetched (serial accessing operation), and lastly a program operation for the upper bit HB and a program operation for the lower bit LB are carried out.

As shown in the same drawing, the serial accessing operation is easily carried out by sequentially setting the output signals A0, A1, . . . Ak–1, B0, B1, . . . Bk–1 of the shift registers SR1, SR2 to "1" one by one.

In the example, during the program operation of the upper bit HB, a fetching operation of the lower bit LB (serial accessing operation) is carried out for the data latch section DS5. During the program operation of the lower bit LB, a fetching operation of the upper bit HB (serial accessing) is carried out for the data latch section DS4. A column bank selection operation is carried out during the program operation for the lower bit LB.

By such a constitution, for example, compared with the multi-level NAND type flash memory where address data generated at the counter outside the memory is supplied through the address bus to the data circuit, the number of signal lines necessary for driving in the serial accessing operation and a load capacity can be reduced, and thus it is possible to realize a high speed and low power consumption for the reading/writing operation.

4. Others

The embodiments have been described by way of example of the multi-level NAND cell type flash memory. Needless to say, however, the present invention can be applied to multi-level memories of other types. For example, as a memory cell array, a NOR type, an AND type (A. Nozoe: ISSCC, Digest of Technical papers, 1995), DINOR type (S. Kobayashi: ISSCC, Digest of Technical papers, 1995), Virtual Ground Array type (Lee, et al.: Symposium on VLSI Circuits, Digest of Technical Papers, 1994), 3-r NAND type, or 4-tr NAND type may be used.

Furthermore, the present invention is not limited to the flash memory. For example, the invention can be applied to a nonvolatile semiconductor memory such as a mask ROM, or EPROM.

As described above, according to the present invention, even if data stored in the memory cell is multi-leveled, each bit can be read/written in one memory cell by a small number of signal lines and the simple method. Especially, the reading/writing time of an uppermost bit becomes approximately equal to that of the binary memory. Accordingly, the 1st access time of the multi-level memory can be set approximately equal to that of the binary memory. Moreover, by using the shift register, the serial accessing operation can be easily carried out by a small number of signal lines. Thus, it is possible to build a high-speed and low power consumption system. The example of the present invention is best suited especially to a memory mixed LSI where access control of a sell array section is simplified.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A nonvolatile semiconductor memory comprising:
   a memory cell to store n (n is a natural number of 2 or higher) bits;
   a first latch section to temporarily store 1 bit among the n bits in a first reading operation; and
   a second latch section to temporarily store the other 1 bit among the n bits in a second reading operation when the 1 bit has a first value, and in a third reading operation when the 1 bit has a second value.

2. The nonvolatile semiconductor memory according to claim 1,
   wherein the first, second and third reading operations are carried out at different times, respectively.

3. The nonvolatile semiconductor memory according to claim 1,
   wherein a first reading potential applied to a word line selected in the first reading operation, a second reading potential applied to a word line selected in the second reading operation, and a third reading potential applied to a word line selected in the third reading operation have different values, respectively.

4. The nonvolatile semiconductor memory according to claim 1, further comprising:
   a first switch to electrically connect the memory cell and the second latch section in the second reading operation when the 1 bit has the first value; and
   a second switch to electrically connect the memory cell and the second latch section in the third reading operation when the 1 bit has the second value.

5. The nonvolatile semiconductor memory according to claim 1,
   wherein the 1 bit is higher in order than the other 1 bit.

6. A nonvolatile semiconductor memory comprising:
   a memory cell to store 2 bits;
   a first latch section to temporarily store 1 bit of the 2 bits in a first reading operation; and
   a second latch section to temporarily store the other 1 bit of the 2 bits in a second reading operation when the 1 bit has a first value, and in a third reading operation when the 1 bit has a second value.

7. The nonvolatile semiconductor memory according to claim 6,
   wherein the memory cell has 0, first, second and third threshold levels, the 0 and first threshold levels mean that the 1 bit is the first value, and the second and third threshold levels mean that the 1 bit is the second value.

8. The nonvolatile semiconductor memory according to claim 6,
   wherein the memory cell has 0, first, second and third threshold levels, the 0 and second threshold levels mean that the other 1 bit is the first value, and the first and third threshold levels mean that the other 1 bit is the second value.

9. The nonvolatile semiconductor memory according to claim 6,
   wherein the first, second and third reading operations are carried out at different times, respectively.

10. The nonvolatile semiconductor memory according to claim 6,
    wherein a first reading potential applied to a word line selected in the first reading operation, a second reading potential applied to a word line selected in the second reading operation, and a third reading potential applied to a word line selected in the third reading operation have different values, respectively.

11. The nonvolatile semiconductor memory according to claim 6,
    further comprising:
    a first switch to electrically connect the memory cell and the second latch section in the second reading operation when the 1 bit has the first value; and
    a second switch to electrically connect the memory cell and the second latch section in the third reading operation when the 1 bit has the second value.

12. The nonvolatile semiconductor memory according to claim 6,
    wherein the 1 bit is a high-order bit, and the other 1 bit is a low-order bit.

13. The nonvolatile semiconductor memory according to claim 6,
    further comprising:
    a third latch section to transfer the 1 bit to the first latch section after the 1 bit is sensed, and the other 1 bit to the second latch section after the other 1 bit is sensed.

14. The nonvolatile semiconductor memory according to claim 6,
    further comprising:
    a first gate connected between the first latch section and a read data line; and
    a second gate connected between the second latch section and the read data line.

15. The nonvolatile semiconductor memory according to claim 14,
    wherein the 1 bit is transferred from the first latch section to the read data line during the second and third reading operations, and the other 1 bit is transferred from the second latch section to the read data line during the first reading operation.

16. The nonvolatile semiconductor memory according to claim 6,
    wherein the memory cell constitutes a NAND cell type flash memory.

17. A nonvolatile semiconductor memory comprising:
    a memory cell to store n (n is a natural number of 2 or higher) bits;
    a first latch section to temporarily store 1 bit among the n bits in a first writing operation;
    a second latch section to temporarily store the other 1 bit among the n bits in second and third writing operations; and a third latch section to store the other 1 bit in the second writing operation when the 1 bit has a first value, and in the third writing operation when the 1 bit has a second value.

18. The nonvolatile semiconductor memory according to claim 17,
wherein the first, second and third writing operations are carried out at different times, respectively.

19. The nonvolatile semiconductor memory according to claim 17,
wherein a first verification operation is carried out by applying a first verification reading potential to a selected word line after the first writing operation, a second verification operation is carried out by applying a second verification reading potential to the selected word line after the second writing operation, and a third verification operation is carried out by applying a third verification reading potential to the selected word line after the third writing operation.

20. The nonvolatile semiconductor memory according to claim 19,
wherein the first, second and third verification reading potentials have different values, respectively.

21. The nonvolatile semiconductor memory according to claim 17, further comprising:
a first switch to electrically connect the second latch section and the third latch section in the second writing operation when the 1 bit has the first value; and
a second switch to electrically connect the second latch section and the third latch section in the third writing operation when the 1 bit has the second value.

22. The nonvolatile semiconductor memory according to claim 17, wherein the 1 bit is higher in order than the other 1 bit.

23. A nonvolatile semiconductor memory comprising:
a memory cell to store 2 bits;
a first latch section to temporarily store 1 bit of the 2 bits in a first writing operation;
a second latch section to temporarily store the other 1 bit of the 2 bits in second and third writing operations; and
a third latch section to store the other 1 bit in the second writing operation when the 1 bit has a first value, and in the third writing operation when the 1 bit has a second value.

24. The nonvolatile semiconductor memory according to claim 23,
wherein the memory cell has 0, first, second and third threshold levels, the 0 and first threshold levels mean that the 1 bit is the first value, and the second and third threshold levels mean that the 1 bit is the second value.

25. The nonvolatile semiconductor memory according to claim 23,
wherein the memory cell has 0, first, second and third threshold levels, the 0 and second threshold levels mean that the other 1 bit is the first value, and the first and third threshold levels mean that the other 1 bit is the second value.

26. The nonvolatile semiconductor memory according to claim 23,
wherein the first, second and third writing operations are carried out at different times, respectively.

27. The nonvolatile semiconductor memory according to claim 23,
wherein a first verification operation is carried out by applying a first verification reading potential to a selected word line after the first writing operation, a second verification operation is carried out by applying a second verification reading potential to the selected word line after the second writing operation, and a third verification operation is carried out by applying a third verification reading potential to the selected word line after the third writing operation.

28. The nonvolatile semiconductor memory according to claim 27,
wherein the first, second and third verification reading potentials have different values, respectively.

29. The nonvolatile semiconductor memory according to claim 23,
further comprising:
a first switch to electrically connect the second latch section and the third latch section in the second writing operation when the 1 bit has the first value; and
a second switch to electrically connect the second latch section and the third latch section in the third writing operation when the 1 bit has the second value.

30. The nonvolatile semiconductor memory according to claim 23,
wherein the 1 bit is a high-order bit, and the other 1 bit is a low-order bit.

31. The nonvolatile semiconductor memory according to claim 23,
wherein the first, second and third writing operations are carried out based on a value of data stored in the third latch section, and the value of the data stored in the third latch section is changed in accordance with results of the first, second and third verification operations.

32. The nonvolatile semiconductor memory according to claim 31,
further comprising:
a recharging circuit to store the 1 bit or the other 1 bit, and to set the data stored in the third latch section to the first value irrespective of results of the first, second and third verification operations when the bit or the other 1 bit has the first value.

33. The nonvolatile semiconductor memory according to claim 23,
further comprising:
a first gate connected between the first latch section and a write data line; and
a second gate connected between the second latch section and the write data line.

34. The nonvolatile semiconductor memory according to claim 23,
wherein the other 1 bit is transferred from the write data line to the second latch section during the first writing operation, and the 1 bit is transferred from the write data line to the first latch section during the second writing operation.

35. The nonvolatile semiconductor memory according to claim 23,
wherein the memory cell constitutes a NAND cell type flash memory.

36. A nonvolatile semiconductor memory comprising:
memory cells to store n (n is a natural number of 2 or higher) bits;
sub-data circuits disposed corresponding to the memory cells to carry out a reading/writing operation for the memory cells; and
a first shift register to sequentially select the sub-data circuits one by one, wherein each of the sub-data circuits has a first latch section to temporarily store 1 bit among the n bits, and the 1 bit is serially outputted from the first latch section of the sub-data circuit selected by the shift register.

37. The nonvolatile semiconductor memory according to claim 36, further comprising:

a second shift register to sequentially select the sub-data circuits one by one, wherein each of the sub-data circuits has a second latch section to temporarily store the other 1 bit among the n bits, and the other 1 bit is serially outputted from the second latch section of the sub-data circuit selected by the second shift register.

38. The nonvolatile semiconductor memory according to claim 36, wherein after the 1 bit is serially outputted from the first latch section of the sub-data circuit selected by the first shift register, continuously, the other 1 bit is serially outputted from the second latch section of the sub-data circuit selected by the second shift register.

39. A read method for a memory cell which stores 2 bits by 0, first, second and third threshold levels (0 threshold level<first threshold level<second threshold level<third threshold level), comprising:

carrying out a first reading operation for the memory cell by applying a first reading potential between the first threshold level and the second threshold level to a selected word line;

determining that 1 bit of the 2 bits has a first value when a threshold value of the memory cell is the 0 or first threshold level;

determining that the 1 bit has a second value when a threshold value of the memory cell is the second or third threshold level; then (1) if the 1 bit has the first value, carrying out a second reading operation for the memory cell by applying a second reading potential between the 0 threshold level and the first threshold level to the selected word line, determining that the other 1 bit of the 2 bits has a first value when a threshold value of the memory cell is the 0 threshold level, and determining that the other 1 bit has a second value when a threshold value of the memory cell is the first threshold level; and (2) if the 1 bit has the second value, carrying out a third reading operation for the memory cell by applying a third reading potential between the second threshold level and the third threshold level to the selected word line, determining that the other 1 bit has a first value when a threshold value of the memory cell is the second threshold level, and determining that the other 1 bit has a second value when a threshold value of the memory cell is the third threshold level (an order of (1) and (2) may be reversed).

40. The read method according to claim 39, wherein the 1 bit is a high-order bit, and the other 1 bit is a low-order bit.

41. The read method according to claim 39, wherein the first value is "1"-data, and the second value is "0"-data.

42. The read method according to claim 39, wherein a value of the other 1 bit is not determined in the third reading operation if the 1 bit is the first value, and a value of the other 1 bit is not determined in the second reading operation if the 1 bit is the second value.

43. The read method according to claim 39, wherein the 1 bit is outputted as read data during the second and third reading operations.

44. The read method according to claim 43, wherein after the 1 bit is outputted by a serial accessing operation, the other 1 bit is outputted by the serial accessing operation.

45. A program method for a memory cell which stores 2 bits by 0, first, second and third threshold levels (0 threshold level<first threshold level<second threshold level<third threshold level), comprising:

setting a threshold value of the memory cell to the 0 threshold level;

then carrying out a first writing operation for the memory cell, maintaining the threshold value of the memory cell at the 0 threshold level when program data for 1 bit of the 2 bits is a first value, and changing the threshold value of the memory cell to the second threshold level when program data for the 1 bit is a second value; then (1) carrying out a second writing operation for the memory cell, if the program data for the 1 bit is the first value, when program data for the other 1 bit of the 2 bits is the first value, maintaining the threshold value of the memory cell at the 0 threshold level, and changing the threshold value of the memory cell to the first threshold level when the program data for the other 1 bit is the second value; and (2) carrying out a third writing operation for the memory cell, if the program data for the 1 bit is the second value, when the program data for the other 1 bit is the first value, maintaining the threshold value of the memory cell at the second threshold level, and changing the threshold value of the memory cell to the third threshold level when the program data for the other 1 bit is the second value (an order of (1) and (2) may be reversed).

46. The program method according to claim 45, wherein the 1 bit is a high-order bit, and the other 1 bit is a low-order bit.

47. The program method according to claim 45, wherein the first value is "1"-data, and the second value is "0"-data.

48. The program method according to claim 45, wherein the threshold value of the memory cell is not changed in the third writing operation if the program data for the 1 bit is the first value, and the threshold value of the memory cell is not changed in the second writing operation if the program data for the 1 bit is the second value.

49. The program method according to claim 45, wherein the program data for the other 1 bit is fetched during the first writing operation.

50. The program method according to claim 49, wherein after the 1 bit is fetched by a serial accessing operation, the other 1 bit is fetched by the serial accessing operation.

* * * * *